United States Patent [19]
Yokomizo

[11] Patent Number: 6,130,566
[45] Date of Patent: Oct. 10, 2000

[54] DIGITAL WAVE SHAPING CIRCUIT, FREQUENCY MULTIPLYING CIRCUIT, AND EXTERNAL SYNCHRONIZING METHOD, AND EXTERNAL SYNCHRONIZING CIRCUIT

[76] Inventor: Akira Yokomizo, Room 201, Sawa Corp., 288, Kayama, Odawara-shi, Kanagawa-ken, Japan

[21] Appl. No.: 08/958,029

[22] Filed: Oct. 27, 1997

[30] Foreign Application Priority Data

| Oct. 30, 1996 | [JP] | Japan | 8-303475 |
| Oct. 30, 1996 | [JP] | Japan | 8-303478 |
| Oct. 30, 1996 | [JP] | Japan | 8-303482 |

[51] Int. Cl.$^7$ .................................................. H03K 4/02
[52] U.S. Cl. .......................... 327/175; 327/263; 327/265; 327/299
[58] Field of Search ..................... 327/263, 265, 327/299, 175

[56] References Cited

U.S. PATENT DOCUMENTS

| 4,091,379 | 5/1978 | Wu et al. ................................. | 327/72 |
| 4,339,722 | 7/1982 | Sydor et al. ............................. | 328/38 |
| 5,057,702 | 10/1991 | Kitagawa et al. ...................... | 307/268 |
| 5,095,496 | 3/1992 | Jang ........................................ | 375/25 |
| 5,359,232 | 10/1994 | Eitrheim et al. ....................... | 307/268 |
| 5,410,263 | 4/1995 | Waizman ................................ | 327/141 |
| 5,506,878 | 4/1996 | Chiang ................................... | 327/151 |
| 5,561,692 | 10/1996 | Maitland et al. ....................... | 327/152 |
| 5,828,250 | 10/1998 | Konno .................................... | 327/141 |

FOREIGN PATENT DOCUMENTS

| 187335 | 7/1986 | European Pat. Off. . |
| 337773 | 10/1989 | European Pat. Off. . |
| 61-095606 | 5/1986 | Japan . |
| 2202217 | 8/1990 | Japan . |
| 2294113 | 12/1990 | Japan . |

OTHER PUBLICATIONS

"Wide Input Frequency, 50% Duty Cycle Converter," 8029 Electronic Engineering, 64(1992) Jun. No. 786, Woolwich, London, GB.

*Primary Examiner*—Margaret R. Wambach
*Attorney, Agent, or Firm*—Price Gess & Ubell

[57] ABSTRACT

The invention relates to a wave form shaping circuit, which outputs signals after shaping the input signal to a duty 50% wave form regardless of whether or not input signals are of duty 50%, wherein a duty determination circuit is provided, which determines and instructs the timing position of duty 50% of clock signals to be outputted, upon receiving a timing signal prepared by a timing generation circuit 2. The duty determination circuit is composed of a cycle measurement circuit 10 for measuring a length of one cycle in the first cycle arriving at every interval of an input clock signal EXT-CK, an operation circuit 19 for calculating the half length of one cycle on the basis of the measured value, an actual measurement circuit 20 for executing measurement of the length in each of the second cycles in above-mentioned interval, and a coincidence circuit 28 for outputting a coincidence output as a timing position of above-mentioned duty 50% when the corresponding measured value becomes coincident with above-mentioned calculated value, wherein a clock signal having a pulse width corresponding to above-mentioned duty 50% is prepared and outputted on the basis of a signal synchronized with the front edge of the input clock signal EXT-CK and the timing position determined and instructed by above-mentioned duty determination circuit 3.

13 Claims, 21 Drawing Sheets

(a)

a. Example of charts when outputting a frequency of external clock as it is b. Example of cases where an external clock is divided for use

DIGITAL WAVE SHAPING CIRCUIT, FREQUENCY MULTIPLYING CIRCUIT, AND EXTERNAL SYNCHRONIZING METHOD, AND EXTERNAL SYNCHRONIZING CIRCUIT

BACKGROUND OF THE INVENTION

1. Field of the Invention

The present invention relates to a digital wave shaping circuit, a frequency multiplying circuit, and an external synchronizing method and external synchronizing circuit, which produce digital signals, the phase of which is identical to the phase position of external trigger signals with the frequency thereof identical to the frequency of digital input signals.

2. Description of the Related Art

Generally, the interruption frequency of semiconductor active elements is definite, and the maximum usable frequency is subject to the limitation thereof.

For example, in FIG. 21, the wave forms of digital signals (1) and (2) have the same repeating frequency, f. However, because the ratio of the upside H level period TA to the downside L level period TB in the wave form of signal (2) is not equal to 1:1, whereas the ratio in the wave form of signal (1) is equal to 1:1 (50% duty cycle), the apparent (virtual) frequency of signal (2) is greater than the frequency of signal (1). The apparent frequency is important in the case of an IC of a semiconductor active element receiving an input signal having a wave form of 50% duty cycle, signal (1), and operating at the extreme upper limit of its operational frequency. If the duty cycle of the input waveform is reduced to a smaller duty cycle (signal (2)), then the apparent frequency of the input wave form exceeds the operational frequency of the IC, and the IC is unable to respond to the apparent frequency of the input signal.

Therefore, it is preferable that digital signals have a wave form in which the ratio of period TA to period TB is equal to 1:1 (50% duty cycle). In other words, if the digital signals to be handled by semiconductor active elements have wave forms of 50% duty cycle, then the elements are able to handle digital signals of higher frequency.

In view of these points, a consideration is given of a digital wave shaping circuit, a frequency multiplying circuit, and an external synchronizing circuit.

(1) Digital wave shaping circuit

Conventionally, in a synchronizing signal selection circuit which produces output signals, the frequency of which is identical to that of input signals and the phase of which is identical to the phase of trigger signals, "n" sub reference signals Sa, Sb, SC, . . . of different phases are produced from a reference signal So. For example, a synchronizing signal selection circuit (disclosed by Japanese Patent Publication No. 95606 of 1986) shown in FIG. 22 receives a reference signal So of a frequency "m" times the repeating frequency f ("m" is an integer number at least equal to 2) of the synchronizing output signal, and "n" sub reference signals Sa, Sb, Sc of different phases ("n" is an integer number at least equal to 2) are produced by gradually shifting the phase of the reference signal by delay elements DLI, DL2. The sub reference signals are frequency-divided by frequency dividers 823, 824, 825, wherein a trigger signal G is inputted into the frequency dividers, and the frequency-divided signals are logically synthesized in a logic circuit 822, thereby producing a synchronizing output signal.

Although, in the synchronizing signal selection circuit, it is necessary to handle reference signals of a frequency "m" times the repeating frequency f of the synchronizing output signal, the jitter is decreased in compliance with the number of the phase divisions, that is, the number "n" of the sub reference signals.

Thus, in the synchronizing signal selection circuit, it is important to produce "n" sub reference signals Sa, Sb, Sc of different phases from the reference signal So. Conventionally, a number of delay elements DLI, DL2, . . . are connected in series and are produced by carrying out an operation of gradually shifting the phases of the reference signal with the reference signal supplied into the delay elements.

However, with the above mentioned technique of gradually shifting the phase, a problem arises, in that, if a higher frequency (50 MHz to 100 MHz or the like) is handled, there are cases where a signal wave form is destroyed little by little as it passes through the respective delay elements and the meaning of the phase division is lost. In particular, even though it is assumed that the signal wave form entering the delay elements is a duty 50% wave form, the wave form shifts from duty 50% by passing through the delay elements and its apparent frequency becomes higher, thereby causing an IC to exceed its maximum operational frequency.

Furthermore, with the above-mentioned technique of gradually shifting the phase, the jitter decreases with the number "n" of phase divisions, that is, sub reference signals. Therefore, in a case where a lower frequency (for example, 1 HZ or the like) is handled, the number of delay elements to be used is 2,000 to 3,000, wherein it is disadvantageous in the economical aspect and in view of heating of the elements.

Therefore, it is highly desirable, without depending on the above mentioned technique of gradually shifting the phases, to provide an actual wave form shaping circuit which is able to operate waves constructed with as few number of semiconductor elements as possible.

(2) Frequency multiplying circuit

In the case where a frequency multiplier is able to a obtain 50% duty cycle, generally, the input digital signal (shifted from 50% duty) is used as output after the signal is frequency-divided into two, the phase of which is delayed 90 degrees, with an exclusive OR intervened. However, with the above, the frequency obtained will be the same as that of the initial input clock.

Therefore, it is considered that signals, the phase of which is shifted 45 degrees, 90 degrees and 135 degrees, are used.

However, in the case where such a technique of shifting phase is used, the construction of a frequency multiplying circuit is made complicated and the design has to be changed if the frequency to be handled is changed. Therefore, actually, it is a real state that the target frequency is obtained by using a oscillator which has a frequency two times larger than the frequency to be obtained and by dividing the frequency thereof.

Therefore, it is desirable to produce a frequency multiplying circuit, which is simple to construct, and which is able to output signals having wave forms shaped to duty 50%.

(3) External synchronizing circuit

Conventionally, in a clock signal generating circuit for writing color picture signals and a clock signal generating circuit for reading the signals, it is necessary to provide the circuits with an external synchronizing circuit which is able to generate clock signals in synchronization with horizontal synchronizing signals.

Conventionally, there is a synchronizing signal selection circuit shown in FIG. 22 which produces signals, the frequency of which is identical to that of input signals and the phase of which is identical to the phase of trigger signals (Japanese patent publication No. 95606 of 1986). Since this circuit is explained above, the explanation about it is omitted here.

As stated above, with the conventional technique of gradually shifting the phase of the subreference signals, a problem arises, in that, if a higher frequency (50 MHz to 100 MHz or the like) is handled, there are cases where a signal wave form is destroyed little by little as it passes through the respective delay elements and the meaning of the phase division is lost. In particular, even though it is assumed that the signal wave form entering the delay elements is a duty 50% wave form, the wave form shifts from duty 50% by passing through the delay elements and its apparent frequency becomes higher, causing an IC to exceed its maximum operational frequency.

Furthermore, with the above-mentioned technique of gradually shifting the phase, the jitter decreases with the number "n" of phase divisions, that is, sub reference signals. Therefore, in a case where a lower frequency (for example, 1 MHZ or the like) is handled, the number of delay elements to be used is 2,000 to 3,000, wherein it is disadvantageous in the economical aspect and in view of heating of the elements.

Therefore, it is highly desirable, without depending on the above-mentioned technique of gradually shifting the phases, to produce an external synchronizing circuit which is able to output clock signals synchronized with the trigger signals using as few number of semiconductor elements as possible.

Furthermore, in cases where external trigger signals fluctuated, conventionally it was difficult to automatically synchronize the output clocks to track the change.

Accordingly, it is desirable that an external synchronizing circuit, which is simple to construct, causes input clock signals to synchronize with external trigger signals and outputs signals in which the input digital signals are shaped to have a wave form of duty 50%. To achieve this an external synchronizing method is proposed.

Furthermore, it is also desirable that an external synchronizing method and external synchronizing circuit are produced, which automatically cause the output clocks to synchronize with external trigger signals even though the external trigger signals fluctuate.

It is therefore the first object of the invention to provide a wave form shaping circuit which outputs signals having a duty cycle of 50% regardless of whether or not the input signals are of duty cycle 50%.

Furthermore, it is the second object of the invention to provide an actual frequency multiplying circuit having a simple construction, which is able to output signals wave forms having a duty cycle of 50%.

Still furthermore, it is the third object of the invention to provide an actual external synchronizing method and external synchronizing circuit having a simple construction, which are able to synchronize input clock signals with external trigger signals and to output input digital signals shaped to a wave form having a duty cycle of 50%. Furthermore, it is still another object of the invention to provide an external synchronizing method and external synchronizing circuit which are able to automatically synchronize output clocks to track external trigger signals even when they are fluctuating.

SUMMARY OF THE INVENTION

In order to achieve the above-mentioned objectives, the invention is constructed as shown below.

One aspect of the present invention is a digital wave shaping circuit comprising: a timing generation circuit for generating timing signals from an input clock signal; a duty determination circuit for determining the timing position of a state transition of an output clock signal corresponding to a duty cycle of 50%, upon receiving the timing signals generated by the timing generation circuit, which is composed of a cycle measurement circuit for measuring the cycle length in the first cycle arriving at every interval of an integer number of cycles of the input clock signal, an operation circuit for calculating the length of one half of one cycle on the basis of the value thereof, an actual measurement circuit for executing measurement of the length in each cycle of the input clock signals, and a coincidence circuit for outputting a coincidence output indicating the timing position corresponding to a duty cycle of 50% when the corresponding measured value becomes coincident with said calculated half length value; and a width forming circuit for generating and outputting a clock signal having a pulse width corresponding to a duty cycle of 50% on the basis of a signal synchronized with the front edge of the input clock EXT-CK and the coincidence output from the duty determination circuit.

The digital wave shaping circuit of this invention is a circuit which outputs a signal frequency which is the same as that of the input signal. The cycle measurement circuit measures the length of one cycle in the first cycle arriving at every interval of an integer number of cycles of the input clock signal. The operation circuit calculates a value equivalent to the half length of one cycle. The measurement of the length is executed in the actual measurement circuit within each cycle of input clock signals, and a coincidence output is outputted from the coincidence circuit when the corresponding measured value becomes coincident with the above-mentioned calculated value. This coincidence output indicates the above-mentioned timing position corresponding to a duty cycle of 50%.

According to the above-mentioned invention, in a width forming circuit, the output pulse rises with a signal synchronized with the front edge of input clock signal and falls at a timing position corresponding to a duty cycle of 50%, that is, by a coincident signal, which is generated and outputted by the duty determination circuit, whereby it is possible to form and output clock signals having a pulse width equivalent to the above-mentioned duty cycle of 50%.

Even in a case where the input clock signal has any cycle length or the input clock signal is of a wave form in which the duty cycle is fluctuating, it is possible to obtain an output having a wave form of duty cycle 50% at all times. Therefore, it is possible to increase the apparent frequency limit of semiconductor active elements. This effect can be obtained in any one of the following inventions.

Another aspect of the present invention is a digital wave shaping circuit comprising: a timing generation circuit for generating, from input clock signals, timing signals including a signal for instructing the target measurement period to be measured as the length of one cycle of the input clock signals within an interval which an integer number of cycles of the input clock signal, a signal for instructing an actual measurement period for sustaining a measurement operation over the target measurement period, a signal for defining an oscillation reference period commencing at the front edge of an input clock signal and ending before the arrival of the front edge of the next input clock; a cycle measurement circuit having a delay line oscillator for oscillating only during the actual measurement period upon receiving a signal of the actual measurement period produced in the timing generation circuit, a counter for counting the number of cycles of oscillation of the corresponding delay line oscillator, and a latch circuit for latching the value of the corresponding counter when said target measurement period ends; an operation circuit for calculating the half value of the count value latched in said cycle measurement circuit by using the count value; an actual measurement circuit having a delay line oscillator for oscillating only during the respective oscillation reference periods upon receiving a signal of said oscillation reference period, and a counter for counting the number of cycles of oscillation of the corresponding delay line oscillator; a coincidence circuit for comparing the output value of the counter of said actual measurement circuit with the calculated value of said operation circuit and for generating a coincidence output when they become coincident with each other; and a width forming circuit for forming and outputting a clock signal having a pulse width corresponding to said duty cycle of 50% on the basis of the timing position instructed by the coincidence output of said coincidence circuit.

According to the this invention, since the output of the oscillator is utilized to carry out measurements, the phase error does not constitute any problem. Accordingly, in comparison with a conventional case of indexing the timing position by phase divisions, it is possible to carry out highly accurate measurements by using a very few number of delay elements. This effect can be obtained in any one of following aspects of this invention.

Another aspect of the present invention is a digital wave shaping circuit comprising: a timing generation circuit for generating required timing signals from an input clock signal of a fixed cycle; a first and a second duty determination circuit for determining the timing position of duty cycle 50% of a clock signal to be outputted, upon receiving said timing signal, wherein each operate over different operation cycles that overlap at at least one cycle and are two cycles shifted from each other; wherein said first and second duty determination circuits have a delay line oscillator, a counter for counting the number of cycles of oscillation, an operation circuit for calculating the half value of the counted value, and a coincidence circuit which uses output of the corresponding operation circuit as one input and uses output of said counter as the other input, said first duty determination circuit measures the length of one cycle by causing the delay line oscillator to oscillate and counting the number of cycles of oscillation by the counter in the first cycle arriving at every interval of an integer number of cycles of the input clock signal, executes measurement of the length from the front edge of each cycle by causing the delay line oscillator to oscillate and counting the number of cycles of oscillation by the counter in each of the second cycles in said intervals, and outputs a coincidence output from the coincidence circuit as a timing position of duty cycle of 50% when the corresponding measured value becomes coincident with said calculated value, said second duty determination circuit operates with at least one cycle overlapped with and shifted two cycles from said first duty determination circuit and outputs a coincidence output as said timing position of duty 50%, and a width forming circuit for generating and outputting a clock signal having a pulse width corresponding to said duty cycle of 50% on the basis of the coincidence output coming from said first and second duty determination circuits and with the signals synchronized with the front edge of the input clock signals.

According to this invention, a first and a second duty determination circuit having operation cycles which are overlapped with each other at least one cycle and operate two cycles shifted from each other are used, wherein coincidence outputs showing the timing position of the above-mentioned duty cycle of 50% are obtained from the respective duty determination circuits. In the width forming circuit, an output pulse rises with a signal synchronized with the front edge of input clock signal and falls at the above-mentioned coincidence outputs, whereby it is possible to output clock signals having a pulse width equivalent to duty cycle of 50%.

Therefore, even in a case where the input clock signal has any cycle length or the input clock signal is of a wave form in which the duty is fluctuating, with the digital wave shaping circuit according to this invention, it is always possible to obtain outputs having the same frequency as the original frequency and having a 50% duty wave form.

Furthermore, since the first and second duty determination circuits the operation of which overlap each other at at least one cycle and operate two cycles shifted from each other are used, wherein coincidence outputs showing the timing position of the above-mentioned duty 50% are obtained from the respective duty determination circuits, the target measurement period and actual measurement are clearly distinguished, it is possible to securely perform oscillating actions in the target measurement period fully to the width of one cycle.

Another aspect of the present invention is a digital wave shaping circuit comprising: a timing generation circuit for generating, from input clock signal, required timing signals including a signal for instructing the target measurement period to be measured as the length of one cycle of the input clock signal with an interval of an integer number of cycles of the input clock signal, and a signal for instructing an actual measurement period to sustain a measurement operation slightly longer than the target measurement period; a first and a second duty determination circuits for determining a timing position of duty 50% of a clock signal to be outputted, upon receiving said timing signal, each of which is constructed to have a delay line oscillator, a counter for counting the number of cycles of the oscillations an operation circuit for calculating the half value of the counted value and a coincidence circuit which uses output of the corresponding operation circuit as one input and uses output of said counter as the other input, and which operate with at least one cycle overlapped and two cycles shifted from each other; a first flip flop positioned before said first duty determination circuit, which is set every time in synchronization with the front edge of one cycle of the input clock signal and is reset by said coincidence output in the oscillation reference period between said target measurement period and the next target measurement period; a second flip flop positioned before said second duty determination circuit, which is set every time in synchronization with the front edge of one cycle of the input clock signal and is reset by said coincidence output in the oscillation reference period between said target measurement period and the next target measurement period; a first OR gate for inputting an output of said first flip flop and a signal for instructing said actual measurement period into said first duty determination circuit, a second OR gate for inputting an output of said second flip flop and a signal for instructing said actual measurement period into said second duty determination circuit, and a third OR gate for picking up an output of each of said flip flops.

According to this invention, at the time of oscillation in the actual measurement period, output of each of the above-mentioned pre-positioned flip flops is inputted into the corresponding duty determination circuit attached thereto.

However, as a coincidence output is generated, the above-mentioned propositioned flip flops are reset causing the signal at the output side to disappear, thereby avoiding adverse influences. Furthermore, signals indicating the actual measurement periods are securely inputted into the duty determination circuit attached thereto via OR gates. That is, a common delay line oscillator, etc. which constitute one duty determination circuit can be operated reliably by changing to the actual measurement period or the oscillation reference period. Therefore, the construction is further simplified in comparison with a case where two pairs of delay line oscillator, etc. are provided for the actual measurement periods and oscillation reference periods.

Another aspect of the present invention is a digital wave shaping circuit comprising: a timing generation circuit for generating, from input clock signals, required timing signals including a signal for instructing the target measurement period to be measured as length of the one cycle of the input clock signal with an interval of an integer number of cycles of the input clock signal, and a signal for instructing an actual measurement period to sustain a measurement operation slightly longer than the target measurement period; a first and a second duty determination circuits for determining and instructing a timing position of duty 50% of a clock signal to be outputted, upon receiving said timing signal, each of which is constructed to have a delay line oscillator, a counter for counting the number of cycles of the oscillation, an operation circuit for calculating the half value of the counted value and a coincidence circuit which uses output of the corresponding operation circuit as one input and uses output of said counter as the other input, and which operate with at least one cycle overlapped and two cycles shifted form each other; a first flip flop positioned before said first duty determination circuit, which is set every time in synchronization with the front edge of one cycle of the input clock signal and is reset by said coincidence output in the oscillation reference period between said target measurement period and the next target measurement period; a second flip flop positioned before said second duty determination circuit, which is set every time in synchronization with the front edge of one cycle of the input clock signal and is reset by said coincidence output in the oscillation reference period between said target measurement period and the next target measurement period; a first OR gate for inputting an output of said first flip flop and a signal for instructing said actual measurement period into said first duty determination circuit; a second OR gate for inputting an output of said second flip flop and a signal for instructing said actual measurement period into said second duty determination circuit; and a third flip flop which is reset every time in synchronization with the front edge of one cycle of said input clock signal and the status of which is changed over by coincidence outputs of said first duty determination circuit and said second duty determination circuit.

Another aspect of the present invention is a frequency multiplying circuit comprising: a timing generation circuit for generating, from input clock signals, required timing signals including a signal for instructing the target measurement period to be measured as the length of the one cycle of an input clock signal with an interval which is an integer number of cycles of the input clock signal, and a signal for instructing an actual measurement period to sustain a measurement operation slightly longer than the target measurement period; and a first duty determination circuit and a second duty determination circuit for determining and instructing a timing position of duty 50% of a clock signal to be outputted, upon receiving said timing signal, which operate with at least one cycle overlapped and two cycles shifted from each other; wherein both duty determination circuits include a delay line oscillator, a counter for counting the number of cycles of the oscillation, an operation circuit for calculating ¼ value, ²⁄₄ value, and ¾ value of the counted value, and a coincidence circuit which uses said three results of the calculation of the corresponding operation circuit as one input thereof, uses the output of said counter as the other input thereof and outputs a coincidence output whenever the value of said counter becomes coincident with one of the three results of calculation; a first flip flop positioned before said first duty determination circuit, which is set every time in synchronization with the front edge of one cycle of the input clock signal and is reset by the final one of said coincidence outputs in the oscillation reference period between said target measurement period and the next target measurement period, a second flip flop positioned before said second duty determination circuit, which is set every time in synchronization with the front edge of one cycle of the input clock signal and is reset by the final one of said coincidence outputs in the oscillation reference period between said target measurement period and the next target measurement period, a first OR gate for inputting the output of said first flip flop and a signal for instructing said actual measurement period into said first duty determination circuit; a second OR gate for inputting the output of said second flip flop and a signal for instructing said actual measurement period into said second duty determination circuit; and a third flip flop for output which is reset every time in synchronization with the front edge of one cycle of said input clock signal, and the status of which is changed over by coincidence outputs obtained by said first duty determination circuit and said second duty determination circuit.

In the first cycle arriving at intervals of an integer number of cycles of the input clock signals, the length of one cycle is measured. On the basis of the measured value, the operation circuit calculates the timing value of a one-fourth value, a two-fourth value, and a third-forth value of the calculated value, that is, the duty of 25%, 50% and 75%. And in each of the second cycles in the above-mentioned interval, the length is measured and, when the corresponding measured value becomes coincident with the above-mentioned calculated three values (¼, ²⁄₄, and ¾ of the calculated value), coincidence outputs are outputted from the coincidence circuits. These coincidence outputs show the timing position of the above-mentioned duties 25%, 50% and 75%.

In the width forming circuit, a pulse rises by a signal synchronized with the front edge of the input clock signal and gradually rises and falls at the timing positions indicated and determined by the above-mentioned duty determination circuit, that is, the timing positions of duties 25%, 50% and 75%. Therefore, it is possible to form and output clock signals of a pulse wave form for which the frequency is two times the input signal and the duty thereof is 50%.

Even in a case where the input clock signals have any optional frequency or cycle length, or the input clock signals are of a wave form, the duty of which is fluctuating, it is possible to obtain multiplied outputs, the wave form of which is duty 50%, as output at all times. That is, clock signals of pulse wave form for which the frequency is two times the input clock signals and the duty is 50% can be outputted at all times. Therefore, it is possible to increase the apparent frequency limit of semiconductor active elements used.

Since in this mode the measurement is carried out by utilizing the outputs of delay line oscillators, phase errors do not constitute any problem. Accordingly, it is possible to perform very highly accurate measurements.

Furthermore, the first and second duty determination circuits which are overlapped at least one cycle with each other and operate cycles shifted from each other are used, and flip flops and OR gates are positioned before each of them. Therefore, at the time of oscillation in the actual measurement period, the output of the above-mentioned pre-positioned flip flops are inputted into the duty determination circuits attached thereto. As the final coincidence output is generated, the above-mentioned pre-positioned flip flops are reset to cause the signals at the output side to disappear and the influences of the output side is avoided. Moreover, signals indicating the actual measurement periods are securely inputted in the duty determination circuits via OR gates. That is, the common delay line circuit, etc. which constitute one duty determination circuit are operated by changing over in the actual measurement period and oscillation reference period. Therefore, the construction is further simplified in comparison with two pairs of delay line oscillators, etc. for the actual measurement period and oscillation reference period.

Still furthermore, in this frequency multiplying circuit, the first and second duty determination circuit which are overlapped at least one cycle with each other and operate two cycles shifted from each other, since coincident signals showing the timing positions of duty 25%, 50% and 75% are outputted by turns, the target measurement period and actual measurement period are clearly distinguished, whereby it is possible to securely perform an action of oscillation in the target measurement period to the full width of one cycle. Furthermore, the construction is further simplified in comparison with a case where two pairs of delay line circuits, etc. for the actual measurement periods and oscillation reference periods.

Another aspect of the present invention is a n external synchronizing method for synchronizing an input clock signal with an external trigger signal, producing a number of internal trigger signals synchronized comprising the steps of: producing a number of internal trigger signals synchronized with an external trigger signal according to a cycle of input clock signals until the next external trigger signal arrives; sharing the trigger signals, with the timing shifted from each other, to a first duty determination circuit and a second duty determination circuit; measuring alternately the timing position corresponding to duty 50% of a cycle of the input clock signal from the position of the internal trigger signal; causing an output pulse to rise at the position of the internal trigger signal; and causing the output pulse to fall at the timing position corresponding to said measured duty 50%.

Since internal trigger signals (INT-TRIG) are inherently generated at cycles (T) of the input clock signals in addition to external trigger signals, it is possible to easily obtain output pulses in synchronization with them. Furthermore, since the timing positions corresponding to duty 50% of the cycles of the input clock signals from the positions of the internal clock signals are practically measured and indexed, the positions are accurate, and it is possible to obtain clear outputs of duty 50%.

In summary, even in a case where the arrival interval of external trigger signals is fluctuating or the pulse width of the external trigger signals is fluctuating, it is possible to easily obtain clock signals in state where the input clock signals are synchronized with these signals without receiving any influence by fluctuations of these signals.

Furthermore, even in a case where the input clock signals have any frequency or cycle length, or the input clock signals are of a wave form, the duty of which is fluctuating, clock signals having a pulse wave form, the duty of which is 50%, can be obtained at all times. Therefore, it is possible to increase the apparent frequency limitation of semiconductor active elements to be used.

Another aspect of the present invention is a n external synchronizing circuit comprising: an internal trigger generating circuit which, upon receiving a timing signal from timing generation circuit 301, measures a phase position from an external trigger signal at one cycle T of the input clock signal, generates and outputs an internal trigger signal at a phase position corresponding to the phase position, at which the external trigger signal arrives, at each of the next one cycle T; a mode change signal generation circuit for outputting internal trigger signals, sharing them to a first group of signals and a second group of signals, in each period of the external trigger signals, upon receiving said internal trigger signal; a first flip flop operating upon receiving said first group of signals and a second flip flop operating upon receiving said second group of signals; a first duty determination circuit which executes oscillation upon receiving the output of said first flip flop, determines the timing position of duty 50% of a clock signal to be outputted, by counting the number of cycles of the oscillation, outputs the coincidence output indicating the timing position, and resets said first flip flop; a second duty determination circuit which executes oscillation upon receiving the output of said second flip flop, determines the timing position of duty 50% of a clock signal to be outputted, by counting the number of cycles of the oscillation, outputs the coincidence output thereof, and resets said second flip flop; and a flip flop for an output, which is set in synchronization with said first group of signals and second group of signals and is reversed by coincidence outputs coming from said first duty determination circuit and said second duty determination circuit.

A number of internal trigger signals synchronized with the external trigger signals are produced at cycles of the input clock signals until the next external trigger signals arrive, and are shared to the first duty determination circuit and the second duty determination circuit with the timing shifted from each other, wherein the timing positions corresponding to duty 50% of the cycle of input clock signals are measured from the position of the internal trigger signals, the output pulse rises at the position of the internal trigger signals and the output pulse falls at the timing positions corresponding to the above-mentioned measured duty 50%. Since the internal trigger signals are inherently generated at cycles of the input clock signals in addition to the external trigger signals, output pulses can be easily obtained in synchronization with this signal. Furthermore, even though the pulse width of arriving external trigger signals and the interval of arrival of the external trigger signals are irregular, synchronization with them can be achieved. Furthermore, since the timing positions corresponding to duty 50% of the cycle of input clock signals are actually measured and indexed from the positions of the internal trigger signals, the positions thereof are accurate and it is possible to obtain clear output of duty 50%.

Another aspect of the present invention is an external synchronizing circuit comprising: an internal trigger generation circuit which, upon receiving a timing signal from a timing generation circuit, measures a phase position from an external trigger signal in one cycle (T) of the input clock signal, prepares the reference internal trigger signal at the phase position corresponding to the phase position, at which the external trigger signal arrives, in every next one cycle (T), alternately shares the signal to an "A" period of the external trigger signal and a "B" period adjacent to said period, and outputs it as an internal trigger signal; an "A" side mode change signal generation circuit which, upon receiving one of said internal trigger signals, outputs the internal trigger signals in said "A" period sharing the them to a first group of signals and a second group of signals; a first flip flop operating upon receiving said "A" side first group signal (SET-A1) and a second flip flop operating upon receiving said second group signal (SET-A2); a first duty determination circuit which executes oscillation upon receiving the output of said "A" side first flip flop, determines a timing position of a duty 50% of a clock signal to be outputted by counting the number of cycles of the oscillation, output a coincidence output indicating the timing position, and resets said "A" side first flip flop; a second duty determination circuit which executes oscillation upon receiving the output of said "A" side second flip flop, determines a timing position of a duty 50% of a clock signal to be outputted by counting the number of cycles of the oscillation, outputs a coincidence output indicating the timing position, and resets said "A" side second flip flop; a "B" mode change signal generation circuit which, upon receiving another of said internal trigger signals, outputs the internal trigger signals in said "B" period sharing them to the first group signals and second group signals; a first flip flop operating upon receiving said "B" side first group signal (SET-BI) and a second flip flop operating upon receiving said second group signal (SET-B2); a first duty determination circuit which executes oscillation upon receiving the output of said "B" side first flip flop, determines a timing position of a duty 50% of a clock signal to be outputted by counting the number of cycles of the oscillation, outputs a coincidence output indication the timing position, and resets said "B" side first flip flop; a second duty determination circuit which executes oscillation upon receiving the output of said "B" side second flip flop, determines a timing position of a duty 50% of a clock signal to be outputted by counting the number of cycle of oscillation, outputs a coincidence output indicating the timing position, and resets said "B" side second flip flop; and a flip flop for output, which is set in synchronization with said "A" and "B" side first group and second group of signals and is reversed by a coincidence output from said "A" and "B" side first and second duty determination circuits.

DETAILED DESCRIPTION OF THE PREFERRED EMBODIMENTS

Hereinafter, a description will be given of preferred embodiments of the invention with reference to the accompanying drawings.

[Wave shaping circuit]

Figure 1:
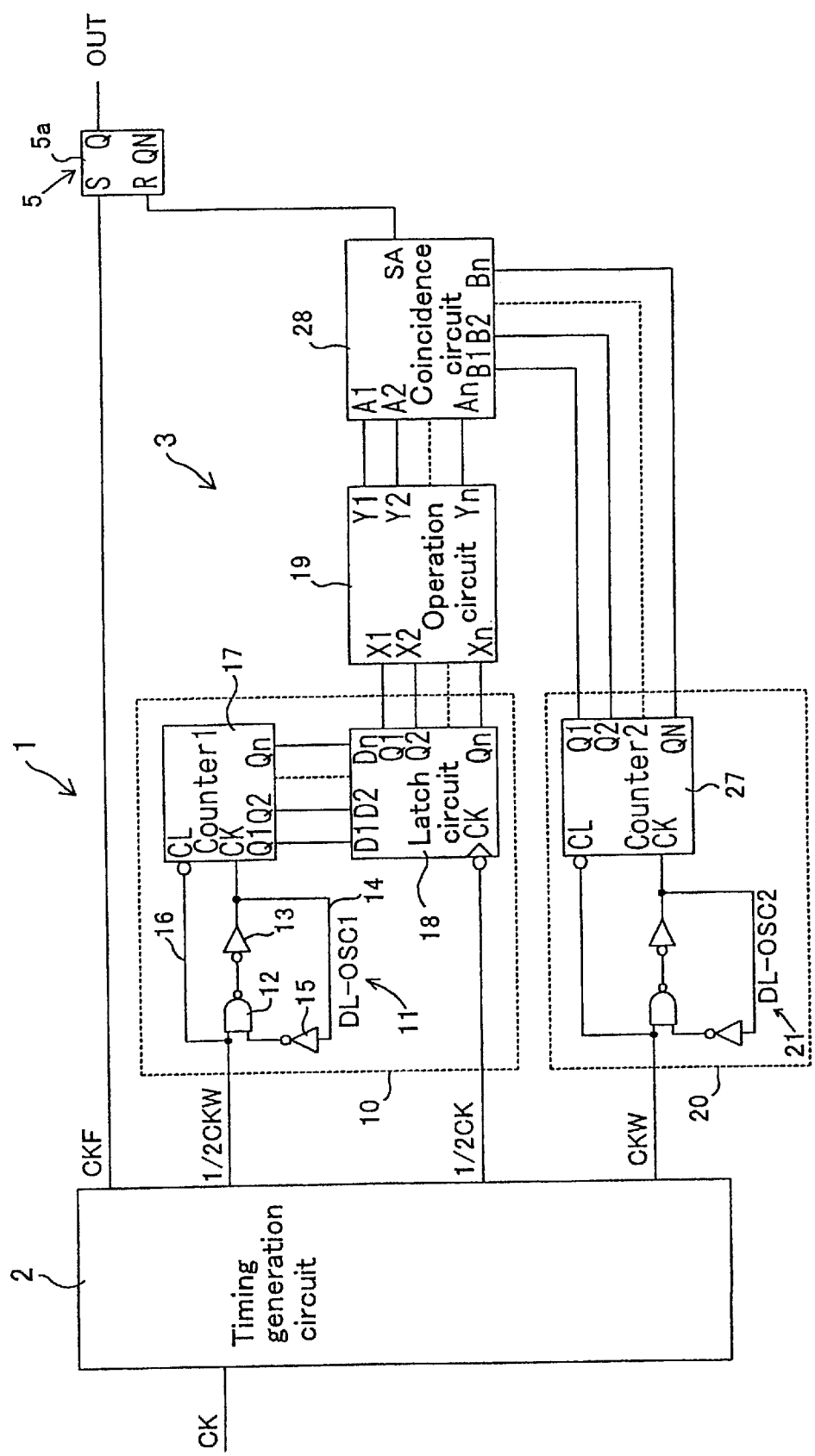
FIG. 1 is a view showing a first preferred embodiment of a digital wave shaping circuit according to the invention.

Digital wave shaping circuit shown in FIG. 1 has a timing generation circuit 2 which generates required timing signals CKF, ½CKW, ½CK, CKW from an input clock signal CK, a duty determination circuit 3 which determines the timing positions of state transitions of an output clock signal corresponding to a desired duty cycle (herein, duty 50%), and outputs a signal indicating the timing positions, upon receiving timing signals ½CKW, ½CK, CKW generated by the timing generation circuit 2, and a width forming circuit 5 which forms and outputs a clock signal (RS-FFQ) having a pulse width equivalent to the above-mentioned duty 50% on the basis of the timing positions determined and indicated by the duty determination circuit 3.

(1) Timing generation circuit 2

Figure 2:
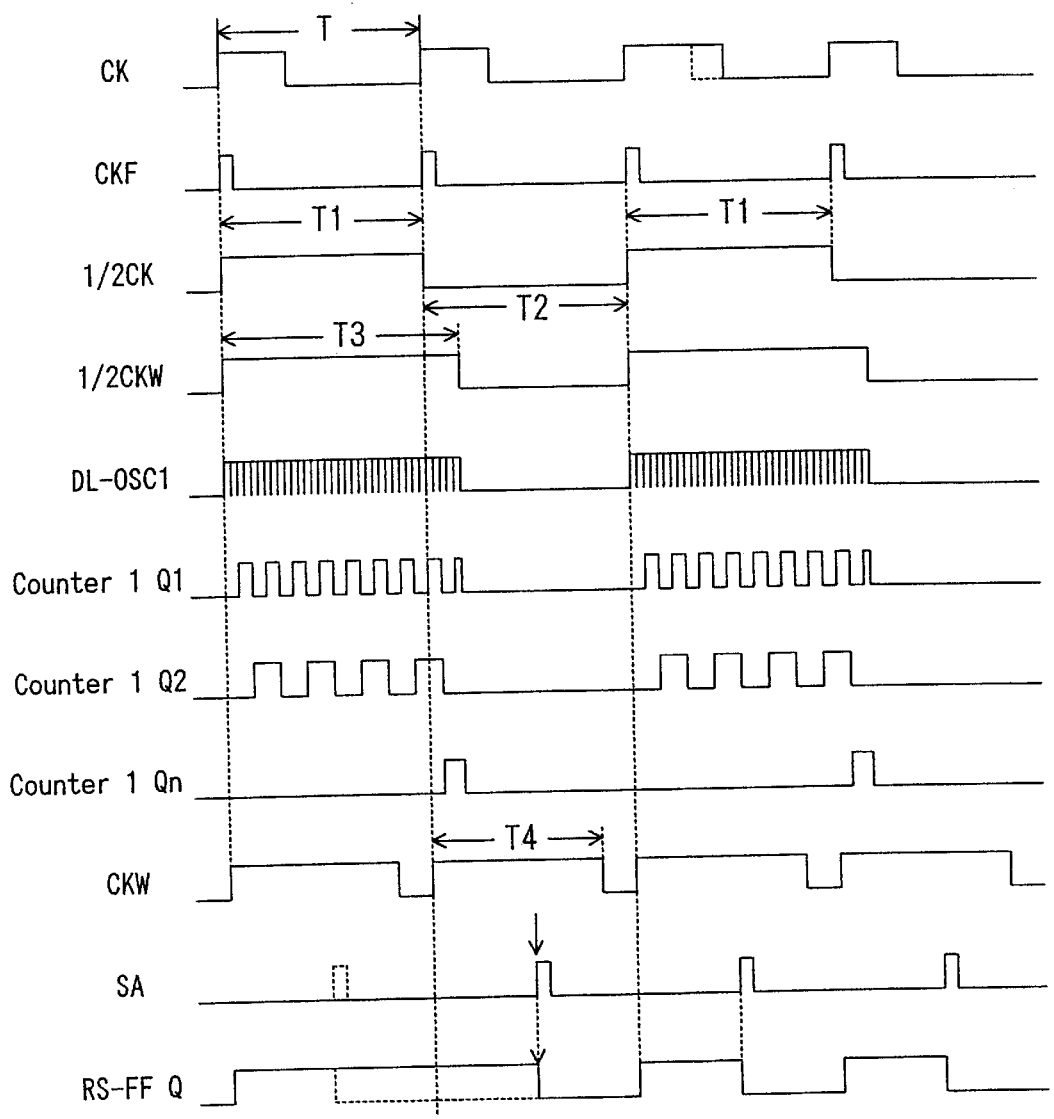
FIG. 2 is a timing chart showing operations of major parts of the circuit illustrated in FIG. 1.

In FIG. 2, CK is a clock signal inputted into the timing generation circuit 2 in which the duty may fluctuate while the repeating frequency is fixed (Cycle T). Herein, to better understand, the input clock signal CK is exaggeratedly depicted as a wave form in which the duty is fluctuating.

Timing generation circuit 2 generates required timing signals CKF, ½CKW, ½CK, and CKW shown in FIG. 2, from the input clock signal CK.

Among them, CKF is a timing signal consisting of short pulses generated at the front edge of the input clock signal CK and is used as an input of RS flip flop (hereinafter called RS-FF) 5a which constitutes a width forming circuit 5.

½CK is a timing signal for specifying a period T1 (target measurement period) to be measured as a length of one cycle T of the input clock signal CK, and in details, this is a signal which can be obtained by dividing the input clock signal CK to one half. To establish the target measurement period, one cycle period T1 in an odd number of cycles of the signal ½CK may be utilized.

½CKW is a timing signal to establish a period (actual measurement period) T3 to sustain a measurement operation over the above-mentioned target measurement period T1.

½CKW is a signal the fall of which is slightly delayed from the above-mentioned ½CK, that is, a signal which rises simultaneously with the input clock CK, falls after the fall of ½CK, having a pulse width slightly longer than one cycle T of the input clock signal CK. ½CKW can be obtained, for example, by producing a signal in which ½CK is slightly delayed in the width of ½ cycle thereof, and taking a logic sum of this signal and ½CK.

CKW is a signal for defining an oscillation reference period, which is commenced from the front edge of signal CK and is terminated just before arriving at the front edge of the next input clock cycle, whenever every clock signal CK arrives, and is a timing signal for establishing the period (oscillation reference period)T4 for actually measuring the timing position of duty 50%. At the cycle period in which the cycle length of the above-mentioned CK is not measured, that is, at one cycle period T2 of even numbers of the above-mentioned timing signal ½CK, CKW rises simultaneously with the commencement of one cycle period T1 of odd numbers of the above-mentioned ½CK and termination of one cycle period T2 of even numbers of the above-mentioned ½CK, and is in HIGH level until half of the corresponding period T1 and T2 (the timing position of duty 50%) passes, and thereafter the CKW falls before the termination of the corresponding period T1 and before commencement of the corresponding period T2.

(2) First duty determination circuit 3

Duty determination circuit 3 is equipped with a cycle measurement circuit 10 which measures the length of one cycle period T1 of odd numbers upon receiving the above-mentioned timing signal ½CKW, a operation circuit 19 which calculates the half value of the corresponding one cycle length T1 of odd numbers, that is, the timing position of duty 50%, upon receiving the measurement result, and an actual measurement circuit 20 for actually measuring the timing position of duty 50% with respect to signal CK while CKW is in HIGH level, upon receiving the above-mentioned timing signal CKW.

The cycle measurement circuit 10 consists of a delay line oscillator 11, a counter 17, and a latch circuit 18, wherein the operation circuit 19 receives a parallel output of the latch circuit 18 and the parallel output is received by a coincidence circuit 28.

(a) Delay line oscillator 11

Delay line oscillator 11 is composed of an NAND gate 12, one input terminal of which receives the above-mentioned timing signal ½CKW, an odd tier C-MOS inverter 13 which is connected to the output terminal of the corresponding NAND gate 12 as a delay element, and a simple reversing inverter 15 inserted into a feedback loop 14 from the output terminal of the corresponding inverter 13 to the other input terminal of the above-mentioned NAND gate.

As an inverter 13 which is a delay element, ECL inverter, IIL inverter, etc. may be used in addition to the C-MOS inverter.

The delay line oscillator 11 receives a timing signal ½CKW (actual measurement period T3) from the above-mentioned timing generation circuit 2, begins oscillating for measurement at the rise of the ½ CKW, and stops oscillating at the fall of ½CK. That is, NAND gate 12 is in such a state where one input terminal thereof is in a logic level L with the output thereof at H, and the output of inverter 15 (the other input terminal of NAND gate 12) is H while the output of inverter 13 is L, and the oscillation of the delay line oscillator 11 stops. However, as one input terminal of NAND gate 12 is changed to logic level H, the status thereof changes, wherein the output of NAND gate 12 becomes L, the output of inverter 13 becomes H, the output of inverter 15 becomes L, the other input terminal of NAND gate 12 becomes H, and the output of NAND gate 12 becomes H, and the oscillation starts. Thereafter, the oscillation of the delay line oscillator 11 comes to a stop when the ½ CKW (actual measurement period T3) falls.

The ½CKW (actual measurement period T3) rises simultaneously with a rise of the above-mentioned timing signal ½CK (target measurement period T1), but it falls with a delay from a fall of the timing signal ½CK. In summary, this delay line oscillator 11 starts oscillating at the rise of the timing signal ½CK obtained by dividing the above-mentioned input clock signal CK to one half (at the commencement of the target measurement period T1) and stops oscillating after the ½CK falls (after termination of the target measurement period T1). Therefore, the oscillation is sustained during one cycle (target measurement period T1) of each odd number of the timing signal ½CK.

(b) Counter 17

Counter 17 counts a change of output DL-OSC1 of the above-mentioned delay line oscillator 11, that is, an output change generated once per cycle of oscillation, since the clock input terminal CK of the counter thereof is connected to the output terminal of the above-mentioned delay line oscillator 11. Furthermore, the above-mentioned timing signal ½CKW (actual measurement period T3) is inputted into a clear terminal CL of the counter 17.

Therefore, the counter 17 begins counting simultaneously with a rise of the above-mentioned timing signal ½CK (target measurement period T1) and stops counting after the point of time at which the timing signal ½CK (target measurement period T1) falls and the oscillator stops oscillating, whereby the counting of number of cycles of oscillation is sustained during one cycle period in each odd number of cycle periods of the timing signal ½CK (target measurement period T1).

(c) Latch circuit 18

A figure output of the above-mentioned counter 17 is inputted into the latch circuit 18, and the timing signal ½CK (target measurement period T1) generated by the above-mentioned timing generation circuit 2 is inputted into the clock input terminal CK.

Therefore, this latch circuit 18 latches a count value (number of cycles of oscillation) of the counter 17 at the point of time at which the timing signal ½CK (target measurement period T1) falls, that is, when the target measurement period T1 is terminated.

Accordingly, the latch circuit 18 latches a count value of the number of cycles of oscillation corresponding to the length of one cycle period in each odd number of cycle periods of the timing signal ½CK (target measurement period T1) (one cycle T of the input clock signal CK).

(3) Operation circuit 19

The operation circuit 19 calculates the half value of the count value of the number of cycles of oscillations for one cycle in odd numbers of cycle periods of the timing signal ½CK (target measurement period T1) that is, the duty value of 50%, upon receiving the output of the above-mentioned latch circuit 18. This value becomes one input of the coincidence circuit 28.

(4) Actual measurement circuit 20

Actual measurement circuit 20 has a delay line oscillator 21 constructed to be like the above-mentioned cycle measurement circuit 10 and a second counter 27.

The delay line oscillator 21 and the second counter 27 receive the above-mentioned timing signal CKW. Therefore, the delay line oscillator 21 sustains oscillation while the CKW is in H level (the oscillation reference period T4).

The counter 27 counts the number of cycles of oscillation of the delay line oscillator 21 for the period T4 in which the oscillation is being carried out. The count value passes through the timing position of duty 50% with respect to signal CK.

(5) Coincidence circuit 28

Coincidence circuit 28 uses a calculated value equivalent to duty 50% obtained from the above-mentioned operation circuit 19 as one input and uses the count value obtained from the above-mentioned counter 17 as the other input, wherein both are verified.

Therefore, since the count value passes through the count value corresponding to duty 50% as the delay line oscillator 21 and counter 27 enter one cycle period of even numbers, a coincidence output SA is caused to appear in the coincidence circuit 28 as shown in FIG. 2 at that time. The coincidence output SA generates a pulse at the point at which the count value 27 is coincident with the calculated half value obtained from the operation circuit 19, wherein the pulse indicates the timing position of duty 50%.

Furthermore, no coincidence output SA appears in the first one cycle T1 of odd numbers.

Thus, the first duty determination circuit 3 determines the timing position of a desired duty value (duty 50%) of a clock signal to be outputted and indicates the timing position to the width forming circuit 5 as a coincidence output.

(6) Width forming circuit 5

Width forming circuit 5 receives the above-mentioned timing signal CKF at a set input terminal S of RS-FF 5a and receives the above-mentioned coincidence output SA at the re-set input terminal R. Therefore, the RS-FF 5a of the width forming circuit 5 is set by a timing signal CKF generated at the front edge per cycle of the input clock signals OK and is reset by a coincidence output SA generated at the timing position of duty 50%.

Therefore, from the Q output of RS-FF 5a of the width forming circuit 5, it is possible to obtain a clock output which rises at the front edge of each pulse of every cycle of the input clock signal OK and which falls at the timing position of duty 50%.

Since no coincidence output SA appears in the first cycle T1 of odd numbers, this portion is disregarded.

Thus, even though the duty of the input clock signal CK is of a wave form in which the duty is fluctuating about 50%, the input clock signal CK may be outputted (RS-FFQ) reliably after being shaped into a clock signal having a duty 50% wave for in by causing the signal CK to pass through the digital wave shaping circuit 1.

(7) Second embodiment

Figure 3:
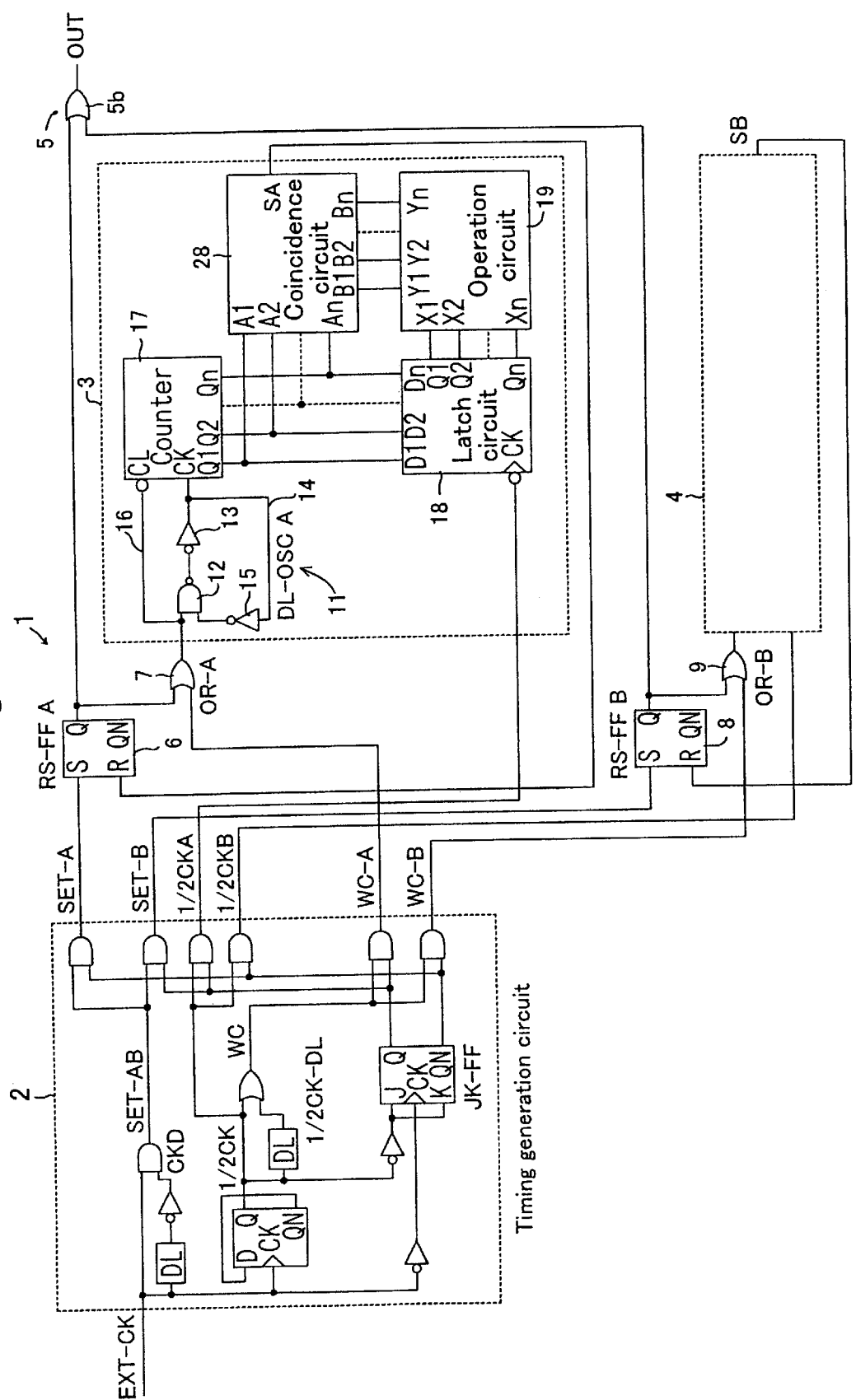
FIG. 3 is a view showing a second preferred embodiment of the digital wave shaping circuit according to the invention.
Figure 4:
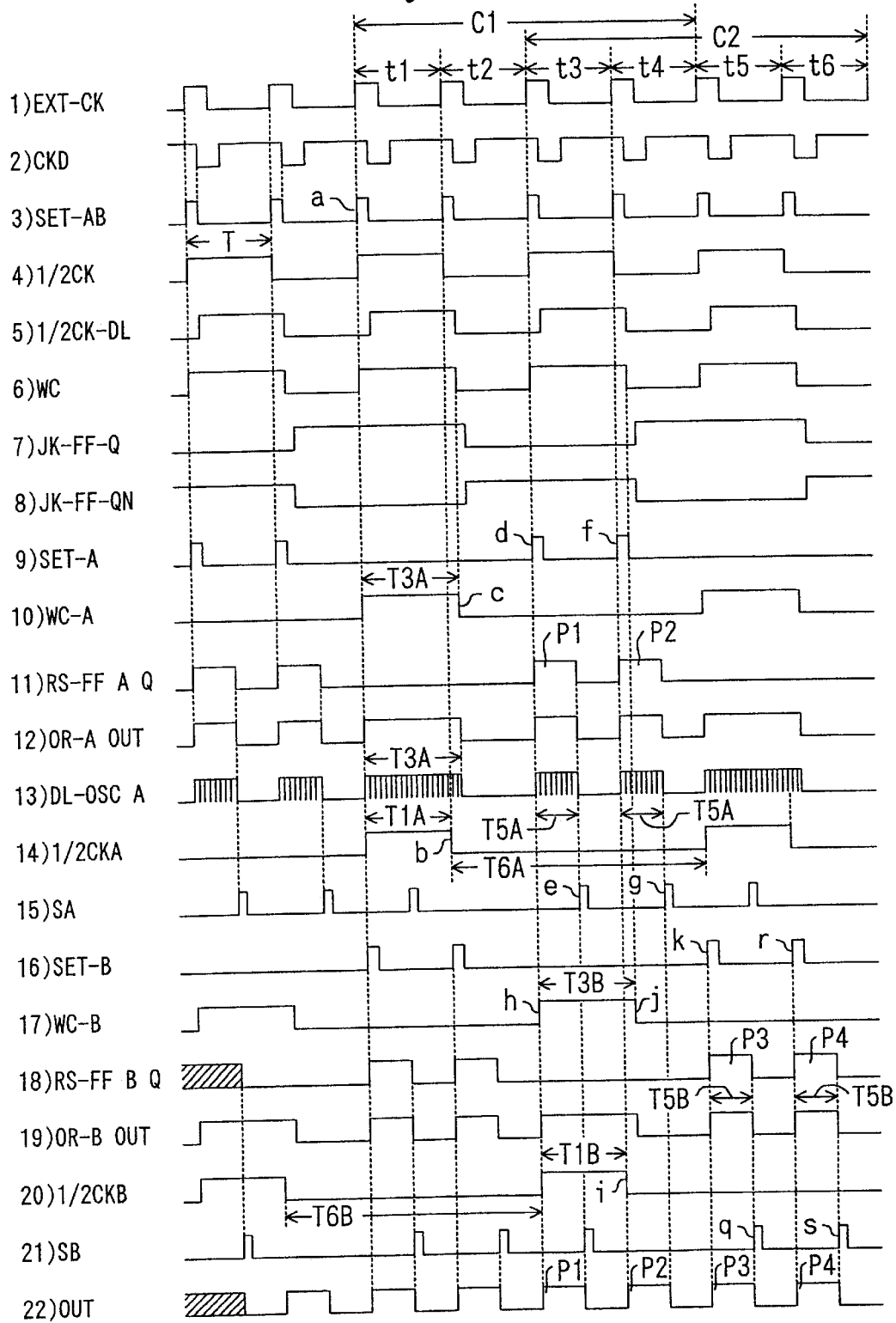
FIG. 4 is a timing chart showing operations of major part of the circuit illustrated in FIG. 3.

FIG. 3 shows the second embodiment which is provided with two pairs of duty determination circuits 3,4 having the same structure, wherein both the circuits are constructed, to operate in operation cycles CI, C2, respectively as shown in FIG. 4, so that they alternately operate two cycles of the input clock signal EXT-CK shifted from each other. It is noted that, as necessary, the first duty determination circuit 3 is called "A" side, and the second duty determination circuit 4 is called "B" side, and they are distinguished by respectively attaching affixes A and B thereto.

(i) Duty determination circuits 3,4

The first duty determination circuit 3 handles, as shown in FIG. 4, every four cycles (4T) of input clock signals EXT-CK as one repeating unit (operation cycle C1), measure the length T1A ("A" side target measurement period) of one cycle of the input clock signal EXT-CK at the first cycle (t1) in the front half of C1, and calculate the half value (timing position of duty 50%) of the length T of one cycle, using the result of the measurement, wherein on the basis thereof, at the third cycle (t3) and fourth cycle (t4) of the subsequent latter half of C1, the first duty determination circuit 3 measures the length T5A from the front edge of the input clock signals EXT-CK until becoming coincident with the calculated half value (that is, to the timing position of duty 50%), and, when the coincidence is secured, outputs a coincidence output SA indicating the timing position of duty 50%.

The second duty determination circuit 4 has an operation cycle C2 shifted two cycles from the first duty determination circuit 3. That is, the second duty determination circuit 4 handles every four cycles (4T) of input clock signals EXT-CK shown with t3 through t6 in FIG. 4 as one repeating unit (operation cycle C2), measures the length T1B ("B" side target measurement period) of one cycle of input clock signal EXT-CK at the first cycle (t3) in the front half of C2, and calculates the half value (timing position of duty 50%) of the length T of one cycle, using the result of the measurement, wherein on the basis thereof, at the third cycle (t5) and fourth cycle (t6) of the subsequent latter half of C2, the second duty determination circuit 4 measures the length T5B from the front edge of the input clock signals EXT-CK until becoming coincident with the calculated half value (that is, to the timing position of duty 50%), and, when the coincidence is secured, outputs a coincidence output SB indicating the timing position of duty 50%.

The above-mentioned respective duty determination circuits 3,4 are constructed so that one pair of the delay line oscillator 11, counter 17 and latch circuit 18 concurrently achieves both the functions of the above-mentioned cycle measurement circuit 10 and actual measurement circuit 20, simplifying the construction of the duty determination circuit 3 described with reference to FIG. 1. That is, in view of the circuits, they are in a form of omitting the above-mentioned actual measurement circuit 20, wherein the operation circuit 19 is connected to the latch circuit 18 while the coincidence circuit 28 uses the output of the operation circuit 19 as one input and uses output of the counter 17 as the other input.

(ii) RS-FF 6,8

RS-FF 6 is positioned before the first duty determination circuit 3, and the Q output of RS-FF 6 is inputted into the delay line oscillator 11 of the duty the determination circuit 3 through OR gate 7 (OR-A) and simultaneously is inputted into one input terminal of the OR gate 5b. And the output of the above-mentioned coincidence circuit 28, that is, the output of the duty determination circuit 3 is inputted into the reset terminal R of RR-FF 6 positioned before the circuit 3. The OR gate 5b and RS-FF 6 constitute a width forming circuit 5.

This RS-FF 6 is set by a short pulse SET-A ((9) in FIG. 4) generated at the front edge of input clock signal EXT-CK in a case where QN ((8) in FIG. 4) of JK-FF in the timing generation circuit 2 is H, that is, where the "A" side is in the oscillation reference period, and is reset by the above-mentioned coincidence output SA ((15) in FIG. 4) (See (11) in FIG. 4).

Therefore, pulses P1, P2 generated at the output terminal Q of RS-FF 6 at the third cycle t3 and the fourth cycle t4 is caused to appear at the output (OUT) via the OR gate 5b.

In the second duty determination circuit 4 which is constructed to be identical to the first duty determination circuit 3, RS-FF 8 and OR gate 9 are positioned before circuit 4, the Q output of RS-FF 8 is inputted into the delay line oscillator 11 of the duty determination circuit 4 through the OR gate 9 (OR-B), and simultaneously is inputted into the other input terminal of the OR gate 5b, wherein the output of the above-mentioned coincidence circuit 28, that is, the output of the duty determination circuit 4 is inputted into the reset terminal R of RS-FF 8 positioned before the circuit 4. This RS-FF 8 also constitutes a width forming circuit 5b along with the OR gate 5b.

This RS-FF 8 is set by a short pulse SET-B ((16) in FIG. 4) generated at the front edge of the input clock signal EXT-CK in a case where the Q ((7) in FIG. 4) of JK-FF in the timing generation circuit 2 is H, that is, where the "B" side is in the oscillation generation period, and is reset by the above-mentioned coincidence output SB ((21) in FIG. 4) (See ((18) in FIG. 4).

Therefore, pulses P3, P4 generated at the output terminal Q of RS-FF 8 at the fifth cycle t5 and the sixth cycle t6 are caused to appear at the output (OUT) through the OR gate 5b.

(iii) Timing generation circuit 2

Timing generation circuit 2 internally produces timing signals SET-AB, ½CK, ½CK-DL, WC, JK-FF-Q, and JK-FF-QN, and further using them, produces and outputs timing signals SET-A, SET-B, ½CKA, ½CKB, WC-A, and WC-B.

SET-AB ((3) in FIG. 4) is a timing signal consisting of short pulses generated at the front edge of the input clock signal EXT.CK.

½CK ((4) in FIG. 4) is a timing signal for specifying a period T1 (target measurement period) to be measured as a length of one cycle T of the input clock signal EXT-CK, and concretely is a signal obtained by dividing the input clock signal EXT-CK to one half.

WC ((6) in FIG. 4) is a timing signal for establishing periods T3A, T3B (actual measurement periods) to sustain a measurement operation over the above-mentioned target measurement period T1. The WC is a signal, the fall of which is slightly delayed from the above-mentioned ½CK, that is, a signal, which rises simultaneously with the input clock CK, having a width which is slightly longer than one cycle T of the input clock signal EXT-CK.

This WC is obtained by producing a signal ½CK-DL ((5) in FIG. 4) in which ½CK is slightly delayed in the width of the ½ cycle thereof and taking a logic sum of the signal and ½CK.

JK-FF-Q ((7) in FIG. 4) is a signal of Q output of JK-FF in the timing generation circuit 2, and, when the Q output is H, indicates that the "A" side is in the measurement period (while the "B" side is in the oscillation reference period), and when the QN output of JK-FF in the timing generation circuit 2 is H, JK-FF-QN ((8) in FIG. 4) indicates that the "B" side is in the measurement period (while the "A" side is in the oscillation reference period).

SET-A ((9) in FIG. 4) is a timing signal consisting of short pulses generated at the front edge of the input clock signal EXT-CK in a case where QN ((8) in FIG. 4) of JK-FF in the timing generation circuit 2 is H, that is, where the "A" side is in the oscillation reference period, and will be a set input of the "A" side RS-FF 6.

SET-B ((16) in FIG. 4) is a timing signal consisting of short pulses generated at the front edge of input clock signal EXT-CK in a case where Q ((7) in FIG. 4) of JK-FF in the timing generation circuit 2 is H, that is, where the "B" side is in the oscillation reference period and becomes a set input of RS-FF 8 at the "B" side.

½CKA ((14) in FIG. 4) is a signal for establishing the "A" side target measurement period T1A, and is a signal which is taken from ½CK while Q ((7) in FIG. 4) of JK-FF in the timing generation circuit 2 is H, that is, while the "A" side is in the measurement period (while the "B" side is in the oscillation reference period). ½CKB ((20) in FIG. 4) is a signal for establishing the "B" side target measurement period T1B and is a signal which is taken out from ½CK while QN((8) in FIG. 4) of JK-FF in the timing generation circuit 2 is H, that is, while the "B" side is in the measurement period (while the "A" side is in the oscillation period).

Commonly, these signals are generated from input clock signal EXT-CK so that target measurement periods T1A, T1B to be measured as a length of the one cycle T are spaced by intervals T6A, T6B, respectively, which are an integer number of cycles, herein, three times one cycle T of the input clock signal EXT-CK.

WC-A and WC-B are timing signals for actual measurement periods T3A, T3B and have a longer pulse than T1.

(iv) Operation

Firstly, input clock signal EXT-CK enters into the timing generation circuit 2. The timing generation circuit 2 begins by dividing input clock signal EXT-CK to one half to generate ½CK, wherein the Q output ((7) in FIG. 4) of JK-FF is in H level at the point of time when the first SET-AB of the first cycle t1 is generated ("a" in FIG. 4), and thereby the "A" side duty determination circuit 3 is selected and instructed to start measurement.

Therefore, the timing signal WC-A ((10) in FIG. 4) is inputted into delay line oscillator 11 through OR gate 7 to commence the oscillation and is inputted into a clear terminal CL of the counter 17. At the rise of the timing signal, the counter 17 begins counting the number of cycles of oscillation.

The oscillation of the delay line oscillator 11 is sustained at least until the rise of the second clock cycle t2 is completed.

The oscillation of the delay line oscillator 11 is terminated by a fall of WC-A which occurs before the rise of the third clock cycle t3, that is, at the time when the actual measurement period T3A ends slightly after one cycle T of the input clock CK ends (point "c" in FIG. 4).

In the meantime, due to the target measurement period T1A of ½CKA having a length corresponding to one cycle T of the input clock CK arriving and ½ CKA inputted into the clock input terminal CK of the latch circuit 18, the latch circuit 18 latches a count value of the counter 17 corresponding to one cycle length (length of one cycle T=T1a) when ½CKA falls ("b" point in FIG. 4).

Herein, the operation circuit 19 calculates one half of the count value of length of one cycle T, that is, the timing position of duty 50%, upon receiving output of the latch circuit 18, and outputs the result of the calculation, wherein the result is inputted into one input terminals B1 to Bn of the coincidence circuit 28.

As the third cycle t3 starts, RS-FF 6 is set by the arrival of SET-A ((9)in FIG. 4) ("d" point in FIG. 4). The set Q output ((11)in FIG. 4) of RS-FF 6 is caused to appear in the output OUT through OR gate 5b, and simultaneously is added to the "A" side delay line oscillator 11 through OR gate 7, thereby causing the oscillator 11 to oscillate. Furthermore, the set Q output of RS-FF 6 is added to the clear CL of the "A" side counter 17 through the OR gate 7 to cleared the counter 17, causing the counting of the number of cycles of oscillation to commence.

The output of counter 17 is inputted into the other input terminals A1 to An of the coincidence circuit 28, wherein the count value of the counter 17 is progressively increased, and at the moment ("e" point in FIG. 4) when the count value is coincident with the half value (half the length of one cycle 7) outputted by the above-mentioned operation circuit 19, a coincidence output SA is generated from the coincidence circuit 28.

This coincidence output SA is inputted into the reset input terminal R of RS-FF 6 and resets the flip flop. Therefore, when this coincidence output SA is generated, the set Q output ((11) in FIG. 4) of RS-FF 6 falls and appears at the OR gate 5b as pulse P1.

As a matter of course, this output pulse P1 is a pulse which rises at the front edge of external input clock, that is the input clock signal EXT-CK having one cycle T and falls at the position half of the length T of one cycle corresponding to a duty of 50%.

Subsequently, since SET-A ((9) in FIG. 4) arrives (point "f" in FIG. 4) again as the fourth cycle t4 starts, RS-FF 6 is set. The set Q output ((11) in FIG. 4) of RS-FF 6 is added to the "A" side delay line oscillator 11 through OR gate 7 to cause it to oscillate, and is added to the counter 17 to clear it, causing the counting of the number of cycles of oscillation to commence, while the set Q output appears in the output OUT through OR gate 5b.

As the count value of counter 17 becomes coincident with the output value (half of the length T of one cycle) of the above-mentioned operation circuit 19 ("g" point in FIG. 4), a coincidence output SA is generated again from the coincidence circuit 28. Since RS-FF 6 is reset by this coincidence output SA, the set Q output ((11) in FIG. 4) of RS-FF 6 falls and is caused to appear at OR gate 5b as pulse P2. As a matter of course, this output P2 is also a pulse which rises at the front edge of the external input clock, that is, the input clock signal EXT-CK and falls at the position of duty 50%.

The same operation is performed at the "B" side with two cycles delayed with respect to the above-mentioned "A" side operation. That is, QN output ((8) in FIG. 4) of JK-FF is in H level at the moment when SET-AB of the third cycle t3 is generated, whereby the "B" side duty determination circuit 4 is selected and instructed so as to operate the measurement.

Therefore, the timing signal WC-B ((17) in FIG. 4) rises ("h" point in FIG. 4), and is added to the "B" side delay line oscillator 11 through OR gate 9, whereby the oscillation is commenced. Simultaneously, the signal WC-B is inputted into a clear terminal CL of the counter 17, the rise of which causes the counter 17 to commence the countering of the number of cycles of oscillation.

The oscillation of the "B" side delay line oscillator 11 continues at least until a rise of the clock of the fourth cycle t4 is completed.

The oscillation of the "B" side delay line oscillator 11 is terminated by a fall of WC-B produced before the rise of the fifth clock cycle t5, that is, at the moment ("j" point in FIG. 4) when the actual measurement period T3B ends slightly after from one cycle T of the input clock CK ends.

In the meantime, due to the target measurement period T1B of ½CKB having a length corresponding to one cycle T of the input clock CK and ½CKB inputted into the clock input terminal CK of the latch circuit 18, the latch circuit 18 latches a count value of the counter 17 corresponding to one cycle length (length of one cycle T=T1B) when ½CKB falls ("i" point in FIG. 4).

Herein, the "B" side operation circuit 19 calculates the half of the count value of a length T of one cycle, that is, the timing position of duty 50%, upon receiving the output of the latch circuit 18, outputs the result of the calculation, and inputs it into one input terminal B1 to Bn of the coincidence circuit 28.

As the fifth cycle t5 starts, RS-FF 8 is set by the arrival of SET-B ((16) in FIG. 4) ("k" point in FIG. 4).

The set Q output ((18) in FIG. 4) of RS-FF 8 is caused to appear in the output OUT through OR gate 5b, and is added to the "B" side delay line oscillator 11 through OR gate 9 to cause the oscillator 11 to oscillate. Furthermore, the set Q output of RS-FF 8 is added to the clear CL of the "B" side counter 17 through OR gate 9 to clear the counter 17, causing the counting of the number of cycles of oscillation to commence.

The output of the "B" side counter 17 is inputted into the other input terminals A1 to An of the coincidence circuit 28, causing the count value of the counter 17 to be progressively increased, wherein a coincidence output SB is generated from the coincidence circuit 28 at the moment ("q" point in FIG. 4) when the count value becomes coincident with the half value (half of the length T of one cycle) outputted by the above-mentioned operation circuit 19.

This coincidence output SB is inputted into the reset input terminal R of RS-FF 8 and resets the flip flop. Therefore, the set Q output ((18) in FIG. 4) of RS-FF 8 falls at the point of time when this coincidence output SB is generated, and is caused to appear at the OR gate 5b as pulse P3.

As a matter of course, this output pulse 3 is a pulse which rises at the front edge of the external input clock, that is, the input clock signal EXT-CK and falls at the position of duty 50%.

Subsequently, as the sixth cycle t6 starts, since SET-B ((16) in FIG. 4) arrives again ("r" point in FIG. 4), RS-FF 8 is set. The set Q output ((18) in FIG. 4) of RS-FF 8 is added to the "B" side delay line oscillator 11 through OR gate 9 to cause it to oscillate and is added to the counter 17 to clear it, causing the counting of the number of cycles of oscillation to commence, while the set Q output is caused to appear in the output OUT through OR gate 5b.

When the count value of the counter 17 becomes coincident with the output value (half of length T of one cycle) of the above-mentioned operation circuit 19 ("s" point in FIG. 4), a coincidence output SB is generated again from the coincidence circuit 28. Since RS-FF 8 is reset by this coincidence output SB, the set Q output ((11) in FIG. 4) of RS-FF 8 falls, and is caused to appear in OR gate 5b as pulse P4.

As a matter of course, this output pulse P4 is a pulse which rises at the front edge of the external input clock, that is, the input clock signal EXT-CK and falls at the position of duty 50%.

Thus, an output clock of duty 50% which the is synchronized with the input clock signal EXT-CK can be obtained from OR gate 5b. Since the above-mentioned action and effect can be obtained even though the duty of the input clock CK fluctuates in the vicinity of 50% or further fluctuates, this is very effective for shaping digital wave forms. Therefore, it is possible to extend the operatable period of semiconductor active elements to a very high frequency.

(8) Third embodiment

Figure 5:
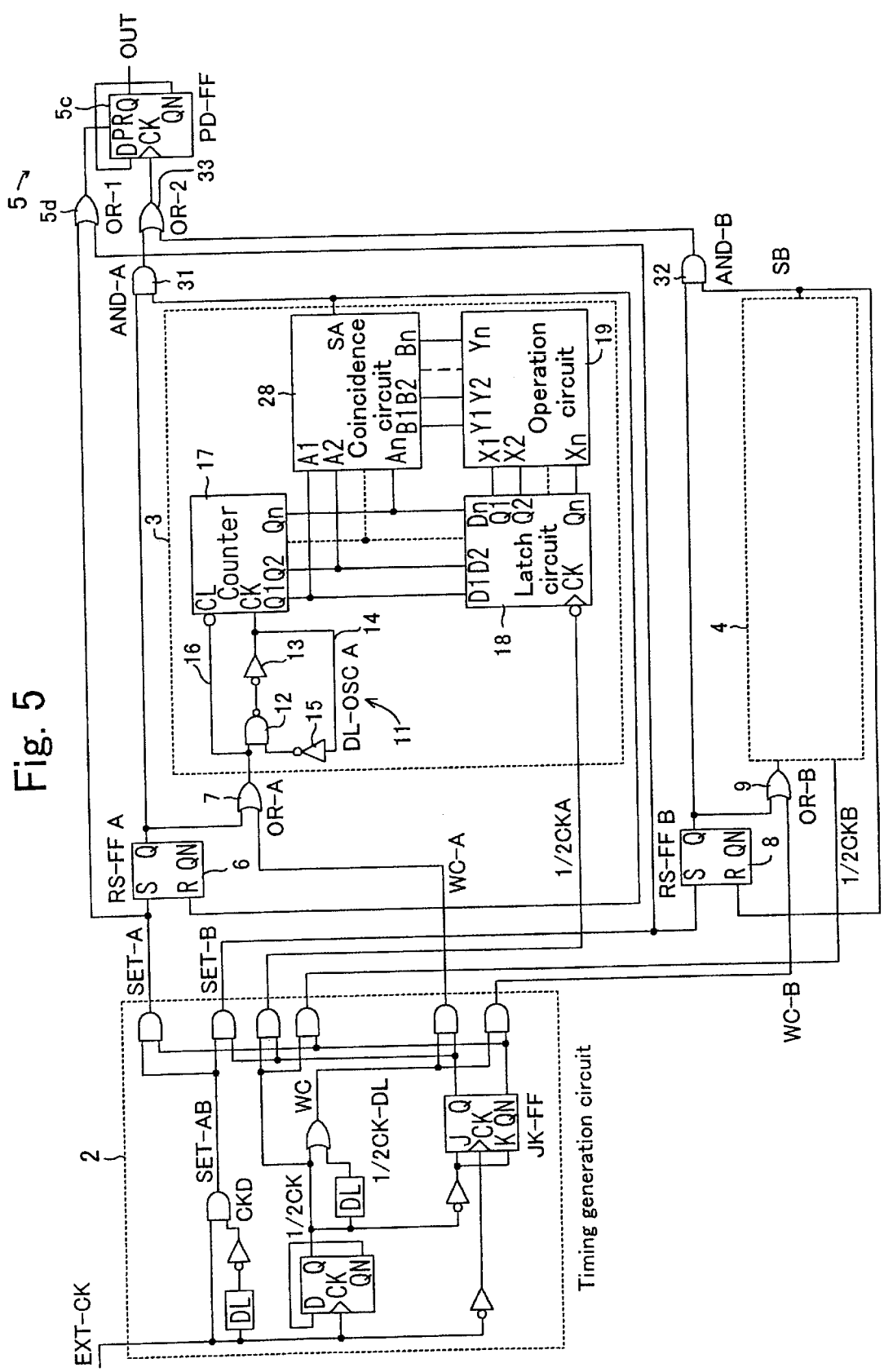
FIG. 5 is a view showing a third preferred embodiment of the digital wave shaping circuit according to the invention.

FIG. 5 shows a third embodiment. This embodiment is such that in a circuit illustrated in FIG. 3, a presettable D-FF 5c is provided in a width forming circuit 5 with the QN terminal thereof connected to the D terminal thereof, SET-A and SET-B signals (that is, SET-AB) are inputted into the preset input terminal PR through OR gate 5d, and simultaneously coincidence output SA, SB are inputted into the clock input terminal CK of D-FF 5c.

It is noted that AND gates 31,32 are provided in the line from the coincidence output terminals SA,SB of the coincidence circuit 28 to OR gate 33 in order to prohibit a coincidence output during the measurement, wherein AND is secured with Q output from RS-FF 6,8.

Figure 6:
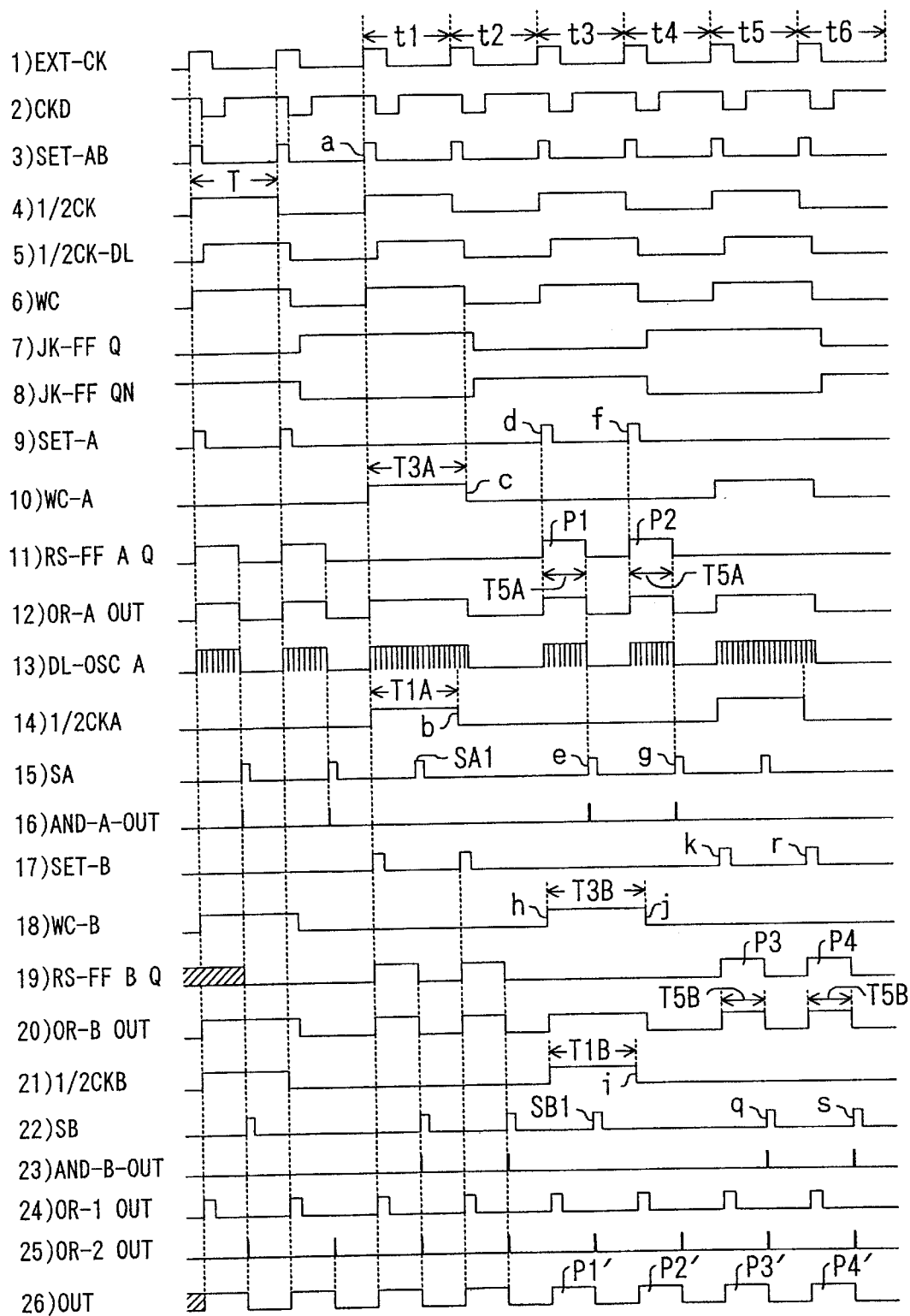
FIG. 6 is a timing chart showing operations of major parts of the circuit illustrated in FIG. 5.

FIG. 6 shows operations of major elements of a circuit illustrated in FIG. 5. A timing signal WC-A ((10) in FIG. 6) is inputted into the delay line oscillator 11 through OR gate 7 at the point of time ("a" in FIG. 6) when SET-AB is generated at the first cycle t1 of input clock signal EXT-CK to commence the oscillation, and simultaneously is inputted into the clear terminal CL of the counter 17. The counter 17 begins counting the number of cycles of oscillation by the rise of the timing signal WC-A. The oscillation of the delay line oscillator 11 is continued at least until the rise of the second clock cycle t2 is completed.

The oscillation of the delay line oscillator 11 is terminated when WC-A falls, that is, the actual measurement period T3A ends ("c" in FIG. 6). In the meantime, due to arrival of the end of the target measurement period T1A of ½CKA ("b" point in FIG. 6) and a fall of the ½CKA, latch circuit 18 latches the count value corresponding to one cycle length (length of one cycle T=T1A) of the counter 17.

Herein, the operation circuit 19 calculates the half value (timing position of duty 50%) of the count value of the length T of one cycle upon receiving the output of the latch circuit 18 and outputs the result of calculation, wherein the result is inputted into one input terminals B1 to Bn of the coincidence circuit 28.

As the third cycle t3 starts, RS-FF 6 is set by the arrival of SET-A ((9) in FIG. 6) (point "d" in FIG. 6). The set Q output ((11) in FIG. 6) of RS-FF 6 is inputted into AND gate 31 and is added to the "A" side delay line oscillator 11 through OR gate 7 to cause the oscillator 11 to oscillate. Furthermore, the set Q output of TS-FF 6 is added to a clear CL of the "A" side counter 17 through OR gate 7 to clear it, causing the counting of the number of cycles of oscillation to commence.

The output of the counter 17 is inputted into the other input terminals A1 to An of the coincidence circuit 28, and the count value of the counter 17 is progressively increased, wherein at the moment ("e" point in FIG. 6) when the count value thereof becomes coincident with the output half value (half of the length T of one cycle) of the above-mentioned operation circuit 19, a coincidence output SA is generated from the coincidence circuit 28.

This coincidence output SA is inputted into the reset input terminal QN of RS-FF 6 and resets the flip flop. When this coincidence output SA is generated, the set Q output ((11) in FIG. 6) of RS-FF 6 is fallen and becomes an input of AND gate 31 in a form of pulse P1.

Therefore, a short pulse AND-A-OUT ((16) in FIG. 6) is generated at the front edge of the coincidence output SA from AND gate 31 where this pulse P1 and coincidence output SA are used as two inputs, and becomes a clock input of D-FF 5c through OR gate 33.

If the above-mentioned short pulse AND-A-OUT ((16) in FIG. 6) is added to D-FF 5c as a clock input since D-FF 5c is preset by SET-AB every time, the Q output of D-FF 5c rises at that time and is caused to appear in the output terminal OUT as pulse P1'. As a matter of course, this output pulse P1' a pulse which rises at the front edge of the external input clock, that is, the input clock signal EXT-CK having one cycle T and thereafter falls at the position (duty 50%) of the half of the length T of one cycle.

It is noted that, since a coincidence pulse SA1 ((15) in FIG. 6) generated at the first cycle t1 is generated while the Q output of RS-FF 6 is low, no output appears at AND gate 31, wherein D-FF 5c is not changed over.

Therefore, the influence of the coincidence pulse SA1 generated when the "A" side is in the measurement period (when the Q terminal of JK-FF is in H level) is eliminated by AND gate 31, and the coincidence pulse SA1 does not appear at the output OUT side.

Subsequently, as the fourth cycle starts, SET-A ((9) in FIG. 6) arrives again ("f" point in FIG. 6), and RS-FF 6 is set. The set Q output ((11) in FIG. 4) of RS-FF 6 is added to the "A" side delay line oscillator 11 through OR gate 7 to cause the oscillator 11 to oscillate and is added to the counter 17 to clear it, causing the counting of the number of cycles of oscillation to commence, while the set Q output is inputted into AND gate 31. When the count value of the counter 17 becomes coincident with the output half value (half of the length T of one cycle) of the above-mentioned operation circuit 19 ("g" point in FIG. 6), a coincidence output SA is generated again from the coincidence circuit 28. When this coincidence output SA is generated, the set Q output ((I 1) in FIG. 6) of RS-FF 6 falls and becomes an input of AND gate 31 in a form of pulse P2.

Therefore, a short pulse AND-A-OUT ((16) in FIG. 6) is generated at the front edge of coincidence output SA from AND gate 31 where this pulse P2 and coincidence output SA are used as two inputs and becomes a clock input of D-FF 5c through OR gate 33.

D-FF 5c is preset by SET-AB every time. Accordingly, if the above-mentioned short pulse AND-A-OUT ((16) in FIG. 6) is added to D-FF 5c as clock input, the Q output of D-FF 5c falls at that time, and is caused to appear at the output terminal OUT as pulse 2'. As a matter of course, this output pulse P2' is a pulse which rises at the front edge of the external input clock, that is, the input clock signal EXT-CK and falls at the position of duty 50%.

With respect to the above-mentioned "A" side operation, the same operation is carried out at the "B" side with two cycles delayed. That is, the QN output ((8) in FIG. 6) of JK-FF is in H level at the moment when SET-AB of the third cycle t3 is generated, whereby the "B" side duty determination circuit 4 is selected and instructed so that measurement operation is performed.

Therefore, the timing signal WC-B ((18) in FIG. 6) rises ("h" point in FIG. 6) and is added to the "B " side delay line oscillator 11 through OR gate 9, wherein the oscillation thereof is commenced, and simultaneously the signal is inputted into a clear terminal CL of the counter 17, the rise of which causes, the counter 17 to commence counting the number of cycles of oscillation.

The oscillation of the "B" side delay line oscillator 11 is continued at least until the rise of the clock of the fourth cycle t4 is completed.

The oscillation of the "B" side delay line oscillator 11 is terminated by a fall of WC-B produced before the rise of the clock of the fifth cycle t5, that is, when the actual measurement period T3B ends slightly after one cycle of the input clock CK ends ("j" point in FIG. 6). In the meantime, due to the target measurement period T1B of ½CKA having a length equivalent to one cycle T of the input clock CK arriving at the end thereof ("i" point in FIG. 6) and a fall of ½ CKB inputted into the clock input terminal CK of the latch circuit 18, the latch circuit 18 latches the count value (length T of one cycle T1B) of the counter 17.

Herein, the "B" side operation circuit 19 calculates the half value of the count value of length T of one cycle, that is, the timing position of duty 50%, upon receiving the output of the latch circuit 18, and outputs the result thereof, wherein the result thereof is inputted into one input terminal B1 to Bn of the coincidence circuit 28.

As the fifth cycle t5 starts, RS-FF 8 is set by arrival of SET-B ((17) in FIG. 6) ("k" point in FIG. 6). The set Q ((19) in FIG. 6) of RS-FF 8 is inputted into AND gate 32, and simultaneously is added to the "B" side delay line oscillator 11 through OR gate 9, wherein the oscillator 11 is caused to oscillate, and the set Q output is added to a clear CL of the "B" side counter 17, wherein the counting is started.

The output of the "B" side counter 17 is inputted into the other input terminals A1 to An of the coincidence circuit 28, and the count value of the counter 17 is progressively increased, wherein at the moment (point "q" in FIG. 6) when the count value becomes coincident with the half value (half of length T of one cycle) outputted by the above-mentioned operation circuit 19, a coincidence output SB is generated from the coincidence circuit 28.

This coincidence output SB is inputted into the reset input terminal R of RS-FF 8, thereby causing the flip flop to be reset. Therefore, the set Q output ((19) in value FIG. 6) of RS-FF 8 falls at the moment when this coincidence output SB is generated, and becomes an input of AND gate 32 in a form of pulse P3. Accordingly, a short pulse AND-B-OUT ((25) in FIG. 6) is generated at the front edge of the coincidence output SB from AND gate 32 where this pulse P3 and coincidence output SB are used as two inputs, and becomes a clock input of D-FF 5c through OR gate 33.

The above-mentioned short pulse AND-B-OUT ((25) in FIG. 6) is added to D-FF 5c as a clock input since the D-FF 5c is preset by SET-AB every time, and the Q output of D-FF 5c falls at that time, and is caused to appear at the output terminal OUT as pulse P3'.

As a matter of course, this output pulse P3' is a pulse which rises at the front edge of the external input clock, that is, the input clock signal EXT-CK of one cycle T and thereafter falls at the position of the half (duty 50%) of length T of one cycle. It is noted that, since a coincidence pulse SB1 ((22) in FIG. 6) which is generated at the third cycle t3 is generated while the Q output of RS-FF 8 falls down to L, no output is caused to appear at AND gate 32, whereby D-FF 5c is not changed over.

Therefore, since influenced of the coincidence pulse SB 1 generated when the "B" side is in the measurement period (the QN terminal of JK-FF is in H level) is eliminated by the AND gate 31, they do not appear at the output OUT side.

Subsequently, as the sixth cycle t6 starts, wherein since SET-B ((17) in FIG. 6) arrives again (point "r" in FIG. 6), RS-FF 8 is set. The set Q output ((19) in FIG. 6) of RS-FF 8 is added to the "B" side delay line oscillator II through OR gate 9 to cause the oscillator 11 to oscillate and is added to the counter 17 to clear it, causing the counting of the number of cycles of oscillation to commence, while the set Q output becomes an input of AND gate 32.

When the count value of the counter 17 becomes coincident with the output half value (half of length T of one cycle) of the above-mentioned operation circuit 19 ("s" point in FIG. 6), a coincidence output SB is generated again from the coincidence circuit 28. Since RS-FF 8 is reset by this coincidence output SB, the set Q output ((19) in FIG. 6) of RS-FF 8 falls and becomes an input of AND gate 32 in a form of pulse P4.

Therefore, a short pulse AND-B-OUT ((23) in FIG. 6) is generated at the front edge of the coincidence output SB from the AND gate 32 where this pulse P4 and coincidence output SA are used as two inputs, and becomes a clock input of D-FF 5c through OR gate 33.

If the above-mentioned short pulse AND-B-OUT ((23) in FIG. 6) is added to D-FF 5c as a clock input since D-FF 5c is preset by SET-AB every time, the Q output of D-FF 5c falls and appears at the output terminal OUT as pulse p4'. As a matter of course, this output pulse P4' is a pulse which rises at the front edge of the external input clock, that is, the input clock signal EXT-CK and falls at the position of duty 50%.

Thus, it is possible to obtain output clocks P1', P2', P3', P4', . . . of duty 50% in synchronization with the input clocks CK from the Q output of D-FF 5c. The above-mentioned actions and effects can be obtained even in a case where the input clock CK fluctuates in the vicinity of duty 50 or more, and this is every effective for shaping digital wave forms. Therefore, it is possible to extend the operational area of semiconductor active elements to a very high frequency.

[Frequency multiplying circuit]

Figure 7:
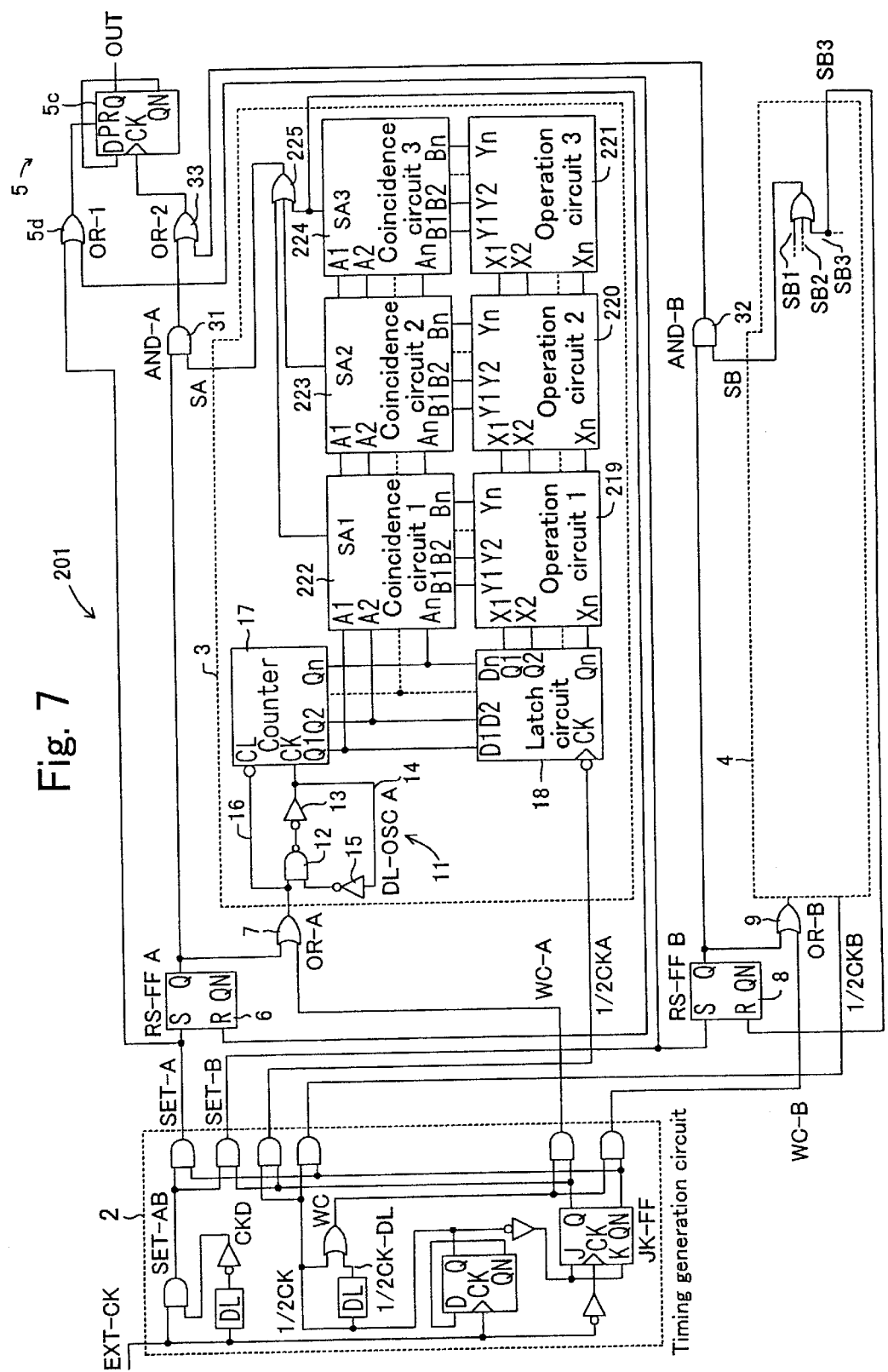
FIG. 7 is a view showing a preferred embodiment of a frequency multiplying circuit according to the invention.
Figure 8:
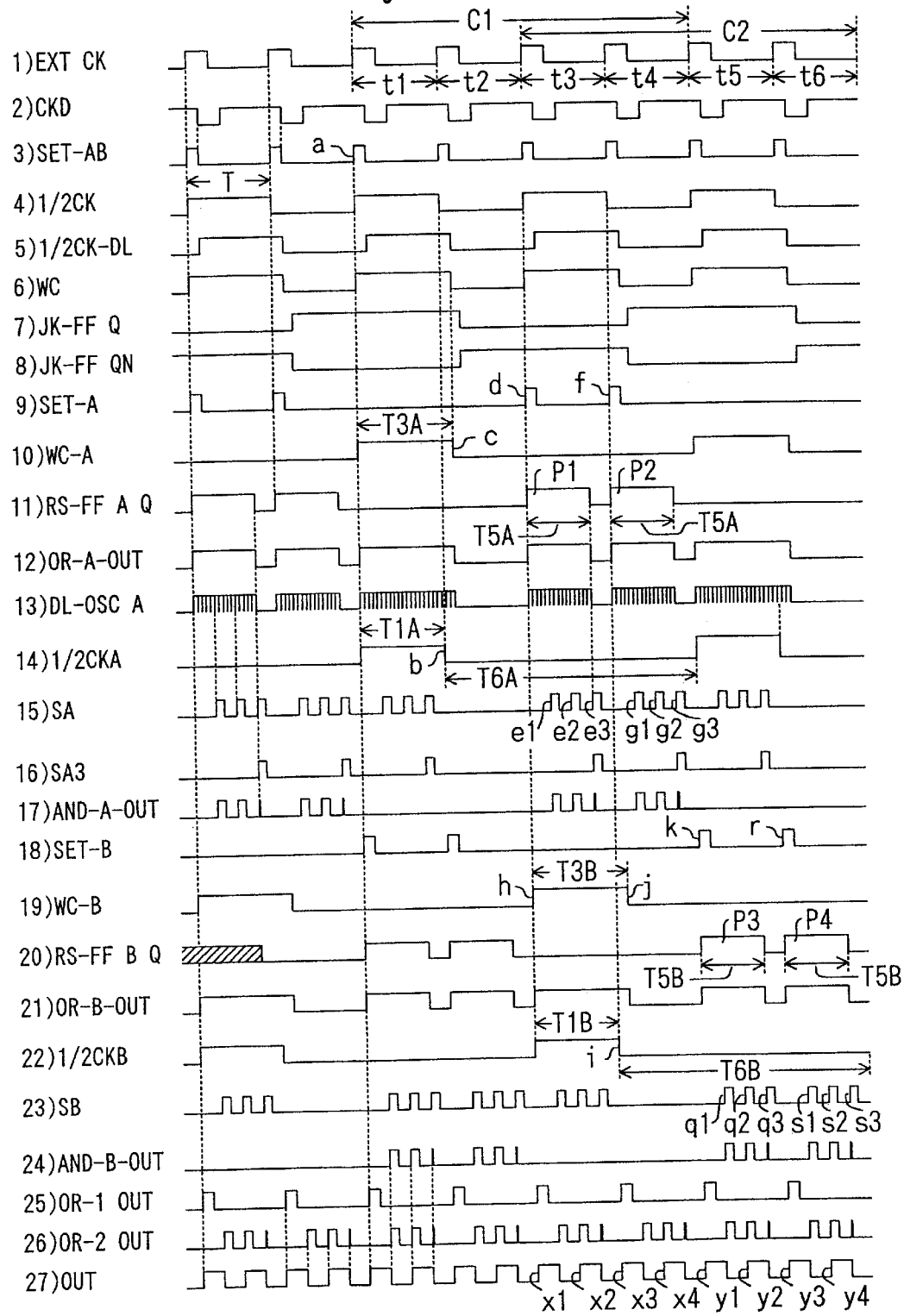
FIG. 8 is a timing chart showing operations of major parts of the circuit illustrated in FIG. 7.

A frequency multiplying circuit 201 illustrated in FIG. 7 is provided with two sets of duty determination circuits 3,4 of the same construction so that both the circuits are operated with two cycles of input clock signal EXT-CK shifted from each other, as shown as operation cycles C1, C2 in FIG. 8. It is noted that, as necessary, the first duty determination circuit 3 is called "A" side, and the second duty determination circuit 4 is called "B" side, wherein they are respectively given "A", and "B" as reference symbol for distinguishing them.

That is, the frequency multiplying circuit 201 has a timing generation circuit 2 which produces from the input clock signal EXT-CK required timing signals including signals ½CKA, ½CKB for instructing the target measurement periods T1A, T1B to be measured as the length of one cycle T with an interval equivalent to integral number times one cycle T of an input clock signal EXT-CK and signals WC-A, WC-B for instructing the actual measurement periods T3A, T3B for sustaining a measurement operation period slightly longer than the target measurement periods. Furthermore, they have duty determination circuits 3,4 for determining and instructing the timing position of duty 50% of clock signals to be outputted, upon receiving the above-mentioned timing signals which operate with at least one cycle overlapped with each other and with two cycles shifted from each other.

(1) Duty determination circuits 3,4

Both the duty determination circuits 3,4 are respectively composed of a delay line oscillator 11, a counter 17 for counting the number of cycles of oscillation, a latch circuit 18 for latching the content of the counter 17, a first operation circuit 219, second operation circuit 220 and third operation circuit 221 for respectively calculating a ¼ value, ²⁄₄ value and ¾ value of the counted value, and a first coincidence circuit 222, second coincidence circuit 223, and third coincidence circuit 224 each provided in the respective operation circuits 219, 220, 221.

(a) Delay line oscillator 11

Delay line oscillator 11 is composed of an NAND gate 12 in which one input terminal is used as input terminal of the oscillator, an odd tier C-MOS inverter 13 connected to the output terminal of the corresponding NAND gate 12 as delay element, a simple reversing inverter 15 which is inserted into a feedback loop 14 from the output terminal of the corresponding inverter 13 to the other input terminal of the above-mentioned NAND gate.

As an inverter 13 used as a delay element, ECL inverter, ILL inverter, etc. may be used in addition to C-MOS inverter.

The delay line oscillator 11 begins oscillating for measurement when timing signals WC-A, WC-B (actual measurement periods T3A, T3B) from the above-mentioned timing generation circuit 2 rise upon receiving the timing signals, and stops oscillating when they fall. That is, NAND gate 12 is in such a state where the logic level of one input terminal is L and the output thereof is H while the output of the inverter 13 is L and the output (the other input terminal of NAND gate 12) of the inverter 15 is H. Therefore, the oscillation of the delay line oscillator 11 stops. However, if one input terminal of the NAND put of the gate 12 is changed to logic level H, the status is changed so that the output of the NAND gate 12 becomes L, the output of the inverter 13 becomes H, the output of the inverter 15 becomes L, the other input of the NAND gate 12 becomes H, and the output of the NAND gate 12 becomes L, whereby the oscillation of the delay line oscillator 11 is commenced. Accordingly, the oscillation is stops when WC-A and WC-B (actual measurement periods T3A, T3B) fall.

The WC-A and WC-B (actual measurement periods T3A, T3B) rise simultaneously with a rise of the above-mentioned timing signal ½CK (target measurement periods T1A, T1B) while they fall with a slight delay from the fall of the timing signal ½CK. In summary, this delay line oscillator 11 begins oscillating by a rise (commencement of the target measurement periods T1A, T1B) of the timing signal ½CK obtained by dividing the above-mentioned input clock signal EXT-CK to one half and stops oscillating after the ½CK falls (that is, after termination of the target measurement periods T1A, T1B).

Thereby, the oscillation is continued during one cycle (target measurement period T1A or T1B) of odd numbers of the timing signal ½CK.

(b) Counter 17

The counter 17 counts a change of output DL-OSC-A of the above-mentioned delay line oscillator 11, that is, an output change generated once on every cycle of oscillation since the clock input terminal CK thereof is connected to the output terminal of the above-mentioned delay line oscillator 11. Furthermore, input signals which are identical to that in a case of the above-mentioned delay line oscillator 11, that is, timing signals WC-A, WC-B (actual measurement periods T3A, T3B), etc. are inputted into the clear terminal CL of the counter 17.

Therefore, as well as operations of oscillation and stop of the delay line oscillator 11, the counter 17 begins counting when the above-mentioned timing signal ½CK (target measurement periods T1A, T1B) rises, and stops counting after the timing-signal ½CK (target measurement periods T1A, T1B) falls. Thereby, the counting of the number of cycles of oscillation is continued for one cycle period of the timing signal ½CK (target measurement periods T1A, T1B).

(c) Latch circuit 18

A figure output of the above-mentioned counter 17 is inputted into the latch circuit 18, and a timing signal ½CK (target measurement period T1) produced by the above-mentioned timing generation circuit 2 is inputted into the clock input terminal CK.

Therefore, the latch circuit 18 latches the count value (the number of cycles of oscillation) of the counter 17 when the timing signal ½CK (target measurement periods T1A, T1D) falls, that is, when the target measurement period T1A, T1B ends. Therefore, the count value of the number of cycles of oscillation corresponding to the length (one cycle T of the input clock signal EXT-CK) of one cycle period of the timing signal ½CK (target measurement period T1A, T1B) is latched by the latch circuit 18.

(d) operation circuit 219, 220 221

The first operation circuit 219, second operation circuit 220 and third operation circuit 221 respectively calculate a ¼ value, ²⁄₄ value and ¾ value of the count value of the number of cycles of oscillation latched by the latch circuit 18, that is, the duty value of 25%, 50% and 75% thereof, upon receiving a parallel output of the above-mentioned latch circuit 18. Of them, the duty value of 25% becomes one input of the first coincidence circuit 222, the duty value of 50% becomes one input of the coincidence circuit 223, and the duty value of 75% becomes one input of the third coincidence circuit 224.

(e) Coincidence circuit 222, 223, 224

The first coincidence circuit 222, second coincidence circuit 223 and third coincidence circuit 224 respectively uses one of the parallel outputs (results of the calculation; a ¼ value, ²⁄₃ value and ¾ value) of the above-mentioned first operation circuit 219, second operation circuit 220, and third operation circuit 221 as one input while the output of the above-mentioned counter 17 is used as the other input, wherein these coincidence circuits 222, 223, 224 output coincidence outputs SA1, SA2, SA3 or SB1, SB2, SB3 whenever the counted value of the above-mentioned counter 17 is increased to the value which is coincident with the above-mentioned three calculated values.

(2) Pre-positioned FF and pre-positioned OR gate

SR Flip flops (hereinafter merely called FF) 6,8 are placed before the first duty determination circuit 3 and the second duty determination circuit 4 and are set every time in synchronization with the front edge of one cycle T of the input clock signal EXT-CK in the oscillation reference periods T6A, T6B between the above-mentioned target measurement period and the next target measurement period, wherein they are reset by the final SA3, SB3 of the above-mentioned coincidence outputs.

Furthermore, OR gates 7,9 are pre-positioned in each of the first duty determination circuit 3 and the second duty determination circuit 4, wherein through the corresponding OR gates 7, 9 output of the above-mentioned RS-FF 6,8 and signals WC-A, WC-B indicating the above-mentioned actual measurement periods T3A, T3B are inputted in the corresponding duty determination circuits 3,4. An output flip flop 5c is provided which is reset every time in synchronization with the front edge of one cycle T of input clock signal EXT-CK, and the output state of which is changed over by the coincidence outputs SA1, SA2, SA3, or SB1, SB2, SB3 obtained by the first duty determination circuit 3 and the second duty determination circuit 4.

Concretely, RS-FF 6 is pre-positioned in the first duty determination circuit 3, and the Q output thereof is inputted into the delay line oscillator 11 of duty determination circuit 3 through OR gate 7 (OR-A), and simultaneously is inputted into one input terminal of AND gate 31. Accordingly, the output of the above-mentioned coincidence circuit 224, that is, coincidence output of duty 75% is inputted into the reset terminal R of RS-FF 6 positioned before the circuit 3. This RS-FF 6 constitutes part of width forming circuit 5 along with output D-FF 5c.

This RS-FF 6 is set by a short pulse SET-A ((9) in FIG. 8) generated at the front edge of input clock signal EXT-CK when QN ((8) in FIG. 8) of JK-FF in the timing generation circuit 2 is H, that is, when the "A" side is in the oscillation reference period, and is reset by the final SA3 ((16) in FIG. 8) of the above-mentioned coincidence output (See (11) in FIG. 8).

Therefore, pulses P1, P2 generated at the output terminal Q of RS-FF 6 at the third cycle t3 and fourth cycle t4 are added to one terminal of AND gate 31, and while the pulses P1, P2 are being outputted, the coincidence outputs SA1, SA2, SA3 are added to the clock input terminal CK of a presettable D-FF 5c through OR gate 33 (OR-2).

RS-FF 8 and OR gate 9 are pre-positioned in the second duty determination circuit 4 constructed to be identical to the first duty determination circuit 3 having such construction, and the Q output is inputted to the delay line oscillator 11 of the duty determination circuit 4 through OR gate 9 (OR-B), while it is inputted into one input terminal of AND gate 31. Accordingly, the output of above-mentioned coincidence circuit 28, that is, output of the duty determination circuit 4 is inputted into the reset terminal R of RS-FF 8 pre-positioned here. This RS-FF 8 also constitutes a width forming circuit 5 along with D-FF 5c.

This RS-FF 8 is set by a short pulse SET-B ((16) in FIG. 8) generated at the front edge of input clock signal EXT-CK when Q ((7) in FIG. 8) of JK-FF in the timing generation circuit 2 is H, that is, when the "B" side is in the oscillation reference period, and is reset by the final one (although not illustrated, a pulse similar to SA3 of (16) in FIG. 8) of the above-mentioned coincidence output SB ((23) in FIG. 8) (See (18) in FIG. 8).

Therefore, pulses P3, P4 generated at the output terminal Q of RS-FP 8 in the fifth cycle t5 and sixth cycle t6 are added to one terminal of AND gate 32, and coincidence outputs SB1, SB2, SB3 are added to the clock input terminal CK of the presettable D-FF 5c through OR gate 33 (OR-2) while the pulses P3, P4 are being outputted.

(3) Width forming circuit 5

The width forming circuit 5 has a presettable D-FF 5c, in which the QN terminal thereof is directly connected to D terminal thereof. Furthermore, SET-A and SET-B signals (that is, SET-AB) are inputted to the preset input terminal PR through OR gate 5d, and simultaneously coincidence outputs SA1, SA2, SA3 or SB 1, SB2, SB3 are inputted into the clock input terminal CK of D-FF 5c through OR gate 33.

It is noted that, AND gate 31 which prohibits a coincidence output during the term of measurement is provided in a line from the coincidence output terminals SA1, SA2, SA3 of the coincidence circuits 222, 223, 224 to OR gate 33, wherein AND is obtained with respect to the Q output from RS-FF 6, 8.

As well, AND gate 32 which prohibits a coincidence output during the term of measurement is provided in a line from the coincidence output terminals SB1, SB2, SB3 of the coincidence circuits 222, 223, 224 to OR gate 33, wherein AND is operated with the Q output from RS-FF 6, 8.

(4) Timing generation circuit 2

A timing generation circuit 2 internally generates timing signals SET-AB, ½CK, ½CK-DL, WC, JK-FF-Q, and JK-FF-QN, and furthermore, using these signals, generates and outputs timing signals SET-A, SET-B, ½CKA, ½CKB, WC-A. and WC-B.

SET-AB ((3) in FIG. 8) is a timing signal consisting of short pulses generated at the front edge of input clock signal EXT-CK.

½CK ((4) in FIG. 8) is a timing signal for specifying a period T1 (target measurement period) to be measured as a length of one cycle T of the input clock signal EXT-CK. Concretely, ½CK is a signal obtained by dividing the input clock signal EXT-CK into one half.

WC ((6) in FIG. 8) is a timing signal for specifying periods (actual measurement periods) T3A, T3B to sustain a measurement operation over the above-mentioned target measurement period T1. WC is a signal with a fall which is slightly delayed from a fall of the above-mentioned ½CK, that is, which rises simultaneously with the input clock signal EXT-CK and has a slightly longer width than one cycle T of the input clock signal EXT-CK. WC is obtained by producing a signal ½CK-DL ((5) in FIG. 8), which is obtained by slightly delaying tile ½CK in the width of ½ cycle thereof and securing a logic sum of this signal and ½CK.

JK-FF-Q ((7) in FIG. 8) is a signal of Q output of JK-FF in the timing generation circuit 2, wherein, when the Q output is H, it indicates that the "A" side is in the measurement period (while the "B" side is in the oscillation reference period), and, when the Q output N of the JK-FF in the timing generation circuit 2 is H, JK-FFQN ((8) in FIG. 8) indicates that the "B" side is in the measurement period (while the "A" side is in the oscillation reference period).

SET-A ((9) in FIG. 8) is a timing signal consisting of a short pulse generated at the front edge of the input clock signal EXT-CK when the QN ((8) in FIG. 8) of JK-FF in the timing generation circuit 2 is H, that is, when the "A" side is in the oscillation reference period, and becomes a set input of the "A" side RS-FF 6.

SET-B ((18) in FIG. 8) is a timing signal consisting of a short pulse generated at the front edge of the input clock signal EXT-CK when the Q ((7) in FIG. 8) of JK-FF in the timing generation circuit 2 is H, that is, when the "B" side is in the oscillation reference period, and becomes a set input of the "B" side RS-FF 8.

½CKA ((14) in FIG. 8) is a signal for establishing a target measurement period T1A at the "A" side and is a signal which is picked up from ½CK when Q ((7) in FIG. 8) of JK-FF in the timing generation circuit 2 is H, that is, when the "A" side is in the measurement period (while the "B" side is in the oscillation reference period).

½CKB ((20) in FIG. 8) is a signal for establishing a target measurement T1B at the "B" side and is a signal which is picked up from ½CK when QN ((8) in FIG. 8) of JK-FF in the timing generation circuit 2 is H, that is, when the "B" side is in the measurement period (while the "A" side is in the oscillation reference period).

Commonly, they are generated so as to instruct target measurement periods T1A, T1B to be measured as length of the cycle T with intervals T6A, T6B, which are equal to integral number times, herein, three times, one cycle T of the input clock signal EXT-CK, kept from the input clock signal EXT-CK.

WC-A, WC-B are timing gignals for the actual measurement periods T3A, T3B, and have a longer pulse width than T1.

(5) Operations

As shown in FIG. 8, the first duty determination circuit 3 handles every four cycles (4T) of input clock signals EXT-CK as a single repeating cycle (operation cycle C1), measures the length T1A (the "A" side target measurement period) of one cycle of the input clock signal EXT-CK at the first cycle (t1) in the front half of C1, and calculates values of ¼, ²⁄₄ and ¾ (duty 25%, 50% and 75%) of the length T of one cycle by using the result of measurement. On the basis thereof, in the subsequent third cycle (t3) and fourth cycle (t4), the first duty determination circuit 3 measures the length from the front edge of the input clock signal EXT-CK to the position of coincidence with the calculated value, that is, the length up to the timing position of duty 25%, 50%, 75% (in FIG. 8 the length to the timing position of the maximum duty 75% is illustrated with T5A), and outputs coincidence outputs SA1, SA2, SA3 indicating the timing positions of duty 25%, 50% and 75% whenever the coincidence is secured.

The second duty determination circuit 4 has an operation cycle C2 which is delayed two cycles from the first duty determination circuit 3. That is, the second duty determination circuit 4 handles every four cycles of the input clock signal EXT-CK shown with t3 to t6 in FIG. 8 as a single repeating cycle (operation cycle C2), measures the length T1B (the "B" side target measurement period of one cycle of the input clock signal EXT-CK in the first cycle (t3) in the front half of C2, and calculates the values of ¼, ²⁄₄ and ¾ (timing positions of duty 25%, 50%, and 75%) of the length T of one cycle using the result of measurement. On the basis thereof, in the subsequent third cycle (t5) and fourth cycle (t6), the second duty determination circuit 4 measures the length from the front edge of the input clock signal EXT-CK to the position of coincidence with the calculated value, that is, the length up to the timing positions of duty 25%, 50% or 75% (in FIG. 8, the length to the timing position of the maximum duty 75% is illustrated with T5B), and outputs coincidence outputs SB1, SB2, SB3 indicating the timing positions of duty 25%, 50% and 75% whenever the coincidence is secured.

FIG. 8 shows operations of major elements of the circuit illustrated in FIG. 7.

(i) "A" side first cycle t1

When SET-AB is generated at the first cycle t1 of the input clock signal EXT-CK ("a" in FIG. 8), the timing signal WC-A ((10) in FIG. 8) is inputted into the delay line oscillator 11 through OR gate 7 to commence oscillation, and simultaneously is inputted into the clear terminal CL of the counter 17. The counter 17 begins counting the number of cycles of oscillation at the rise of the timing signal WC-A. The oscillation of the delay line oscillator 11 is continued at least until the rise of the second clock cycle t2 is completed.

The oscillation of the delay line oscillator 11 is caused to end when WC-A falls, that is, the actual measurement period T3A ends ("c" point in FIG. 8). In the meantime, the latch circuit 18 latches a count value (length T of one cycle=T1A) of the counter 17 due to the target measurement period T1A of ½CKA arriving at the end ("b" point in FIG. 8) and a fall of ½CKA.

Herein, the operation circuit 219, 220, or 221 calculate values of ¼, ²⁄₄ and ¾ (timing position of duty 25%, 50% and 75%) of the count value of length T of one cycle upon receiving an output of the latch circuit 18, outputs the result of calculation, and inputs the result of calculation into one input terminals B1 to Bn of the coincidence circuits 222, 223 and 224.

(ii) "A" side third cycle t3

As the third cycle t3 starts, RS-FF 6 is set by the arrival of SET-A ((9) in FIG. 8) ("d" point in FIG. 8). The set Q output of RS-FF 6 ((11) in FIG. 8) is inputted into AND gate 31, and simultaneously is added to the "A" side delay line oscillator 11 through OR gate 7 to cause the oscillator 11 to commence oscillating.

Furthermore, the set Q output of RS-FF 6 is inputted to the clear CL of the "A" side counter 17 through OR gate 7 to cause the counter 17 to clear, causing the counting the number of cycles of oscillation to commence.

The output of counter 17 is inputted into the other input terminals A1 to An of coincidence circuits 222, 223, 224, and the count value of the counter 17 is progressively increased. Then, at the moment when the count value becomes coincident with the value (¼, ²⁄₄ and ¾ value of length T of one cycle) outputted by the above-mentioned operation circuits 219, 220 and 221 ("e1", "e2", "e3" points in FIG. 8), coincidence outputs SA1, SA2, SA3 are generated from the coincidence circuits 222, 223, 224 every time.

The maximum SA3 among these coincidence outputs SA1, SA2, SA3 is inputted into the reset input terminal R of RS-FF 6 and resets the flip flop. When this coincidence output SA3 is generated, the Q output ((11) in FIG. 8) of RS-FF 6 falls, and becomes an input of AND gate 31 in a form of pulse P1.

On the other hand, the coincidence outputs SA1, SA2 are generated before SA3. Therefore, coincidence outputs SA1, SA2, SA3 are generated, as output AND-A-OUT ((17) in FIG. 8), only within the width of pulse P1 from AND gate 31 which uses this pulse P1 and coincidence outputs SA1, SA2,SA3 as two inputs, and they become clock inputs of D-FF 5c through OR gate 33.

However, accurately, SA3 is a short pulse generated at the front edge of the coincidence output SA3.

Since D-FF 5c being a flip flop at the output side is preset every time by SET-A or SET-B (that is, SET-AB), whenever a short pulse of AND-A-OUT ((17) in FIG. 8) corresponding to the above-mentioned coincidence outputs SA1, SA2, SA3 is added to D-FF 5c as a clock input, the Q output of D-FF 5c is changed and is caused to appear at the output terminal OUT as pulses x1, x2. As a matter of course, theses pulses x1, x2 rise in synchronization with the front edge of the external input clock, that is, the input clock signal EXT-CK of one cycle T and becomes a digital signal, the frequency of which is two times the signal EXT-CK, and the output wave form becomes that of a pulse fallen at the position of just the half (duty 50%) of the length of one cycle (half of the original one cycle, ½T), that is the position of ¼T of the cycle of the input wave form.

It is noted that, since coincidence outputs SA1, SA2, SA3 ((15) in FIG. 8) generated in the first cycle t1 are generated while the Q output of RS-FF 6 falls down to L, no output appear at AND gate 31, and D-FF 5c is not changed over.

Therefore, influences of the coincidence pulse SA1, which is generated when the "A" side is in the measurement period (that is, when the Q terminal of JK-FF is in H level) are eliminated by AND gate 31, and they do not appear at the output OUT side.

(iii) "A" side fourth cycle t4

Subsequently, as the fourth cycle t4 starts, RS-FF 6 is set since SET-A ((9) in FIG. 8) arrives again (point "f" in FIG. 8) . The set Q output ((11) in FIG. 8) of RS-FF 6 is added to the "A" side delay line oscillator 11 through OR gate 7 to cause the oscillator to oscillate and is added to the counter 17 to clear it, causing counting the number of cycles of oscillation to commence, while the set Q output is inputted into AND gate 31.

As the count value of the counter 17 becomes coincident with the output value (¼, ²⁄₄ and 314 value of length T of one cycle) of the above-mentioned operation circuits 219, 220, 221 ("g1","g2","g3" points in FIG. 8), coincidence outputs SA1, SA2, SA3 are generated again from the coincidence circuits 222, 223, 224.

The Q output ((11) in FIG. 8) of RS-FF 6 falls when this coincidence output SA3 is generated and becomes an input of AND gate 31 in a form of pulse P2. On the other hand, coincidence outputs SA1 and SA2 are generated before this SA3.

Therefore, coincidence outputs SA1, SA2, SA3 are generated as output AND-A-OUT ((17) in FIG. 8), only within the width of pulse P1, from AND gate 31 where this pulse P1 and coincidence output SA are used as two inputs, and become a clock input of D-FF 5c through OR gate 33.

If a short pulse AND-A-OUT ((17) in FIG. 8) corresponding to the above-mentioned coincidence output SA1, SA2, SA3 is added to D-FF 5c as clock input since D-FF 5c is present by SET-AB every time, the Q output of D-FF 5c is changed at that time and is caused to appear at the output terminal OUT as pulse x3, x4. As a matter of course, these output pulses x3, x4 rise in synchronization with the front edge of the external input clock, that is, the input clock signal EXT-CK of one cycle T and becomes a digital signal, the frequency of which is two times the signal EXT-CK. The output wave form is that of a pulse which is fallen at the position of just the half (duty 50%) of length of one cycle, that is, the position of ¼T of the cycle of the original input wave form.

(iv) "B" side third cycle t3

With respect to the operation at the "A" side, the same operation is carried out at the "B" side with two cycles delayed. That is, when SET-AB of the third cycle t3 is generated, the QN output ((8) in FIG. 8) of JK-FF is in H level, thereby the "B" side duty determination circuit 4 is selected and instructed to carry out measurement.

Therefore, when the timing signal WC-B ((19) in FIG. 8) rises ("h" point in FIG. 8), it is added to the "B" side delay line oscillator 11 through OR gate 9 to cause it to commence oscillating and is inputted into the clear terminal CL of the counter 17, the rise of which causes the counter 17 to start counting the number of cycles of oscillation.

(v) "B" side fourth cycle t4

The oscillation of the "B" side delay line oscillator 11 is continued it least until the rise of clock of the fourth clock cycle t4 is completed.

The oscillation of the "B" side delay line oscillator 11 is caused to end by a fall of WC-13 produced before the rise of the fifth clock cycle t5, that is, when the actual measurement period T3B ends slightly after one cycle T of the input clock CK ("j" point in FIG. 8) ends. In the meantime, the target measurement period T1B of ½CKA having a length equivalent to one cycle T of the input clock CK comes to the end ("i" point in FIG. 8), and ½CKB inputted into the clock input terminal CK of the latch circuit 18. Therefore, the latch circuit 18 latches the count value corresponding to one cycle length (length of one cycle T=T1B) of the latch circuit 18.

Here, the "B" side operation circuits 219, 220, 221 calculates ¼ value, ²⁄₄ value, ¾ value (timing positions of duty 25%, 50%, 75%) of the count value of length T of one cycle, upon receiving the output of the latch circuit 18, outputs the result of calculation, and input it into one input terminals B1 to Bn coincidence circuits 222, 223, 224.

(vi) "B" side fifth cycle t5

As the fifth cycle t5 starts, RS-FF 8 is set by arrival of SET-B ((18) in FIG. 8) ("k" point in FIG. 8). The Q output ((20) in FIG. 8) of RS-FF 8 is added to the "B" side delay line oscillator through OR gate 9 to cause the oscillator 11 to oscillate and is added to a clear CL of the "B" side counter 17 to cause the counting operation to commence, while the output is inputted into AND gate 32.

The output of the "B" side counter 17 is inputted into the other input terminals A1 to An of the coincidence circuits 222, 223, 224, thereby causing the count value of the counter 17 to be progressively increased. At the moment when the output becomes coincident with the value (¼, ²⁄₄, ¾ values of length T of one cycle) outputted by the above-mentioned operation circuit 219, 220, 221 (points of "q1", "q2", "q3" in FIG. 8), coincidence outputs SB1, SB2, SB3 are generated from the coincidence circuit 28.

The maximum SB3 of these coincidence outputs SB1, SB2, SB3 is inputted into the reset input terminal R of RS-FF 8 to cause the flip flop to reset. Therefore, when this coincidence output SB3 is generated, the Q output ((20) in FIG. 8) of RS-FF 8 falls and becomes an input of AND gate 32 in a form of pulse P3.

On the other hand, coincidence outputs SB1, SB2 are generated before SB3. Therefore, coincidence outputs SB1, SB2, SB3 are generated as output AND-B-OUT ((24) in FIG. 8) from AND gate 32 in which the pulse P3 and coincidence outputs SB1, SB2, SB3 are used as two inputs, and become a clock input of D-FF 5c through OR gate 33.

However, accurately, SB3 is a short pulse generated at the front edge of the coincidence output SB3.

If a short pulse AND-B-OUT ((24) in FIG. 8) corresponding to the above-mentioned coincidence outputs SB1, SB2, SB3 is added to D-FF 5c as a clock input since D-FF 5c is preset by SET-AB every time, the Q output of D-FF 5c falls at that time and appears at the output terminal OUT as pulses y1, y2. As a matter of course, these output pulses y1, y2 become a digital signal which rises in synchronization with the front edge of the external input clock, that is, the input clock signal EXT-CK of one cycle T and has a frequency of two times the signal EXT-CK. The output wave form is that of a pulse which is fallen at the position of just the half (duty 50%) of length (half ½T of the original cycle) of one cycle, that is, the position of ¼ T of the original input wave form.

It is noted that, since coincidence pulses SB1, SB2, SB3 ((23) in FIG. 8) generated at the third cycle t3 are generated while the Q output of RS-FF 8 falls down to L, no output appears in AND gate 32, wherein D-FF 5c is not changed over.

Therefore, influences of coincidence pulse SB1 generated when the "B" side is in the measurement period (the Q terminal of JK-FF is in H level) are eliminated by AND gate 32, and they do not appear at the output OUT side.

(vii) "B" side sixth cycle t6

Subsequently, as the sixth cycle t6 starts, SET-B ((18) in FIG. 8) arrives again ("r" point in FIG. 8), wherein RS-FF 8 is set. The Q output ((20) in FIG. 8) of RS-FF 8 is added to the "B" side delay line oscillator 11 through OR gate 9 to cause the oscillator 11 to oscillate and is added to the counter 17 to clear it, causing the counting of the number of cycles of oscillation to commence, while the Q output becomes an input of AND gate 32. When the count value of the counter 17 becomes coincident with the output value (¼, ²⁄₄, ¾ values of length T of one cycle) of the above-mentioned operation circuit 219, 220, 221 (points "s1", "s2", "s3" in FIG. 8), coincidence outputs SB1, SB2, SB3 are generated again from the coincidence circuits 222, 223, 224.

Since RS-FF 8 is reset by the coincidence outputs SB1, SB2, SB3, the Q output ((20) in FIG. 8) of RS-FF 8 falls and becomes an input of AND gate 32 in a form of pulse P4. On the other hand, coincidence outputs SB1, SB2 are generated before this SB3.

Accordingly, coincidence outputs SB1, SB2, SB3 are generated as output AND-B-OUT ((24) in FIG. 8), only within the width of pulse P4, from AND gate 32 where the pulse P4 and coincidence outputs SB1, SB2, SB3 are used as two inputs, and become a clock input of D-FF 5c through OR gate 33.

If a short pulse AND-B-OUT ((24) in FIG. 8) corresponding to the above-mentioned coincidence outputs SB1, SB2, SB3 are added to D-FF 5c as a clock input since D-FF 5c is preset by SET-AB every time, the Q output of D-FF 5c is changed at that time, and appears at the output terminal OUT as pulses y3, y4. As a matter of course, these pulses y3, y4 are a digital signal which rise in synchronization with the front edge of the external input clock, that is, the input clock signal EXT-CK of one cycle T and has a frequency of two times the signal EXT-CK. The output wave form is that of a pulse which is fallen at the position of just the half (duty 50%) of length of one cycle, that is, the position of ¼T of cycle of the original input wave form.

Thus it is possible to obtain, from the Q output of D-FF 5e, output clocks x 1, x2, x3, x4, y1, y2, y3, y4, . . . , the output wave form duty of which is 50%, which are digital signals, having a frequency of two times the signal EXT-CK, synchronized with the input clock CK. The actions and effects of the above-mentioned frequency multiplying and duty correction can be obtained even in a case where the duty of the input clock CK fluctuates in the vicinity of 50% or more. Therefore, this is very effective as a frequency multiplying circuit accompanying shaping of digital wave forms, and it is possible to extend the operatable area of semiconductor active elements to a very high frequency.

[External synchronizing method and external synchronizing circuit]

Figure 9:
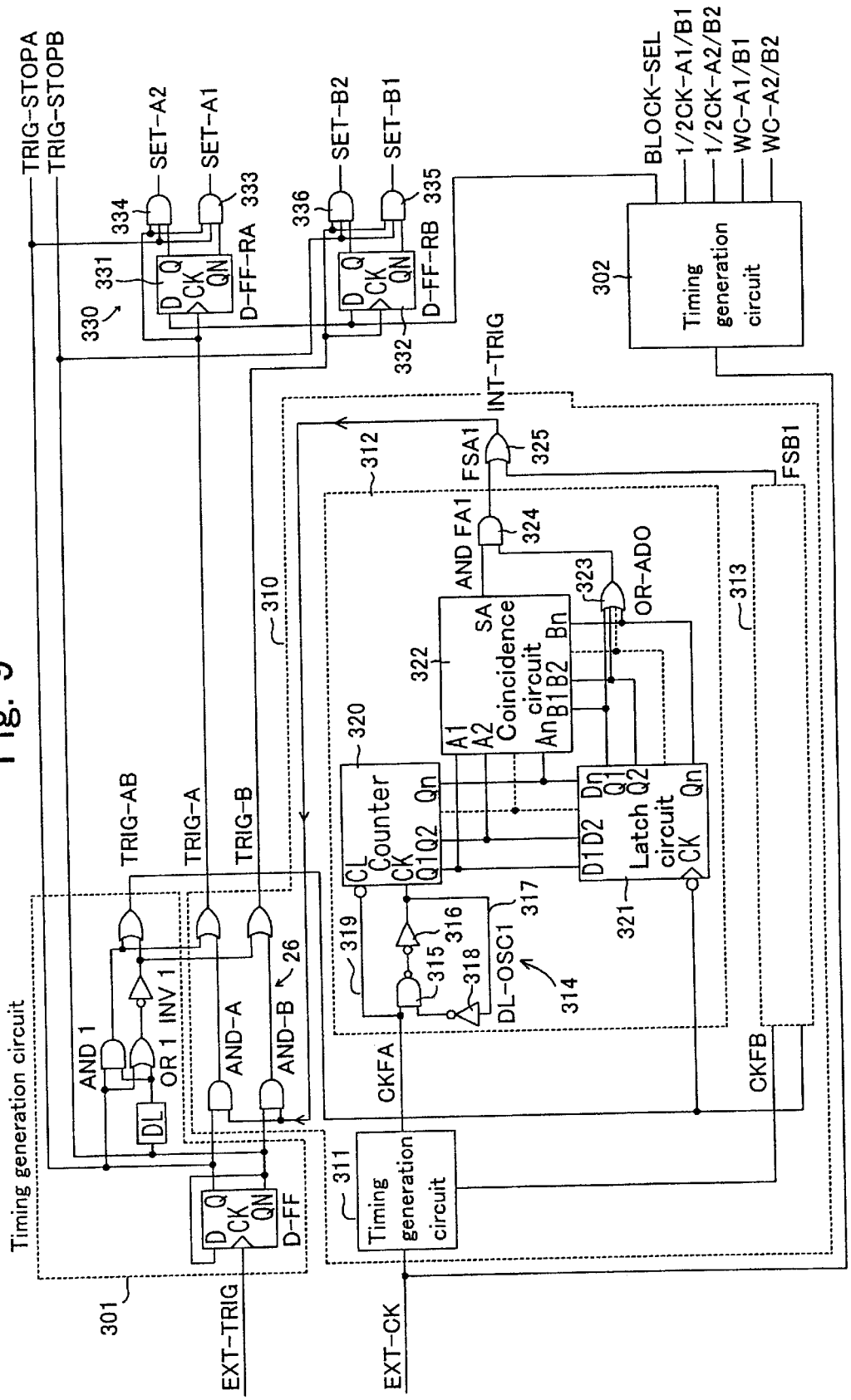
FIG. 9 is a view showing the left half part of a circuit of the first preferred embodiment of an external synchronizing circuit according to the invention.
Figure 10:
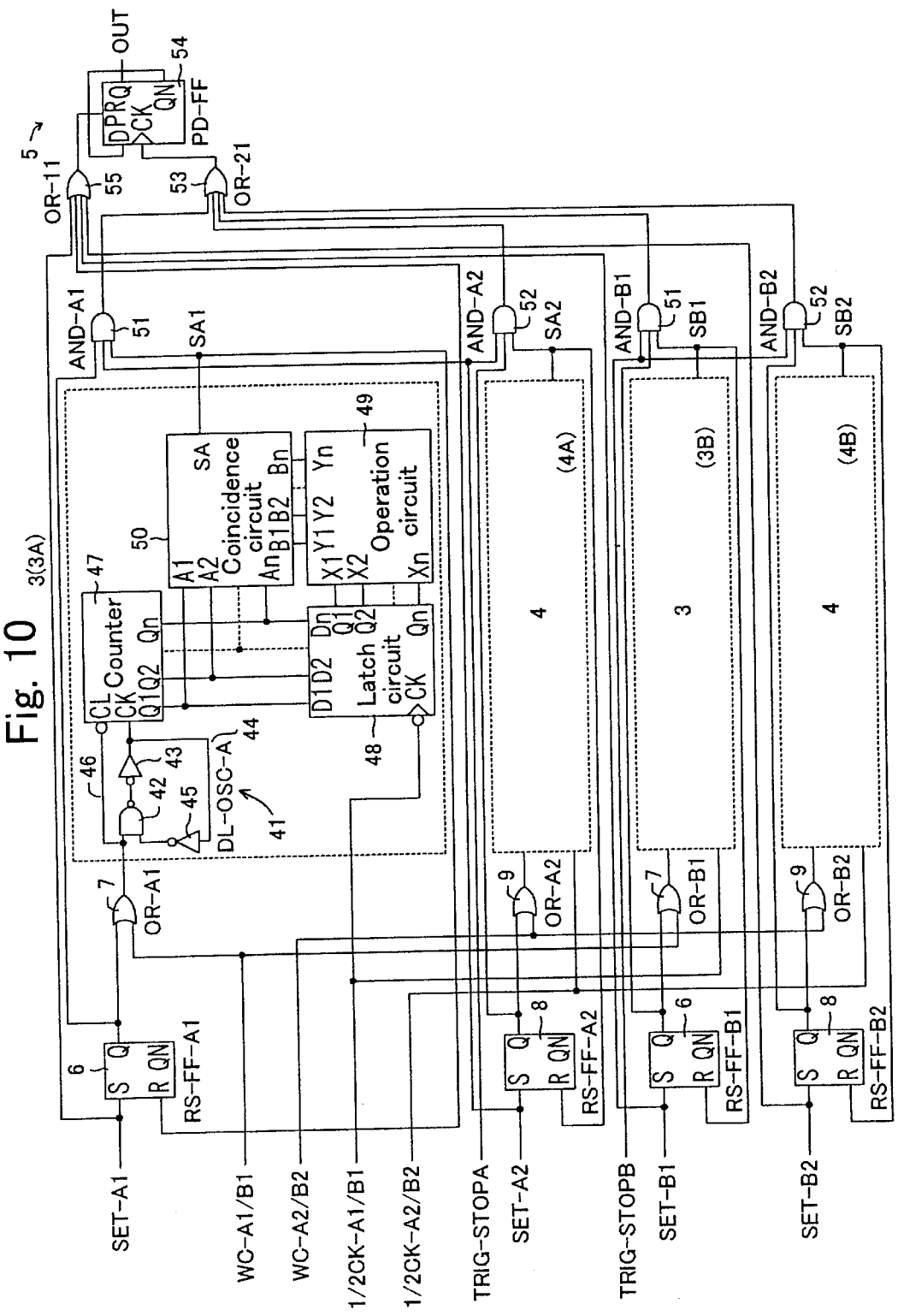
FIG. 10 is a view showing the right half part of a circuit or the first preferred embodiment of an external synchronizing circuit according to the invention.

FIG. 9 and FIG. 10 show the left and right sides of the external synchronizing circuit, respectively. This external synchronizing circuit comprises of timing generation circuits 301, 302, an internal trigger forming circuit 310 which measures the phase position of the external trigger signal EXT-TRIG ((1) in FIG. 4) during one cycle T of the input clock signal EXT-CK upon receiving timing signals from the timing generation circuit 301, produces a reference internal trigger signal INT-TRIG at the phase position corresponding to the phase position of the external trigger signal wherein subsequent EXT-TRIG arrive in subsequent cycles T of the input clock signal, and alternately shares the reference internal trigger signal INT-TRIG to an "A" period and adjacent a "B" period, which are sectioned by every arrival of the external trigger signal EXT-TRIG to be outputted as internal trigger signals TRIG-A, TRIG-B, and two pairs of duty determination circuits 3,4 (affixes A and B are attached to distinguish) which determine the timing position for a state transition of an output clock signal corresponding to a 50% duty cycle, upon receiving the timing signals prepared by the timing generation circuit 302.

(1) Timing generation circuit 301

Figure 11:
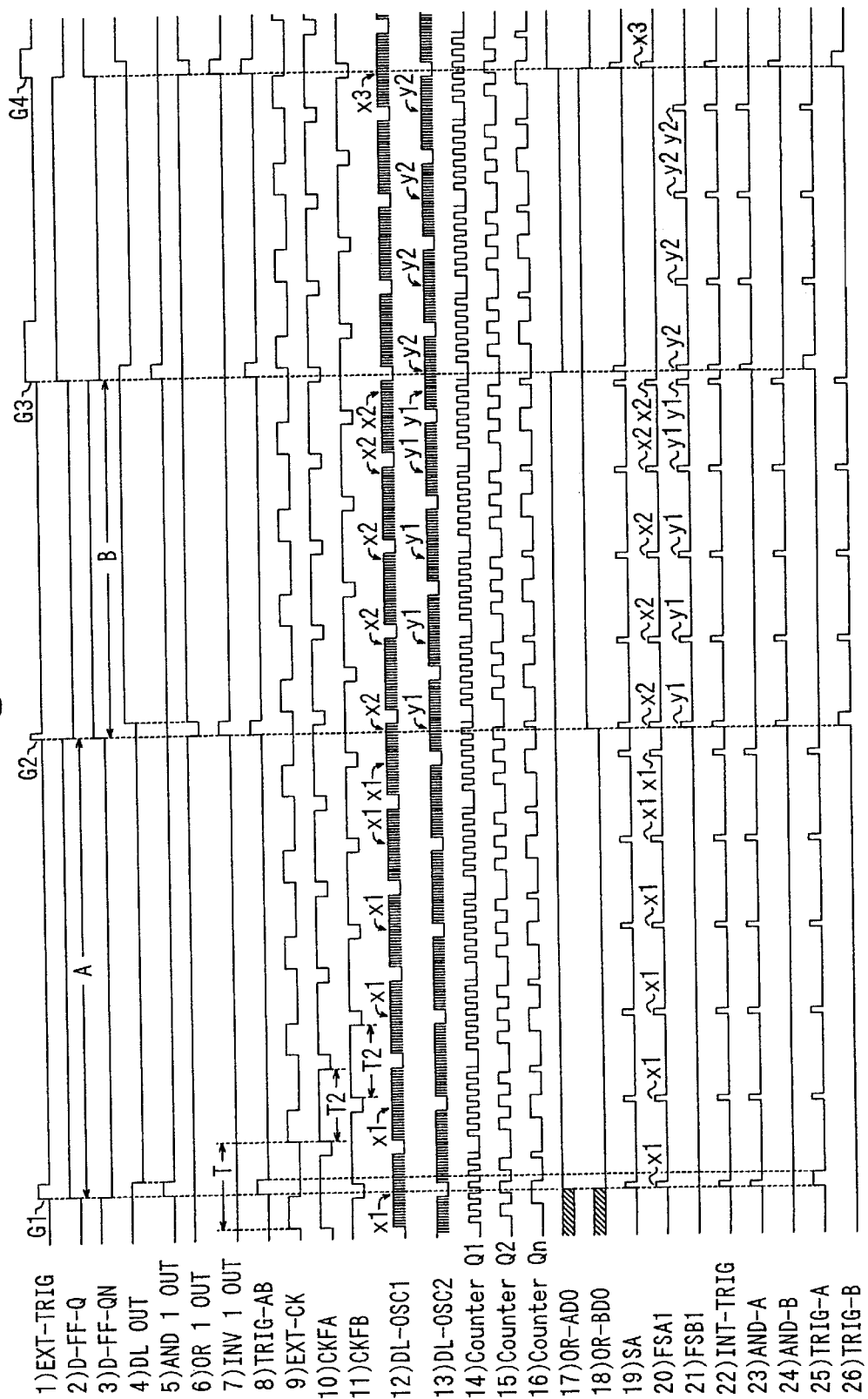
FIG. 11 is a timing chart showing operations of major parts of the circuit illustrated in FIG. 9 and FIG. 10.

The first timing generation circuit 301 generates and outputs a reference external trigger signal TRIG-A-B ((8) in FIG. 11) which is obtained by converting the external trigger signal EXT-TRIG to a fixed pulse width, and external trigger sectioning signals TRIG-STOPA, TRIG-STOPB (D-FF-Q of (2) in FIG. 11, and D-FF-QN of (3) in FIG. 11) in order to distinguish one period ("A" period) from adjacent period ("B" period) which are sectioned by the arrival of the external trigger signal EXT-TRIG.

(2) Internal trigger signal forming circuit 310

The internal trigger signal forming circuit 310 is a circuit which forms internal trigger signals TRIG-A, TRIG-B ((25), (26) in FIG. 11) of two systems A, B which are replaced whenever the external trigger signal EXT-TRIG is inputted, and comprises of a second timing signal generation circuit 311, first and second phase position giving circuits 312, 313, an OR gate (FSA 1) 325 for forming a reference internal trigger signal INT-TRIG by carrying out an OR process of the output of both the phase position giving circuits 312, 313, and a logic gate portion (AND-A, AND-B) 326 for outputting the reference internal trigger signal INT-TRIG as internal trigger signals TRIG-A, TRIG-B by sharing the reference internal trigger signal INT-TRIG to the above-mentioned "A" period and adjacent "B" period whenever the external trigger signal EXT-TRIG arrives.

(a) Timing generation circuit 311

The timing generation circuit 311 produces timing signals CKFA, CKFB (phase position measurement period signal) ((10), (11) in FIG. 11) to execute a phase position measurement period at the front edge of the input clock signal EXT-CK in one cycle T of the input clock signal, wherein the phase position of EXT-TRIG is found by counting the number of oscillation cycles of an oscillator from the front edge of the input clock signal to the external trigger signal.

Each of the phase position measurement period signals CKFA, CKFB is a signal (pulse width T2 in FIG. 11) which rises in synchronization with the input clock signal EXT-CK and falls within one cycle T of the input clock signal EXT-CK. This is used to measure the position even though an external trigger signal EXT-TRIG arrives at any position during one cycle T of the input clock signal EXT-CK. In the preferred embodiment, a signal of as wide a duty as possible (more than duty 50%) is used for CKFA, CKFB so as to cover the entire period in one cycle T with the fewest systems, two systems of CKFA, CKFB, and the phases of which are shifted 180 degrees from each other. Therefore, due to the duty being more than 50%, they will overlap and there will be some place in the period at which both signals CKFA, CKFB are in H level even though the external trigger signal EXT-TRIG arrives at any position in one cycle T of the input clock signal EXT-CK, and since their phases are shifted 180 degrees from each other, a highly accurate measurement can be obtained.

Figure 19:
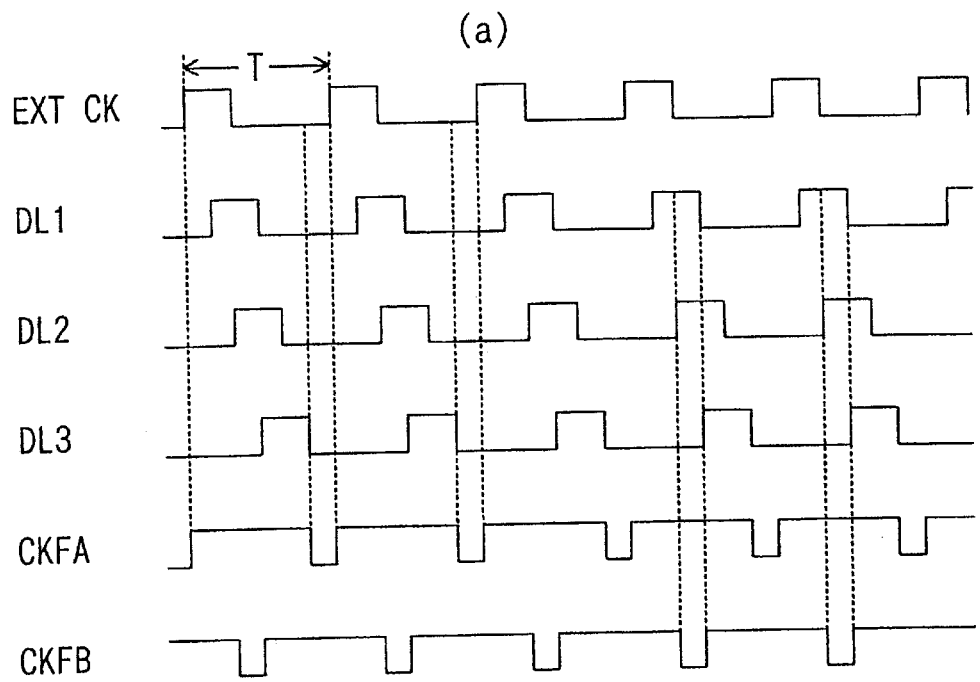
FIG. 19 iq a exemplary view showing CKFA and CKFB which are produced by timing generation circuit 301 illustrated in FIG. 9, wherein (a) shows a case where they are made coincident with one cycle of the input clock, and (b) shows a case where they are made coincident with two cycles of the input clock.
Figure 19:
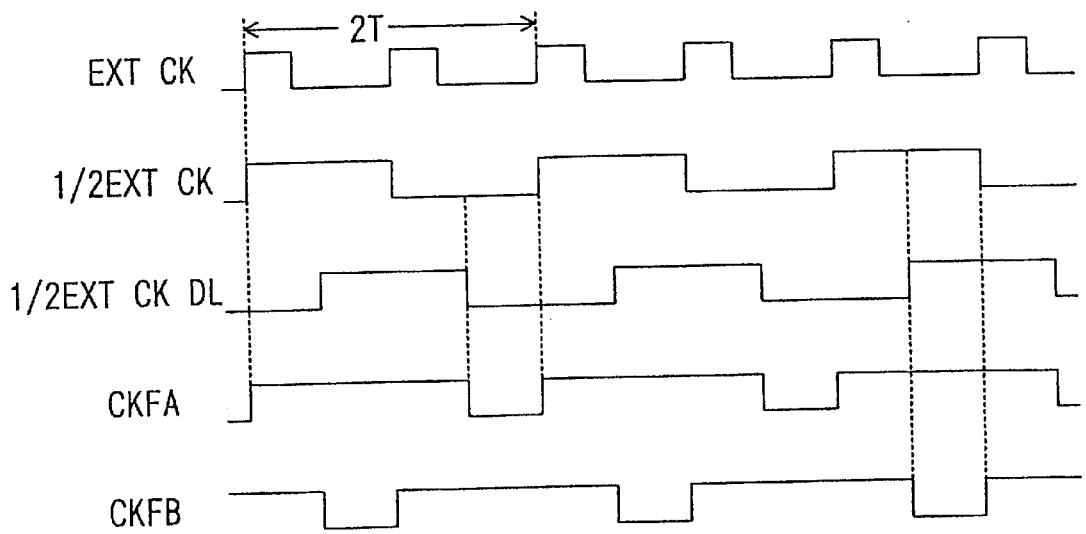

Concretely, the above-mentioned phase position measurement period signals CKFA, CKFB are, as shown in FIG. 19 (a), constructed so that the phase position of the input clock signal EXT-CK is shifted gradually to make DL1, DL2, DL3, and CKFA is generated by OR operation of those signals and CKFB by AND operation of them. As shown in FIG. 19(b), by slightly causing the phase position of the input clock signal EXT-CK to shift by frequency-dividing the signal, it is possible to obtain phase position measurement period signals CKFA, CKFB, the base unit of which is a frequency of two or more times.

(b) First and second phase position giving circuits 312, 313

Figure 12:
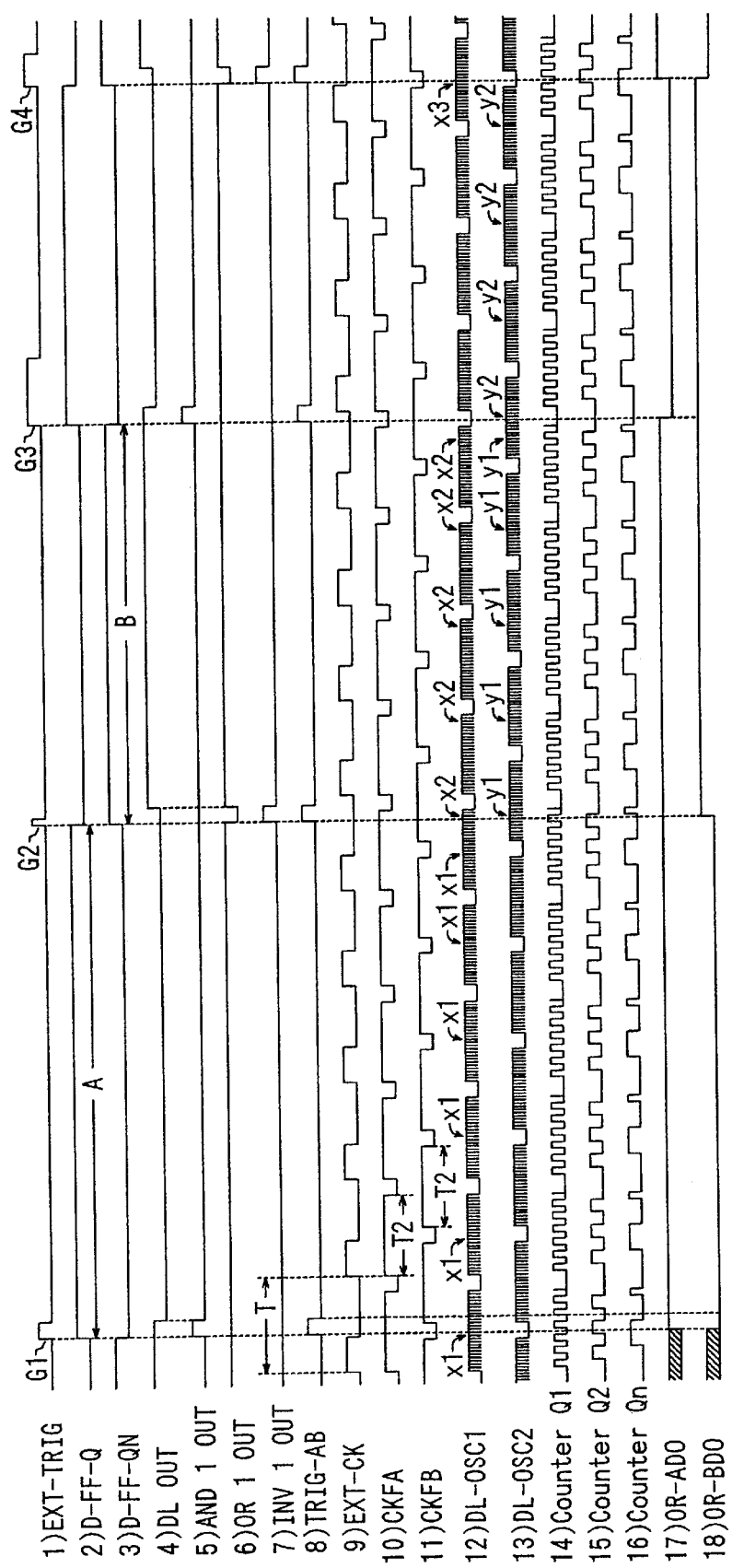
FIG. 12 is an enlarged view showing the upper half part of the timing chart of FIG. 11.

The first and second phase position giving circuits 312, 313 are constructed to be identical to each other, and each of them comprises of a delay line oscillator 314, a counter 320 for counting the number of cycles of the oscillation, a latch circuit 321 for latching the content of the counter 320 at the timing positions ("G1", "G2", "G3", "G4" points in FIG. 12) corresponding to EXT-TRIG wherein the reference external trigger signal TRIG-AB is inputted to the phase giving circuits, a coincidence circuit 322 for generating an output when the output value of the counter 320 becomes coincident with the latched value (x1, x2, . . . y1, y2, . . . ), an OR gate (OR-ADO) 323 for outputting a coincidence stop signal by utilizing the output of the corresponding latch circuit 321 in a case where the phase position latched by the above-mentioned latch circuit 321 is inadequate, that is, when the result of latching is all [0], and an AND gate 324 in which the output of the corresponding OR gate 323 and output of the coincidence circuit 322 are used as two inputs.

Accordingly, a phase position measurement period signal CKFA coming from the timing generation circuit 311 is inputted into the delay line oscillator 314 of the first phase position giving circuit 312, and a phase position measurement period signal CKFB coming from the timing generation circuit 311 is inputted into the delay line oscillator 314 of the second phase position giving circuit 313.

(i) Delay line oscillator 314

The delay line oscillator 314 comprises of an NAND gate 315 in which one input terminal is used as an input terminal of the oscillator 314, an odd tier C-MOS inverter 316 connected to the output terminal of the corresponding NAND gate 315 as a delay element, and a simple reversing inverter 318 is inserted into a feedback loop 317 from the output terminal of the corresponding inverter 316 to the other input terminal of the above-mentioned NAND gate 315. ECL inverter, IIL inverter, etc. may be used as an inverter 316 of a delay element in addition to the C-MOS inverter.

The delay line oscillator 314 starts oscillation for measurement, upon receiving a phase position measurement period signals CKFA, CKFB ((10), (11) in FIG. 4) coming from the above-mentioned timing generation circuit 311, when they rise, and stops oscillation when they fall. That is, the NAND gate 315 is such that the one input terminal is in logic level L, the output thereof is H, the output of the inverter 316 is L, the output (the other input terminal of NAND gate 315) of the inverter 318 is H, wherein the oscillation stops. However, if the other input terminal of NAND gate 315 is changed to logic level H, the status is changed so that the output of the NAND gate 315 is L, the output of the inverter 316 is H, the output of inverter 318 is L, the other input of the NAND gate 315 is H, and the output of NAND gate 315 is H, whereby the oscillation is commenced. The oscillation is stops when the phase position measurement period signal CKFA, CKFB fall.

(ii) Counter 320

The clock input terminal CK of the counter 320 is connected to the output terminal of the above-mentioned delay line oscillator 314 and the counter 320 counts a change of the output DL-OSCI, DL-OSC2 of the above-mentioned delay line oscillator 314, that is, output changes generated once per cycle of oscillation. Furthermore, the input signal as in the above-mentioned delay line oscillator 314, that is, phase position index signals CKFA, CKFB are inputted to the clear terminal CL of the counter 320.

Therefore, similar to the oscillation and stop operation of the delay line oscillator 314, the counter 320 begins counting when the above-mentioned timing signal CKFA, CKFB rise and stops counting when the timing signal CKFA, CYFB fall.

(iii) Latch circuit 321

Latch circuit 321 uses the figure output of the above-mentioned counter 320 as input and reference external trigger signal TRIG-AB formed by the above-mentioned timing generation circuit 301 is inputted into the clock input terminal CK of the circuit 321. Therefore, this latch circuit 321 latches the count value (the number of cycles of oscillation) x or y (x1,x2, . . . , y1,y2, . . . in FIG. 12) of the counter 320 when the reference external trigger signal TRIG-AB rises, that is, when the external trigger signal arrives ("G1", "G2", "G3", "G4" points in FIG. 12).

Therefore, the latch circuit 321 latches a count value (phase position x or y where the external trigger signal arrives) of the number of cycles of oscillation which is obtained by counting the length from a rise of the input clock signal EXT-CK to the arrival of the external trigger signal TRIG-AB.

(iv) Coincidence circuit

Coincidence circuit 322 uses the parallel output of the latch circuit 321 as input and use the output SA of the above-mentioned counter 320 as the other input. Accordingly, the coincidence circuit 322 outputs a coincidence output SA when the count value of the above-mentioned counter 320 is increased to the output value (phase position x or y where the external trigger signal arrives) of the above-mentioned latch circuit 321.

Figure 13:
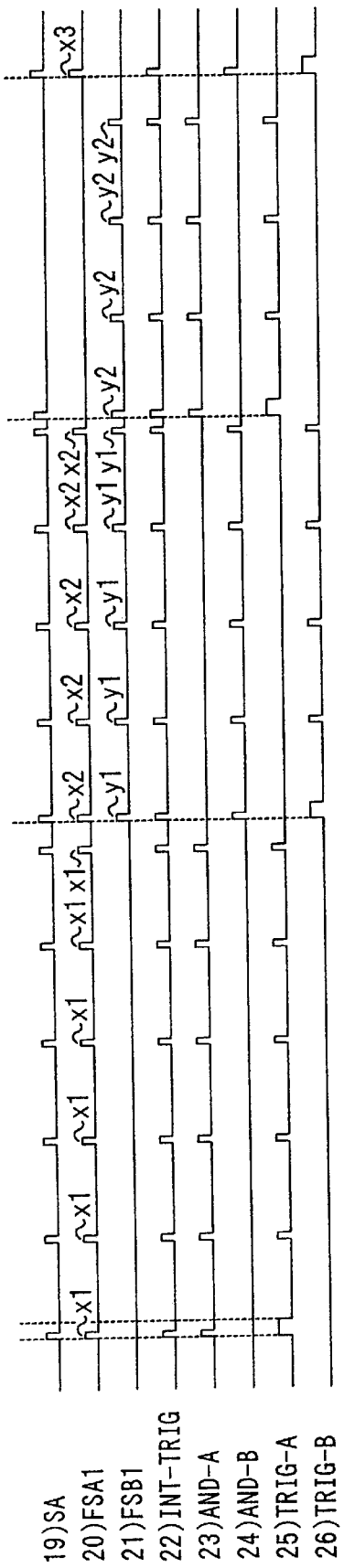
FIG. 13 is an enlarged view showing the lower half part of the timing chart of FIG. 11.

While the output ((17) in FIG. 11) of OR gate 323 is H, the coincidence output SA is taken out from AND gate 324, becomes a signal FSAL (pulses x1,x2,x3, . . . of (20) in FIG. 13) or FSB1 (pulses y1,y2,y3, . . . of (21) in FIG. 13), is synthesized as a reference internal trigger signal INT-TRIG through OR gate 325 and is sent to the logic gate portion 326. And this reference internal trigger signal INT-TRIG is shared to the "TA" period and "B" period and taken out as internal trigger signals TRIG-A, TRIG-B by passing through the logic gate portion 326 ((25), (26) in FIG. 11).

It is noted that, the output of OR gate 323 being H means that CKFA was H when it was latched by the latch circuit 321, that is, that the conditions for measuring the phase position of EXT-TRIG were all satisfied. In only this case, the output of OR gate 323 becomes H.

Thus, a plurality of internal trigger signals TRIG-A, TRIG-B ((25), (26) in FIG. 11) which are generated in synchronization with the external trigger Signal EXT-TRIG are obtained in the "A" period and "B" period shown by the external trigger period signals D-FF-Q, D-FF-QN.

(3) Timing generation circuit 302

Figure 14:
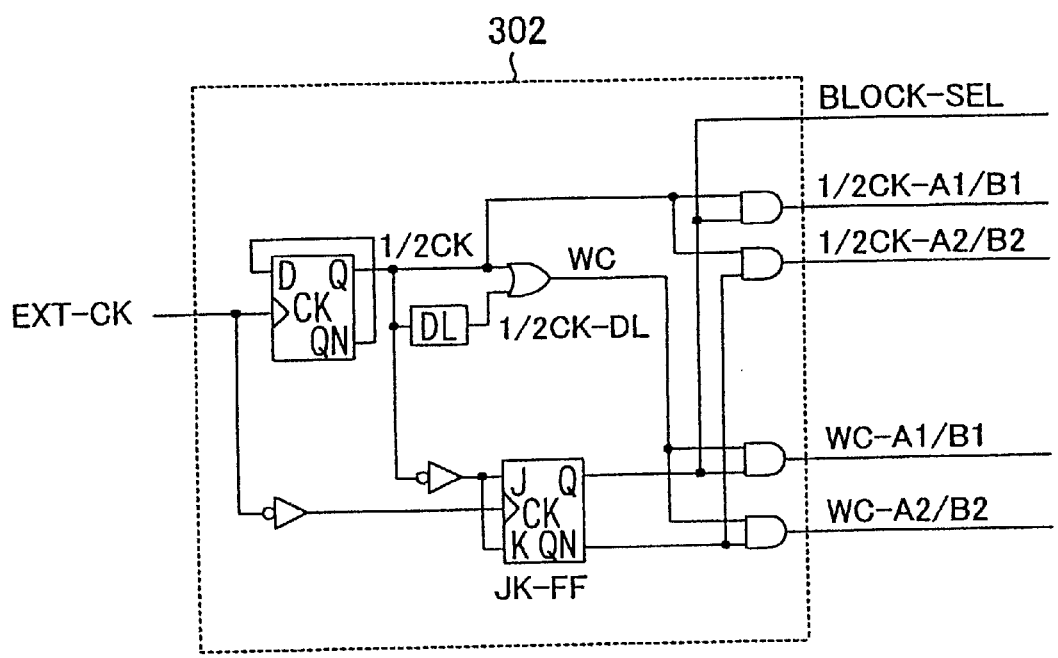
FIG. 14 is a circuitry diagram showing a detailed example of timing generation circuit 302 illustrated in FIG. 9.

FIG. 14 shows a circuit configuration of the timing generation circuit 302. The third timing generation circuit 302 produces timing signals ½CK-A1/B1, ½CK-A2/B2, WC-A1/B1, WCA2/B2 which are common to the "A" system and "B" system and gives them to the duty determination circuits 3A, 4A, 3B, 4B. Furthermore, since each of the "A" system and "B" system consists of two duty determination circuits 3,4, a timing signal BLOCK-SEL is produced in order to alternatively select one of the two duty determination circuits 3,4 constituting each of the "A" system and "B" system, and is given to D-FF 331, 332 positioned before each of the duty determination circuits 3A, 4A, 3B, 4B as the data input thereof. It is noted that, FF stands for a flip flop.

Figure 15:
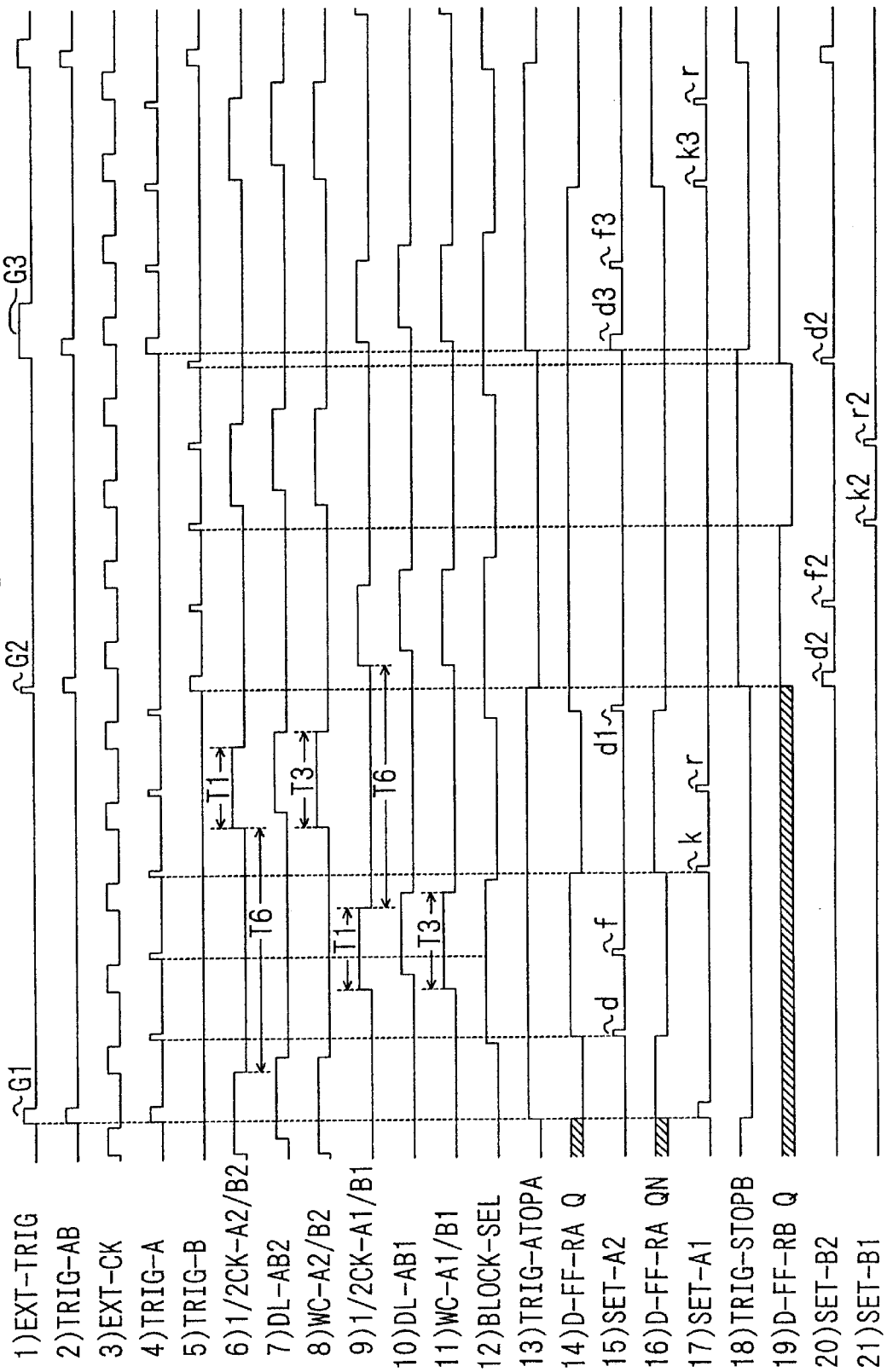
FIG. 15 is a timing chart showing operations of part of timing generation circuit 302 illustrated in FIG. 9 and a mode change signal generation circuit.
Figure 16:
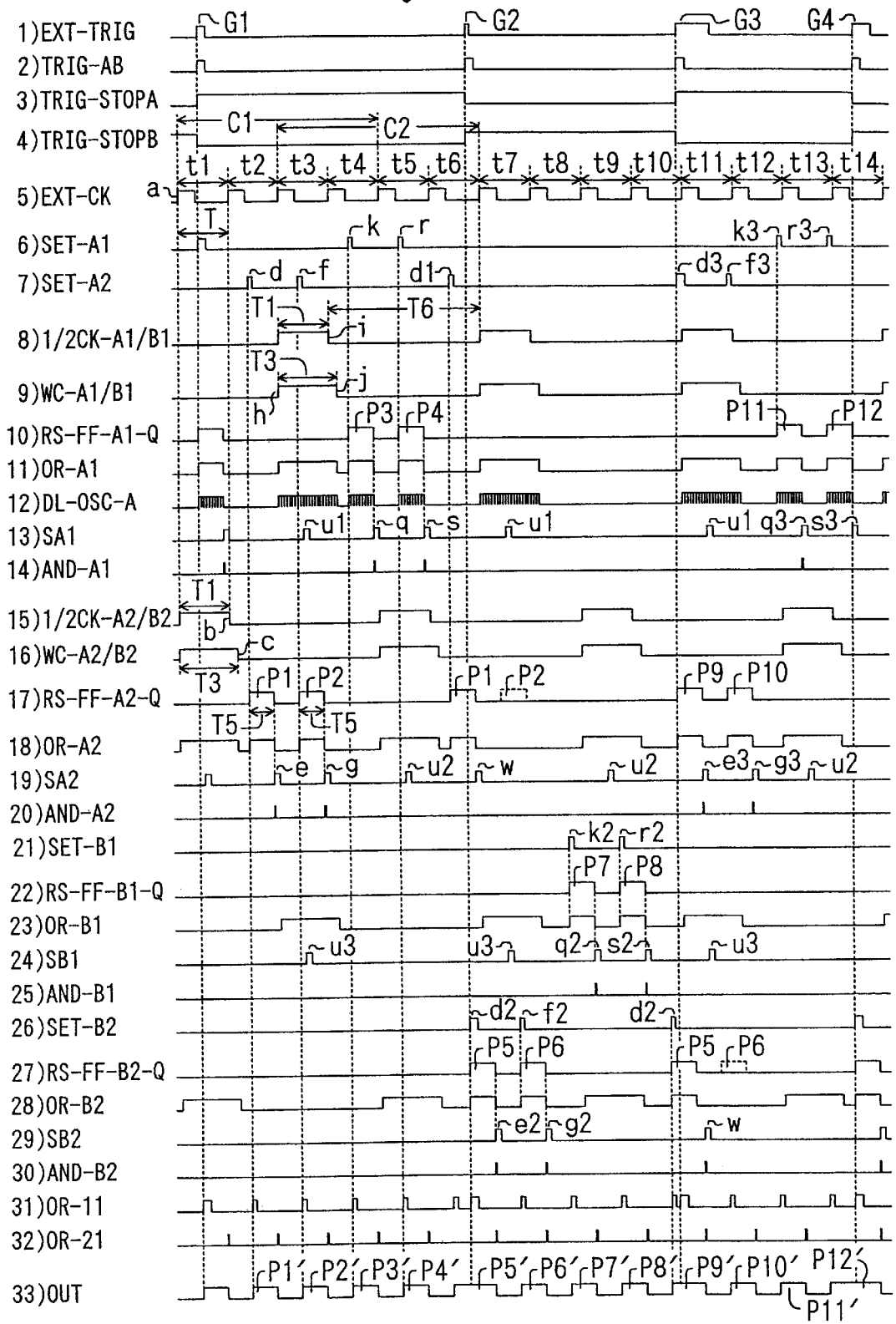
FIG. 16 is a timing chart showing operations of part of a duty determination circuit of FIG. 18 and a width forming circuit.

½CK-A1/B1 ((9) in FIG. 15) and ½CK-A2/B2 ((6) in FIG. 15) are timing signals for establishing a period T1 (target measurement period) to be measured as length T of one cycle of the input clock signal EXT-CK. Concretely, it is a signal which is obtained by frequency-dividing the input clock signal EXT-CK to one half.

WC-A1/B1 ((11) in FIG. 15) and WC-A2/B2 ((8) in FIG. 15) are timing signals for establishing a period T3 (actual measurement period) for sustaining a measurement operation over the target measurement period T1. The WC-A1/B1 and WC-A2/B2 are signals, the fall of which is slightly delayed from the above-mentioned ½CK, that is, signals, having a slightly longer pulse width than one cycle T of the input clock signal EXT-CK, which rise simultaneously with the input clock signal EXT-CK.

This WC can be obtained by producing signals DL-AB1 ((10) in FIG. 15) and DL-A-B2 ((7) in FIG. 15) by causing ½CK to be slightly delayed in the width of ½ cycle thereof, and taking a logic sum of the signals DL-AB1 and DL-AB2 and ½CK-A1/B1, ½CK-A2/B2.

BLOCK-SEL ((12) in FIG. 15) is a signal of the Q output of JK-FF in the timing generation circuit 302, that is, a signal which is reversed by a fall of the input clock signal EXT-CK with respect to every two cycles, and is used as an actuating circuit change signal to change over the duty determination circuits 3,4. The actuating circuit change signal BLOCK-SEL indicates that, when the Q output is H, the duty determination circuit 3 side (A1/B1 side) is in the measurement period (while the duty determination circuit 4 side (A2/B2 side) is in the oscillation reference period), and, when the Q output is L, the duty determination circuit 4 side (A2/B2 side) is in the measurement period (while the duty determination circuit 3 side (A1/B1 side) is in the oscillation reference period).

(4) Mode change signal forming circuit 330

The actuating circuit change signal BLOCK-SEL of the above-mentioned timing generation circuit 302 is inputted into the data input terminal D of D-FF 331, 332 (D-FF-RA, D-FF-RB) which constitutes a mode change signal generation circuit 330, and internal trigger signals TRIG-A, TRIG-B are inputted into the clock input terminal CK of the corresponding D-FF 331, 332.

AND gate 334 is connected to the Q output terminal of D-FF 331 while AND gate 333 is connected to the QN output terminal thereof. Internal trigger signal TRIG-A and external trigger period signal TRIG-STOPA are respectively inputted into both AND gates 333 and 334.

Similarly, AND gate 336 is connected to the Q output terminal of D-FF 332 while AND gate 335 is connected to the QN output terminal of D-FF 332, wherein internal trigger signal TRIG-B and external trigger period signal TRIG-STOPB are respectively inputted into both AND gates 335 and 336.

SET-A1, SET-A2 ((17), (15) in FIG. 15) taken out from the above-mentioned AND gates 333, 334, and SET-B 1, SET-B2 ((21), (20) in FIG. 15) are taken out from the AND gates 335, 336.

SET-A1 ((17) in FIG. 15) is a timing signal consisting of a short pulse generated at the front edge of the internal trigger signal TRIG-A when the Q of JK-FF in the timing generation circuit 302 is L, that is, when the actuating circuit change signal BLOCK-SEL ((12) in FIG. 15) is L (in a case where the A1/B1 side is the oscillation reference period T6), and becomes a set input of RS-FF 6 of the A1 side (duty determination circuit 3A side).

Set-A2 ((15) in FIG. 15) is a timing signal consisting of a short pulse generated at the front edge of the internal trigger signal TRIG-A when the actuating circuit change signal BLOCK-SEL ((12) in FIG. 15) coming from the timing generation circuit 302 is H (in a case where A2/B2 side is the oscillation reference period T6) and becomes a set input RS-FF 8 at the A2 side (duty determination circuit 4A side).

Set-B1 ((21) in FIG. 15) is a timing signal consisting of a short pulse generated at the front edge of the internal trigger signal TRIG-B when the actuating circuit change signal BLOCK-SEL ((12) in FIG. 15) coming from the timing generation circuit 302 is L (in a case where A1/B1 side is the oscillation reference period T6) and becomes a set input RS-FF 8 at the B1 side (duty determination circuit 3B side).

Set-B2 ((20) in FIG. 15) is a timing signal consisting of a short pulse generated at the front edge of the internal trigger signal TRIG-A when the actuating circuit change signal BLOCK-SEL ((12) in FIG. 15) coming from the timing generation circuit 302 is H (in a case where A2/B2 side is the oscillation reference period T6) and becomes a set input RS-FF 8 at the B2 side (duty determination circuit 4B side).

(5) Duty determination circuit 3,4

As shown in FIG. 10, the duty determination circuits 3,4 are made a pair. Two pairs of duty determination circuit 3A, 4A, and 3B, 4B in which two systems A and B are provided, respectively, consist of a delay line oscillator 41, a counter 47 for counting the number of cycles of the oscillation, a latch circuit 48 for latching the content of the counter 47, a operation circuit 49 for calculating ½ values of the count value, and a coincidence circuit 50 attached to the operation circuit 49.

(a) Delay line oscillator 41

The delay line oscillator 41 is composed of a NAND gate 42 in which one input terminal is used as an input terminal of the oscillator, an odd tier C-MOS inverter 43 connected to the output terminal of the corresponding NAND gate 42 as a delay element, and a simple reversing inverter 45 which is inserted into a feedback loop 44 from the output terminal of the corresponding inverter 43 to the other input terminal of the above-mentioned NAND gate. ECL inverter, IIL inverter, etc. may be used for an inverter 43 as a delay element in addition to the C-MOS inverter.

The delay line oscillator 41 starts oscillation for measurement, upon receiving timing signals WC-A1/B1, WC-A2/B2 (actual measurement period T3) coming from the above-mentioned timing generation circuit 302, when they rise, and stops oscillation when they fall. That is, with respect to the NAND gate 42, one input terminal thereof is in logic level L, the output thereof is H, the output of the inverter 43 is L, and the output (the other input terminal of the NAND gate 42) of the inverter 45 is H, and the oscillation stops. However, when one input terminal of the NAND gate 42 is changed to logic level H, the status is changed so that the output of the NAND gate 42 is L, the output of the inverter 43 is H, the output of the inverter 45 is L, the other input of the NAND gate 42 is H, and the output of the NAND gate 42 is H, whereby the oscillation is commenced, and the oscillation is stopped by a fall of WC-A1/B1, WC-A2/B2 (practical measurement period T3).

WC-A1/B1, WC-A2/B2 (actual measurement period T3) rise in synchronization with the rise of the above-mentioned timing signals ½CK-A1/B1, ½CK-A2/B2 (target measurement period T1) while a fall thereof is slightly delayed from a fall of the timing signal ½CK-A1/B1, ½CKA2/B2. In summary, the delay line oscillator 41 begins oscillating at a rise of the timing signals ½CK-A1/B1, ½CK-A2/B2 (that is, commencement of the target measurement period T1) which is obtained by frequency-dividing the above-mentioned input clock signal EXT-CK into one half, and stops oscillating after the fall of timing signals ½CK-A1/B1, ½CK-A2/B2 (that is, after the termination of the target measurement period Ti).

(b) Counter 47

The counter 47 counts a change of the output DL-OSC-A of the above-mentioned delay line oscillator 41, that is, an output change generated once per cycle of oscillation since the clock input terminal CK is connected to the output terminal of the above-mentioned delay line oscillator 41.

Furthermore, the input signals which are identical to those of the above-mentioned delay line oscillator 41, that is, timing signals WC-A1/B1, WC-A2/B2 (actual measurement period T3) are inputted into the clear terminal CL of the counter 47 through a line 46. Therefore, similar to the oscillation and stop operations of the delay line oscillator 41, the counter 47 starts counting when the above-mentioned timing signals ½CK-A1/B1, ½CK-A2/B2 (target measurement period T1) rise and stops counting after timing signals ½CK-A1/B1, ½CK-A2/B2 (target measurement period T1) fall.

Therefore, the counting of the number of cycles of oscillation is sustained during the term of one cycle of timing signals ½CK-A1/B1, ½CK-A2/B2 (Target measurement period T1).

(c) Latch circuit 48

The latch circuit 48 uses figure outputs of the above counter 47 as input, wherein the timing signals ½CK-A1/B1, ½CK-A2/B2 (target measurement period T1) generated in the above-mentioned timing generation circuit 302 are inputted into the clock input terminal CK of the counter 47.

Therefore, this latch circuit 48 latches the count value (the number of cycles of oscillation) of the counter 47 when the timing signals ½CK-A1/B1, ½CK-A2/B2 (target measurement period T1) fall, that is, when the target measurement period T1 ends. Therefore, a count value of the number of cycles of oscillation corresponding to a length (one cycle T of the input clock signal EXT-CK) of one cycle period of the timing signals ½CK-A1/B1, ½CK-A2/B2 (target measurement period T1) is latched by the latch circuit 48.

(d) Operation circuit 49

The operation circuit 49 receives a parallel output of the above-mentioned latch circuit 48 and calculates ½ values of the count value of the number of cycles of oscillation latched by the latch circuit 48, that is, the duty value of 50%. This 50% duty value will be one input of the coincidence circuit 50.

(e) Coincidence circuit 50

The coincidence circuit 50 uses a parallel output (½ values of the result of calculation) as one input and uses the output of the above-mentioned counter 47 as the other input. Accordingly, the coincidence circuit 50 outputs coincidence outputs SA,SB when the count value of the above-mentioned counter 47 is increased to a value which is coincident with the result of the above-mentioned calculation. Accurately, the duty determination circuit 3A outputs a coincidence output SA1, duty determination circuit 4A outputs a coincidence output SA2, duty determination circuit 3B outputs a coincidence output SB1, and duty determination circuit 4B outputs a coincidence output SB2.

(6) Pre-positioned FF and pre-positioned OR gate

RS-FF 6, 8 are placed before each of "A" and "B" sets of duty determination circuits 3,4, wherein the corresponding RS-FF 6,8 are set every time in synchronization with signals SET-A1, SET-A2, SET-BI, SET-B2 in the oscillation reference period T6 between the above-mentioned target measurement period and a subsequent target measurement period and are reset by the above-mentioned coincidence outputs SA1, SA2, SB1, SB2.

That is, RS-FF 6,6 of the A1 side and B1 side (duty determination circuit 3A and 3B sides) are set every time in synchronization with the above-mentioned signals SET-A1, SET-B1, and are reset by the above-mentioned coincidence outputs SA1, SB1. Furthermore, RS-FF 8,8 of the A2 side B2 side are set every time in synchronization with the above-mentioned signals SET-A2, SET-B2 and are reset in synchronization by the above-mentioned coincidence outputs SA2, SB2.

Furthermore, OR gates 7,9 are pre-positioned in every duty determination circuit 3 or 4 of each pair of A and B, wherein through the corresponding OR gates 7,9, the output of the above-mentioned RS-FF 6,8 and signals WC-A1/B1, WC-A2/B2 indicating the above-mentioned actual measurement period T3 are inputted into the duty determination circuits 3 and 4 attached thereto.

And the width forming circuit 5 is provided with an output flip flop (D-FF) 54 which is reset every time in synchronization with signals SET-A1, SET-A2, SET-B1, SET-B2, and the status of which is changed by coincidence output SA1, SA2, SB1, SB2 obtained by duty determination circuits 3,4 of each of A and B pairs.

(a) Construction of A system

Concretely speaking, RS-FF 6 is pre-positioned in the first duty determination circuit 3A of the A system ("A" side) duty determination circuits 3,4, (3A, 4A), and the Q output of which is inputted into the delay line oscillator 41 of the duty determination circuit 3 through OR gate 7 (OR-A1) and is inputted into one input terminal of AND gate 51. The output of the above-mentioned coincidence circuit 50, that is, the coincidence output of duty 50% is inputted into the reset terminal R of RS-FF 6 placed before circuit 3, and is inputted into the clock input terminal CK of D-FF 54 through the above-mentioned AND gate 51 and OR gate 53. The D-FF 54 and RS-FF 6 constitute a part of the width forming circuit 5 altogether.

The RS-FF 6 (RS-FF-A1-Q; (10) in FIG. 17) is set by a short pulse SET-A1 ((6) in FIG. 17) generated in synchronization with the internal trigger signal TRIG-A when Q of the JK-FF in the timing generation circuit 302 is L, that is, in a case where the "A1" side is in the oscillation reference period, and is reset by the above-mentioned coincidence output SA1 ((13) in FIG. 17) (See(10) in FIG. 17).

Therefore, the coincidence output SA1 passes through AND gate 51 (AND-A1; (14) in FIG. 17) by pulses P3, P4 generated at the output terminal Q of RS-FF 6 (RS-FF-A1-Q; (10) in FIG. 17) at the fourth cycle t4 and the fifth cycle t5 in FIG. 17 and becomes a clock input of D-FF 54 for output through the OR gate 53, whereby pulses P3', P4' which are risen by SET-A1 produced at points "k" and "r" in FIG. 17 and fall by coincidence output SA1 (AND-A1; (14) in FIG. 17) produced at points "q" and "s" appear at the output terminal (OUT) of D-FF 54 for output.

In the second duty determination circuit 4A which is constructed so as to be identical to the first duty determination circuit 3A, RS-FF 8 and OR gate 9 are pre-positioned, wherein the Q output is inputted into the delay line oscillator 41 of the duty determination circuit 4A through OR gate 9 (OR-A2), and is inputted into one input terminal of AND gate 52.

Accordingly, the output of the above-mentioned coincidence circuit 50, that is, the coincidence output of duty 50% of the duty determination circuit 4A is inputted into the reset terminal R of RS-FF 8 pre-positioned therein, and is inputted into the clock input terminal D-FF 54 through the above-mentioned AND gate 52 and OR gate 53. The RS-FF 8 constituted a width forming circuit 5 along with the OR gate and D‾FF 54.

This RS-FF 8 (RS-FF-A2-Q; (17) in FIG. 17) is set by a short pulse SET-A2 ((7) in FIG. 17) generated in synchronization with the internal signal TRIG-A when Q of the JK-FF in the timing generation circuit 302 is H, that is, in a case where the "A2" side is the oscillation reference period, and is reset by the above-mentioned coincidence output SA2 ((19) in FIG. 17) (See (17) in FIG. 17).

Therefore, two coincidence outputs SA2 are generated by the pulses P1, P2 generated at the output terminal Q of RS-FF 8 (RS-A2-Q; (17) in FIG. 17) at the second cycle t2 and third cycle t3 in FIG. 17. Accordingly, the coincidence outputs SA2 pass through AND gate 52 (AND-A2; (20) in FIG. 17) and becomes a clock input of D-FF 54 for output through OR gate 53, whereby pulses P1' and P2' which are risen by SET-A2 generated at points "d", "f" in FIG. 17 and fall by SA2 (accurately the output AND-A2; (20) in FIG. 17) generated at points "e", "g" in FIG. 17 appear at the output terminal (OUT) of D-FF 54 for output.

Figure 17:
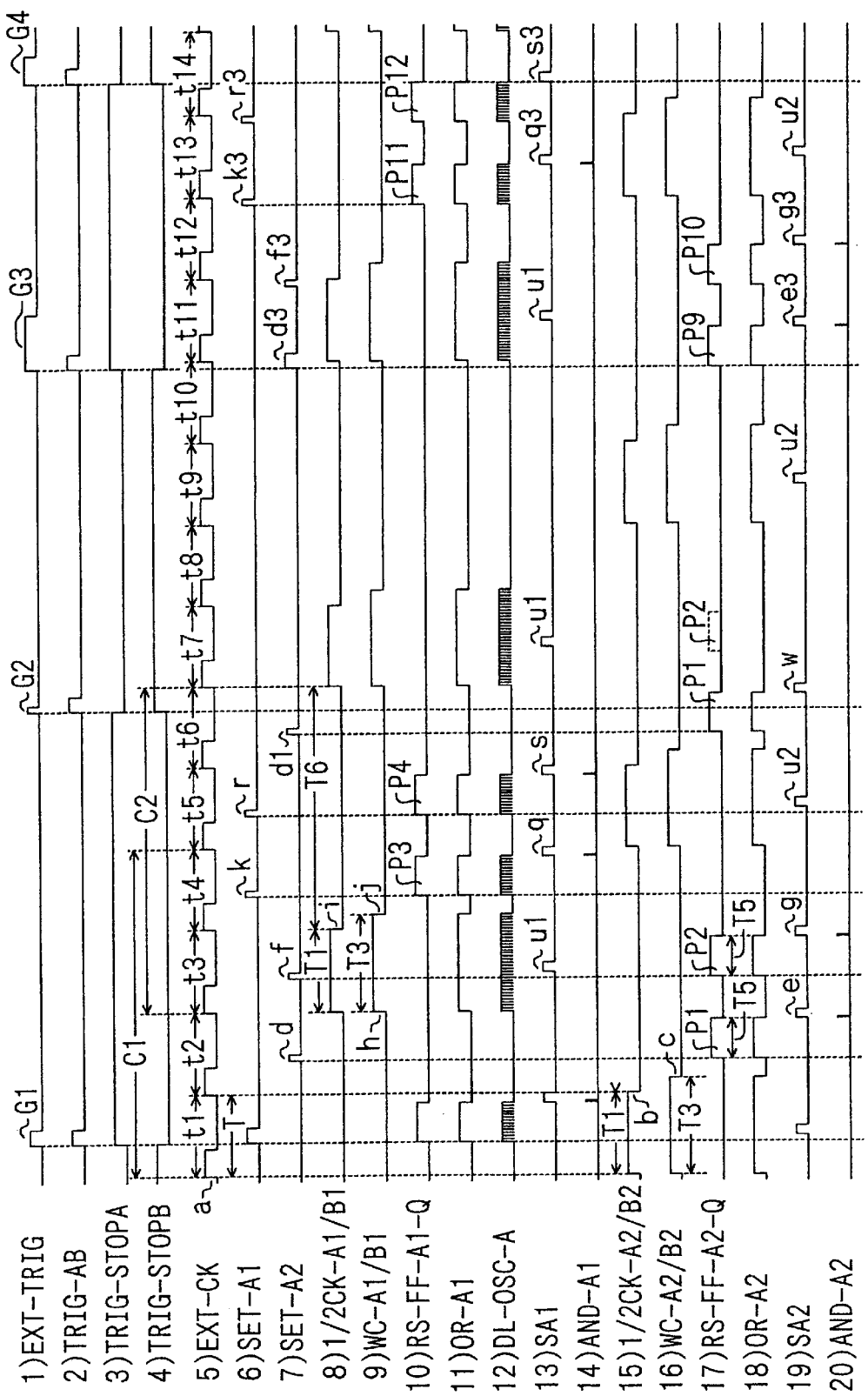
FIG. 17 is an enlarged view of the upper half part of the timing chart illustrated in FIG. 16.

However, in the example shown in FIG. 17, since the second external trigger signal EXT-TRIG (G2 in FIG. 17) arrives at the sixth cycle t6, the second SET-A2 is not generated (See (15) in FIG. 15, and (7) in FIG. 17). Therefore, this second pulse P2 (illustrated with a dashed line) is not generated.

(b) Construction of B system

With respect to the B system ("B" side) duty determination circuits 3,4 (3B,4B), the prepositioned FF and pre-positioned OR gate are constructed to be similar to the above-mentioned construction. That is, RS-FF 6 is pre-positioned in the first duty determination circuit 3B, the Q output of which is inputted into the delay line oscillator 41 of the duty determination circuit 3B through OR gate 7 (OR-B1), and is inputted into one input terminal of AND gate 51.

Accordingly, the output of the above-mentioned coincidence circuit 50, that is, the coincidence output SB1 of duty 50% is inputted into the reset terminal R of RS-FF 6 positioned before the circuit 50, and is inputted into the clock input terminal CK of D-FF 54 through the above-mentioned AND gate 51 and OR gate 53. The D-FF 54 and RS-FF 6 constitute a part of the width forming circuit 5.

This RS-FF 6 (RS-FF-B1-Q; (22) in FIG. 18) is set by a short pulse SET-B1 ((21) in FIG. 18) generated in synchronization with the internal trigger signal TRIG-B when the Q of JK-FF in the timing generation circuit 302 is L, that is, in a case where the "B1" side is in the oscillation reference period and is reset by the above-mentioned coincidence output SB1 ((24) in FIG. 18) (See (22) in FIG. 18).

Figure 18:
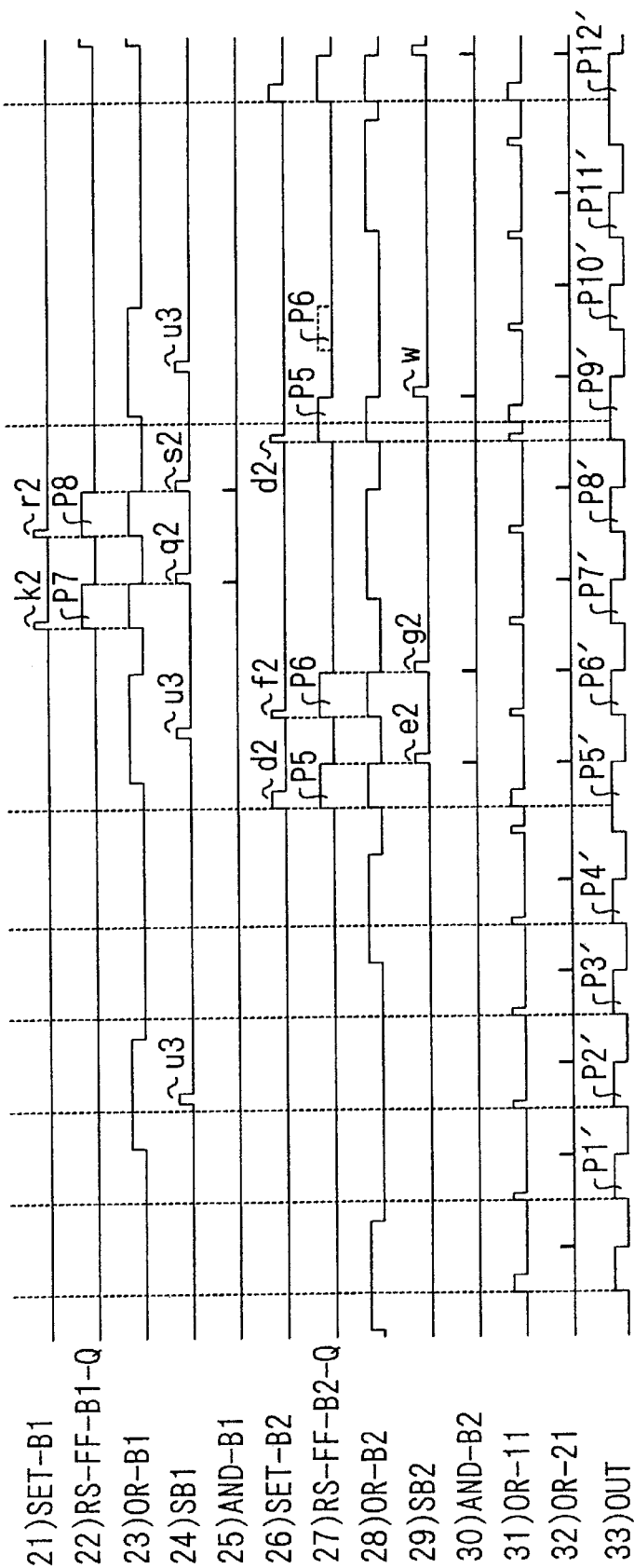
FIG. 18 is an enlarged view of the lower half part of the timing chart illustrated in FIG. 16.

Therefore, the coincidence output SB1 passes through AND gate 51 (AND-B1;(25) in FIG. 18) by pulses P7,P8 generated at the output terminal Q of RS-FF6 (RS-FF-B1-Q; (22) in FIG. 18) at the eighth cycle t8 and ninth cycle t9 in FIG. 18 and becomes a clock input of D-FF 54 for output through OR gate 53.

Therefore, pulses P7',P8' which are risen by SET-B1 generated at points "k2", "r2" in FIG. 18 and fall by a coincidence output SB1 (accurately, AND-B1; (25) in FIG. 18) generated at points "q2", "s2" appear at the output terminal (OUT) of D-FF 54 for output.

RS-FF 8 and OR gate 9 are pre-positioned in the second duty determination circuit 4B, in the same way as in the first duty determination circuit 3B of such construction. The Q output of OR gate 9 is inputted into the delay line oscillator 41 of the duty determination circuit 4B through OR gate 9 (OR-B2), and is inputted into one input terminal of the AND gate 52.

Accordingly, the output of the above-mentioned coincidence circuit 50, that is, the coincidence output of duty 50% of the duty determination circuit 4B is inputted into the reset terminal R of RS-FF 8 pre-positioned before the circuit 4B, and is inputted into the clock input terminal CK of D-FF 54 through the above-mentioned AND gate 52 and OR gate 53. The RS-FF 8 constitutes the width forming circuit 5 along with the OR gate 53 and D-FF 54.

This RS-FF 8 (RS-FF-B2-Q; (27) in FIG. 18) is set by a short pulse SET-B2 ((26) in FIG. 18) generated in synchronization with the internal trigger signal TRIG-B when the Q of JK-FF in the timing generation circuit 302 is H, that is, in a case where the "B2" side is in the oscillation reference period and is reset by the above-mentioned coincidence output SB2 ((29) in FIG. 18) (See (27) in FIG. 18).

Therefore, two coincidence outputs SB-2 (accurately, AND-B2; (30) in FIG. 18) are generated by pulses P5, P6 generated at the output terminal Q of RS-FF 8 (RS-FF-B2-Q; (27) in FIG. 18) at the sixth cycle t6 and seventh cycle t7 in FIG. 18.

Accordingly, this coincidence output SA2 passes through AND gate 52 (AND-B2; (20) in FIG. 17) and becomes a clock input of D-FF 54 for output through OR gate 53, whereby pulses P5', P6' which are risen by SET-B2 generated at points "d2", "f2" in FIG. 18 and fall by the coincidence output SB2 (accurately, output AND-B2; (30) in FIG. 18) generated at points "e2", "g2" in FIG. 18 appear at the output terminal (OUT) of D-FF 54 for output.

However, pulse P5' which is continued from the preceding pulse P1' is accordingly made longer in FIG. 18.

(7) Width forming circuit 5

The width forming circuit 5 has a prsettable D-FF 54, wherein the QN terminal is directly connected to the D terminal. Furthermore, signals SET-A1, SET-A2, SET-B1, SET-B2 are inputted into the preset input terminal PR through OR gate 55, and simultaneously coincidence outputs SA1, SA2, SB1, SB2 are inputted into the clock terminal CK of D-FF 54 through OR gate 53.

AND gate 51 or 52 is provided in a line from coincidence output terminals SA1, SA2, SB1, SB2 of the coincidence circuit 50 of the respective duty determination circuits 3A, 4A, 3B, 4B to OR gate 53 in order to prohibit coincidence outputs u1, u2, u3 . . . (FIG. 17, and FIG. 18) during the measurement cycle, and operates AND of the Q outputs coming from RS-FF 6,8.

Furthermore, in a case where. an external trigger signal EXT-TRIG (trigger G3 in FIG. 18) arrives immediately after the Q output of RS-FF 6 or RS-FF 8 rises, that is, where an external trigger signal EXT-TRIG arrives before coincidence outputs SAI, SA2, SB1, SBI which reset RS-FF 6 or RS-FF 8, are generated, the older coincidence output (point "w" in FIG. 18) is first generated before a correct coincidence output (point "e3" in FIG. 18) counted from a new external trigger signal EXT-TRIG is generated, causing the Q output of D-FF 54 to fall. In order to avoid this inconvenience, an external trigger period signal TRIG-STOPA is added to the input of the A system AND gates 51, 52, and another external trigger period signal TRIG-STOPB is added to the B system AND gates 51, 52.

(8) Operation (a) Outline

As shown as operation cycles C1,C2 in FIG. 17 and FIG. 18, the first duty determination circuit 3 and second duty determination circuit 4 which constitute each of the above-mentioned sets A and B alternately operate with two cycles of input clock signal EXT-CK shifted. And when a process is not carried out in time with respect to the arrival timing of external trigger signal EXT-TRIG when the process is performed by one set, for example, the "A" side, the process is automatically shifted to the other set "B" side.

In the preferred embodiment, "A" and "B" systems are automatically changed over whenever an external trigger signal EXT-TRIG arrives.

As shown in FIG. 17 and FIG. 18, the "A" side second duty determination circuit 4A handles every four cycles (4T) of the input clock signal EXT-CK as one repeating unit (operation cycle C1), and measures the length T1 of one cycle (t1) (A2 side target measurement period) of input clock signal EXT-CK in the front half of C1.

Accordingly, using the result of measurement, the value (timing position of duty 50%) of ½ of the length of one cycle T is calculated. In the subsequent third cycle (t3) and fourth cycle (t4) in the latter half of C1, the delay line oscillator 41 is caused to oscillate from the point of time (points "d", "f" in FIG. 17) when a signal SET-A2 synchronized with the respective internal trigger signals TRIG-A are generated, and the length T5 secured until the result of measurement becomes coincident with the above-mentioned calculation value, that is, until the count reaches the timing position of duty 50%, wherein at the point of time when the result becomes coincident with the calculation value, a coincidence output SA2 (points "e", "g" in FIG. 17) indicating the timing position of duty 50% is outputted.

The "A" side first duty determination circuit 3A has an operation cycle C2 with two cycles shifted from the first duty determination circuit 3. That is, the first duty determination circuit 4 handles every four cycles of input clock signal EXT-CK shown with t3 to t6 in FIG. 10 as one repeating unit (operation cycle C2), measures the length (target measurement period) T1 of one cycle of input clock signal EXT-CK in the first cycle (t3) of the front half of C2, and calculates the value (timing position of duty 50%) of ½ of length T of one cycle by using the result of the measurement. The delay line oscillator 41 is caused to oscillate from the point of time (points "k", "r" in FIG. 17) when a signal SET-A1 synchronized with the respective internal trigger signal TRIG-A in the subsequent fourth cycle (t4) and fifth cycle (t5) in the latter half of C2.

By counting the number of cycles of oscillation, the first duty determination circuit 3A measures the length T5 secured until the result of measurement becomes coincident with the above-mentioned calculated value, that is, until the count reaches the timing position of duty 50% and outputs a coincidence output SA1 (points "q", "s" in FIG. 17) which indicates the timing position of duty 50% when the coincidence is secured.

(b) "A" side operation (after trigger GI)

(i) 4A side first cycle t1

With the example shown in FIG. 17, the first external trigger signal G1 comes in the first cycle t1 of the input clock signal EXT-CK.

Prior to this, a timing signal WC-A2/B2 ((16) in FIG. 17) is inputted into the delay line oscillator 41 of the duty determination circuits 4A, 4B through OR gate 9 at point "a" in FIG. 10 to cause the respective delay line oscillators 41 to begin oscillating, and is inputted into the clear terminal CL of the counter 47, the rise of which causes the counter 47 to begin counting the number of cycles of oscillation. The oscillation of the delay line oscillator 41 is continued at least until the rise of the second clock cycle t2 is completed.

The oscillation of the 4A side delay line oscillator 41 ("A" system second duty determination circuit 4A side) is terminated when WC-A2/B2 falls, that is, the actual measurement period T3 ends (that is, point "c" in FIG. 17). In the meantime, by the target measurement period T1 of ½CK-A2/B2 arriving at the end thereof (point "b" in FIG. 17) and ½ CK-A2/B2 being fallen, the latch circuit 48 latches the count value (length of one cycle T=T1) of the counter 47.

Herein, the operation circuit 49 calculates the value of ½ of the count value of length of one cycle T (that is, the timing position of duty 50%) upon receiving the output of the latch circuit 48, outputs the result of calculation, and inputs the result into one input terminals B1 to Bn of the coincidence circuit 50.

(ii) A4 side second cycle t2

As the second cycle t2 starts, RS-FF 8 is set by the arrival of SET-A2 ((7) in FIG. 17) (point "d" inFIG. 17). The Q output ((17) in FIG. 17) of RS-FF8 is inputted into AND gate 52, and is added to the delay line oscillator 41 at the duty determination circuit 4A side through OR gate 9 to cause the delay line oscillator 41 to oscillate. Furthermore, the Q output of RS-FF 8 is added to the clear terminal CL of the 4A side counter 47 through OR gate 9 to cause the clear terminal to be cleared. Therefore, the counting of the number of cycles of oscillation is commenced.

The output of the counter 47 is inputted into the other input terminals A1 to An of the coincidence circuit 50, and the count value of the counter 47 is progressively increased. The moment the count value thereof becomes coincident with the value (value of ½ of length of one cycle T) outputted by the above-mentioned operation circuit 49 (point "e" in FIG. 17), a coincidence output SA2 is generated from the coincidence circuit 50.

This coincidence output SA2 is inputted into the reset input terminal R of RS-FF 8 to cause the flip flop to reset.

When this coincidence output SA2 is generated, the Q output ((17) in FIG. 17) of RS-FF 8 falls and becomes an input of AND gate 52 in a form of pulse P1. A coincidence output SA2 is generated as pulse AND-A2 ((20) in FIG. 17) having narrow width, only within the width of pulse P1, from AND gate 52 which uses this pulse P1, coincidence output SA2 and external trigger period signal TRIG-STOPA as three inputs, and becomes a clock input of D-FF 54 through OR gate 53.

Since the D-FF 54 which is the output side flip flop is preset every time by SET-A1, SET-A2, or SET-B1, SET-B2, when a short pulse AND-A2 ((20) in FIG. 17) corresponding to the above-mentioned coincidence output SA2 is added to D-FF 54 as a clock input, the Q output of D-FF 54 is reversed (fallen) every time, and appears at the output terminal OUT as pulse P1'.

(iii) 4A side third cycle t3

Continuously, as the third cycle t3 starts, since SET-A2 arrives again ((7) in FIG. 17) (point "f" in FIG. 17), RS-FF 8 is set. The Q output ((17) in FIG. 17) of RS-FF 8 is added to the 4A side delay line oscillator 41 through OR gate 9 to cause the oscillator 41 to oscillate and is added to the counter 47 to clear it, causing the counting of the number of cycles of oscillation to commence, while the Q output is inputted into AND gate 52. As the count value of the counter 47 becomes coincident with the output value (value of ½ of length of one cycle T) of the above-mentioned operation circuit 49 (point "g" in FIG. 17), a coincidence output SA2 is again generated from the coincidence circuit 50.

The Q output ((17) in FIG. 17) of RS-FF 8 falls when the coincidence output SA2 is generated and becomes an input of the AND gate 52 in a form of pulse P2. Therefore, a coincidence output SA2 (AND-A2; (20) in FIG. 9) is outputted, only within the width of pulse P1, from AND gate 52 which uses this pulse P1, coincidence output SA2 and external trigger period signal TRIG-STOPA as three inputs, and becomes a clock input of D-FF 54 through OR gate 53.

Since D-FF 54 is preset by SET-A2 every time, when a short pulse AND-A2 ((20) in FIG. 9) corresponding to the above-mentioned coincidence output SA2 is added to D-FF 54 as a clock input, whereby the Q output of D-FF 54 is reversed at that time, and appears in the output terminal OUT as pulse P2'.

The above-mentioned output pulses P1', P2' rise in synchronization with the external trigger signal EXT-TRIG, and are a digital clock signals having the same cycle T as that of the external input clock, that is, the input clock signal EXT-CK. As a result, the pulses P1', P2' compose a signal which is the input clock signal EXT-CK completely synchronized with the external trigger signal EXT-TRIG. Furthermore, the wave form is of duty 50%.

(iv) 3A side third cycle t3

With respect to the operation at the above-mentioned A4 side, the same operation is carried out at 3A side ("A" system first duty determination circuit 3A side) with two cycles delayed. That is, as the third cycle t3 starts, a signal WC-A1/B1 ((9) in FIG. 17) for indicating the actual measurement period (T3) rises (point "h" in FIG. 17). The signal WC-A1/B1 is added to the delay line oscillator 41 of the duty determination circuit 3A through OR gate 7 to cause the oscillation of the delay line oscillator 41 to commence the oscillation, and is added to the clear terminal CL of the counter 47, the rise of which causes the counter 47 to begin counting the number of cycles of oscillation.

(v) 3A side fourth cycle t4

The oscillation of the 3A side delay line oscillator 41 is continued at least until a rise of the clock of the fourth cycle t4 is completed.

The oscillation of the 3A side delay line oscillator 41 is terminated by a fall of WC-A1/B1 produced before a clock of the fifth cycle t5 rises, that is, the actual measurement period T3 ends slightly after one cycle T of the input clock CK ends (point "j" in FIG. 17).

In the meantime, by the target measurement period T1 of ½CK-A 1/B1 having a length just equivalent to one cycle T of the input clock CK arriving at its end and ½CK-A1/B1 inputted into the clock input terminal CK of the latch circuit 48 being low, the latch circuit 48 latches the count value (length of one cycle T TI) of the counter 47.

Herein, the A1 side operation circuit 49 calculates the value (timing position of duty 50%) of ½ of the count value of the length of one cycle T upon receiving the output of the latch circuit 48, outputs the result of calculation and inputs it into one input terminals B1 to Bn of the coincidence circuit 50.

As the fourth cycle t4 starts, RS-FF 6 is set by the arrival of SET-A1 ((6) in FIG. 17) (point "k" in FIG. 17). The Q output ((10) in FIG. 17) of RS-FF 6 is added to the 3A side delay line oscillator 41 through OR gate 7 to cause the oscillator 41 to oscillate and is added to the clear terminal CL of the 3A side counter 47 to cause the counter 4 7 to commence counting, while Q output is inputted into AND gate 51.

The output of 3A side counter 47 is inputted into the other input terminals A1 to An of the coincidence circuit 50, and the count value of the counter 47 is progressively increased. The moment the count value becomes coincident with the half value (½ value of length of one cycle T) outputted by the above-mentioned circuit 49 (point "q" in FIG. 17), a coincidence output SA1 is generated from the coincidence circuit 50.

This coincidence output SA1 is inputted into the reset input terminal R of RS-FF 6 and causes the flip flop to be reset. Therefore, at the point of time when this coincidence output SA1 is generated, the Q output ((10) in FIG. 17) of RS-FF 6 falls, and becomes an input of AND gate 51 in a form of pulse P3.

Therefore, a coincidence output SA1 is generated as output AND-A1 ((14) in FIG. 17) from AND gate 51 which uses the pulse P3, coincidence output SA1 and TRIG-STOPA as three inputs which become a clock input of D-FF 54 through OR gate 53. Accurately, the output AND-A1 is a short pulse generated at the front edge of the coincidence output SA1.

Since D-FF 54 is preset by SET-A1 every time, when a short pulse AND-A1 ((14) in FIG. 17) corresponding to the above-mentioned coincidence output SA1 is added to D-FF 54 as a clock input, the Q output of D-FF 54 falls, and appears at the output terminal OUT as pulse P3'.

It is noted that, since the coincidence pulse SA1 ("u1" in FIG. 17) generated at the third cycle t3 is generated while the Q output of RS-FF 6 is low, no output appears in the AND gate 51, and D-FF 54 is not changed. Therefore, the influence of the coincidence pulse u1 generated when the 3A side is in the measurement period is eliminated by AND gate 51, whereby no influence comes out at the output OUT side.

(vi) 3A side fifth cycle t5

Subsequently, as the fifth cycle t5 starts, since SET-A1 ((6) in FIG. 17) arrives again (point "r" in FIG. 17), RS-FF 6 is set. The Q output ((10) in FIG. 17) of RS-FF 6 is added to the A1 side delay line oscillator 41 through OR gate 7 to cause the oscillator to oscillate and is added to the counter 47 to clear it, causing counting of the number of cycles of oscillation to commence, while the Q output becomes an input of AND gate 51.

As the count value of the counter 47 becomes coincident with the output value (½ value of length of one cycle T) of the above-mentioned operation circuit 49 (point "s" in FIG. 17), a coincidence output SA1 is generated from the coincidence circuit 50 again.

Since RS-FF 6 is reset by the coincidence output SA1, the Q output ((10) in FIG. 17) of RS-FF 6 falls and becomes an input of AND gate 51 in a form of pulse P4. Therefore, a coincidence output SA1 is generated as output AND-A1 ((14) in FIG. 17) in the width of pulse P4 from AND gate 51 which uses the pulse P4, coincidence output SA1 and TRIG-STOPA as three inputs which become a clock input of D-FF 54 through OR gate 53.

Since D-FF 54 is preset by SET-A1 every time, a short pulse AND-A1 ((14) in FIG. 17) corresponding to the above-mentioned coincidence output SA1 is added to D-FF 54 as a clock input, the Q output of D-FF 54 is reversed at that time, and appears in the output terminal OUT as pulse P4'.

Thus, digital clock signals PI', P2', P3', P4', . . . which are in synchronization with the external trigger signal EXT-TRIG and have the cycle T as that of the external input clock, that is, the input clock signal EXT-CK can be obtained from the Q output of D-FF 54. Furthermore, the wave forms of them are modified so as to be duty 50% reliably. The effects of this synchronization and duty modification can be obtained even though the duty of input clock CK fluctuates in the vicinity of duty 50% or more. Therefore, this circuit is remarkably effective as an external synchronizing circuit accompanying a shaping of digital wave forms and it is possible to extend the operation of semiconductor active elements to a remarkably high frequency.

(c) "B" side operation (after trigger G2)
(i) 4B side sixth cycle t6 to 4B side seventh cycle t7

In the example shown in FIG. 17, the second external trigger signal G2 comes out in the sixth cycle t6 of the input clock signal EXT-CK. Furthermore, this is a case where the external trigger signal G2 arrives during measurement of the 50% duty position commenced by SET-A2.

As the external trigger signal G2 comes, D-FF in the timing generation circuit 301 is reversed to cause the external period signal TRIG-STOPA to change to L and TRIG-STOPB to H (a state where the "B" side is selected). Therefore, AND gates 333, 334 (SET-A1, SET-A2) belonging to the "A" system D-FF 331 are prohibited, and instead thereof, AND gates 335, 336 (SET-B1, SET-B2) belonging to the "B" system D-FF 332 are made active.

At this moment, any one of SET-B1 and SET-B2 is generated in response to whether the actuating circuit change signal BLOCK-SEL is H or L. In this example, as shown at (20) and (21) in FIG. 15, SET-B2 ("d2", "f2" in FIG. 15) is firstly generated.

Upon receiving this SET-B2 ((26) in FIG. 18), RS-FF 8 of the 4B side (the second duty determination circuit 4B in the "B" system) is set (point "d2" in FIG. 18). The Q output ((27) in FIG. 18) of RS-FF 8 is inputted into AND gate 52, and is added to the delay line oscillator 41 at the second duty determination circuit 4B side through OR gate 9 to cause the oscillator 41 to oscillate.

The Q output of RS-FF 8 is added to the clear terminal CL of the 4B side counter 47 through OR gate 9 to clear the clear terminal. Therefore, the counting of the number of cycles of oscillation is commenced. It is noted that, since the measurement of one cycle T is carried out at all times, the result of calculation equivalent to 50% duty in the operation circuit 49 is already inputted into the coincidence circuit 50.

The count value of the counter 47 is progressively increased, and at the moment when the count value becomes coincident with the value (½ value of length T of cycle) outputted by the above-mentioned operation circuit 49 (point "e2" in FIG. 18), a coincidence output SB2 is generated from the coincidence circuit 50.

RS-FF 8 is reset by this coincidence output SB2, and the Q output ((27) in FIG. 18) falls and becomes an input of AND gate 52 in a form of pulse P5. A coincidence output SB2 is generated as AND-B2 ((30) in FIG. 18) having a narrow width from AND gate 52 which uses the pulse P5, coincidence output SB2 and external trigger period signal TRIG-STOPB as three inputs which become a clock input of D-FF 54 through OR gate 53.

Since D-FF 54 is preset by SET-B2 every time, if a short pulse AND-B2 ((30) in FIG. 18) corresponding to the above-mentioned coincidence output SB2 is added to D-FF 54 as a clock input, the Q output of D-FF 54 is reversed (carries out a fall operation) every time, and appears in the output terminal OUT as pulse P5'. It is noted that, in the example shown in FIG. 8, in the sixth cycle t6, since D-FF 54 is already preset at the position of "d1", P5' became a slightly wide pulse which rises slightly before the position of G2.

(ii) 4B side seventh cycle t7 to 4B side eighth cycle t8

As SET-B2 ((26) in FIG. 18) arrives again (point "f2" in FIG. 17), RS-FF 8 is set. The Q output ((27) in FIG. 18) of RS-FF 8 is added to the 4B side delay line oscillator 41 through OR gate 9 to cause the oscillator 41 to oscillate and causes the counter 47 to be cleared to commence counting the number of cycles of oscillation, while Q output is inputted into AND gate 52.

When the count value of the counter 47 becomes coincident with the output value (½ value of length of one cycle T) of the above-mentioned operation circuit 49 (point "g2" in FIG. 18), a coincidence output SB2 is generated from the coincidence circuit 50 again. At the point of time when this coincidence output SB2 is generated, the Q output of RS-FF 8 ((27) in FIG. 18) falls and becomes an input of AND gate 52 in a form of pulse P6. Therefore, a coincidence output SB2 (AND-B2; (30) in FIG. 18) is outputted from AND gate 52 which uses this pulse P6, coincidence output SB2 and external trigger period signal TRIG-STOPB as three inputs which become a clock input of D-FF 54 through OR gate 53.

Since the D-FF 54 is preset by SET-B2 every time, if a short pulse AND-B2 ((26) in FIG. 18) corresponding to the above-mentioned coincidence output SB2 is added to D-FF 54 as a clock input, the Q output of D-FF 54 is reverse at that time and appears in the output terminal OUT as pulse 6'.

In summary, the output pulse P5' of the above-mentioned pulses P5' and P6' is a signal which rise in synchronization with the last SET-A2 (point "d1" in FIG. 17) in the sixth cycle t6, and falls by the coincidence output SB2 (point "e2" in FIG. 1 7) after the external trigger signal EXT-TRIG arrives. The fall position is made coincident with the position of the duty 50% signal in a case where the input clock signal EXT-CK rises at the same time of the arrival of the external trigger signal EXT-TRIG.

Furthermore, the above-mentioned output pulse P6' is a digital clock signal which rises in synchronization with the external trigger signal EXT-TRIG and has the same cycle T as that of the external input clock, that is, the input clock signal EXT-CK. As a result, the pulse P6' is such a signal which is the input clock signal EXT-CK completely synchronized with the external trigger signal EXT-TRIG. Furthermore, the wave form thereof is of duty 50%.

(iii) 3B side eighth cycle t8 to 3B side ninth cycle t9

With respect to the operation of the above-mentioned 4B side, the same operation is carried out at the 3B side ("B" system first duty determination circuit 3A side) with two cycles delayed. That is, measurement of one cycle is carried out by oscillation, counting, calculation and coincidence operation, and, when as SET-B1 ((21) in FIG. 18) is generated in the eighth cycle t8, RS-FF 6 is set (point "k2" in FIG. 18).

The Q output ((22) in FIG. 18) of RS-FF 6 is inputted into AND gate 51 and is added to the 3B side (duty determination circuit 3B side) delay line oscillator 41 through OR gate 7 to cause the oscillator 41 to oscillate, and is added to the clear terminal of the 3B side counter 47 to cause the counting to be commenced.

At the moment (point "q2" in FIG. 18) when the count value of the counter 47 is progressively increased and becomes coincident with the value (½ value of length of one cycle T) outputted by the above-mentioned operation circuit 49, a coincidence output SB1 is generated by the coincidence circuit 50.

This coincidence output SB1 is inputted into the reset input terminal R of RS-FF 6 and resets the flip flop. Therefore, at the point of time when this coincidence output SB1 is generated, the Q output ((2) in FIG. 18) of RS-FF rises and becomes an input of AND gate 51 in a form of pulse P7.

Therefore, a coincidence output SB1 is generated as output AND-B1 ((25)in FIG. 18) from AND gate 51 which uses this pulse P7, coincidence output SB1 and TRIG-STOPB as three inputs which become a clock input of D-FF 54 through OR gate 53.

Accurately, the output AND-B1 is composed of a short pulse generated at the front edge of the coincidence output SB1.

Since D-FF 54 is preset by SET-B1 every time, if a short pulse AND-B1 ((25) in FIG. 18) corresponding to the above-mentioned coincidence output SB1 is added to D-FF 54 as a clock input, the Q output of D-FF 54 falls at that time and appears in the output terminal OUT as pulse P7'. It is noted that, since the coincidence pulse SB1 (u3 in FIG. 18) generated in the third cycle t3 and the seventh cycle t7 is generated while the Q output of RS-FF 6 is low, no output appears in AND gate 51, and the D-FF 54 is not changed over.

Therefore, the influence of a coincidence pulse u3 generated when the 3B side is in the measurement period is eliminated by AND gate 51 and does not appear in the output OUT side.

(iv) 3B side ninth cycle t9 to 3B side tenth cycle t10

Continuously, since SET-B1 ((21) in FIG. 18) arrives again in the ninth cycle t9 (point "r2" in FIG. 18), RS-FF 6 is set. The Q output ((22) in FIG. 18) of RS-FF 6 is added to the 3B side delay line oscillator 41 through OR gate 7 to cause the oscillator 41 to oscillate and is added to the counter 47 to clear it, causing the counting of the number of cycles of oscillation to commence, while Q output becomes an input of AND gate 51.

When the count value of the counter 47 becomes coincident with the output value (½ value of length of one cycle T) of the above-mentioned operation circuit 49 (point "s2" in FIG. 18), a coincidence output signal SB1 is generated from the coincidence circuit SB1. Since RS-FF 6 is reset by the coincidence output SB1, the Q output ((22) in FIG. 18) of RS-FF 6 falls, and becomes an input of AND gate 51 in a form of pulse P8.

Therefore, a coincidence output SB1 is generated as the output AND-B1 ((25) in FIG. 18) from AND gate 51 which uses the pulse P8, coincidence output SB1 and TRIG-STOPB as three inputs which become a clock input of D-FF 54 through OR gate 53.

Since D-FF 54 is preset by SET-B1 every time, if a short pulse AND-B1 ((25) in FIG. 18) corresponding to the above-mentioned coincidence output SB1 is added to D-FF 54 as a clock input, the Q output of D-FF 54 is reversed at that time, and appears in the output terminal OUT as pulse P8'.

Thus, digital clock signals P5', P6', P7', PS', . . . which are synchronized with the external trigger signal EXT-TRIG and have the same cycle T as that of the external input clock, that is, the input clock signal EXT-CK can be obtained from the Q output of D-FF 54. Furthermore, the wave forms thereof are modified so as to be duty 50%.

The effects of this synchronization and duty modification can be obtained even though the duty of input clock CK fluctuates in the vicinity of 50% or more. Therefore, this is very effective as an external synchronizing circuit accompanying a shaping of digital wave form, and it is possible to extend the operation of semiconductor active elements to a very high frequency.

(d) "A" side operation (after trigger G3)
(i) 4A side tenth cycle t10 to 4A side eleventh cycle t11

In the example shown in FIG. 17, the third external trigger signal G2 comes in the tenth cycle t10 of input clock signal EXT-CK. Furthermore, this is a case where the external trigger signal G2 comes during a measurement of 50% duty position, which is commenced by SET-B1.

As the external trigger signal G3 comes, D-FF in the timing generation circuit 301 is reversed, whereby the external trigger period signal TRIG-STOPA is changed to H, and the TRIG-STOPB is changed to L. Therefore, AND gates 335, 336 (SET-B I, SET-B2) belonging to the "B" system D-FF 332 are prohibited, and instead thereof, AND gates 333, 334 (SET-A1, SET-A2) belonging to the "A" system D-FF 331 are made active.

At this moment, any one of SET-A1 and SET-A2 is generated in response to whether the actuating circuit change signal BLOCK-SEL is H or L. In this example, as shown at (15) and (17) in FIG. 15, SET-A2 is firstly generated ("d3", "f" in FIG. 15).

RS-FF 8 is set (point "d3" in FIG. 17) upon receiving this SET-A2 ((7) in FIG. 17). The Q output ((17) in FIG. 17) of RS-FF 8 is inputted into the delay line oscillator 41 at the duty determination circuit 4A side through OR gate 9 to cause the oscillator 41 to oscillate, while it is inputted into AND gate 52. Furthermore, the Q output of RS-FF 8 is added to the clear terminal CL of the 4A side counter 47 through OR gate 9 to cause it to clear and to commence counting the number of cycles of oscillation.

It is noted that, since measurement of one cycle T is always carried out, the result of calculation equivalent to duty 50% in the operation circuit 49 is already inputted into the coincidence circuit 50.

At the moment (point "e3" in FIG. 17) when the count value of the counter 47 is progressively increased and becomes coincident with the value (½ value of length of one cycle T) outputted by the above-mentioned operation circuit 49, a coincidence output SA2 is generated from the coincidence circuit 50.

RS-FF 8 is reset by this coincidence output SA2, the set Q output ((17) in FIG. 17) thereof falls and becomes an input of AND gate 52 in a form of pulse P9. A coincidence output SA2 becomes a pulse AND-A2 ((20) in FIG. 17) having a narrow width is generated from AND gate 52 which uses this pulse P5, coincidence output SA2 and external trigger period signal TRIG-STOPA as three inputs which become a clock input of D-FF 54 through OR gate 53.

Since D-FF 54 is preset by SET-A2 every time, if a short pulse AND-A2 ((20) in FIG. 17) corresponding to the above-mentioned output SA2 is added to D-FF 54 as a clock input, the Q output of D-FF 54 is reversed (fallen) every time and appears in the output terminal OUT as pulse P9'.

On the other hand, since the Q output of the B2 side RS-FF 8 still remains high by the last SET-B2 ("d2" in FIG. 18) in the tenth cycle t10 at the moment when the above-mentioned trigger G arrives, the 50% duty position is still being measured until the B2 side RS-PF 8 is reset.

Accordingly, without any device, a coincidence output SB2 (point "w" in FIG. 18) appears at the 50% duty position counted from SET-B2 ("d2" in FIG. 18), which causes the output to be low. That is, the output OUT will be low at the position where it is not synchronized with a new trigger G3, and but with the last trigger G2.

Therefore, TRIG-STOPA is added to AND gate 52, whereby the corresponding AND gate is prohibited so that, when operation is performed at "A" side, a coincidence output SB2 generated at "B" side does not influence the output side.

For the same reason, the external trigger period signal TRIG-STOPA is added to the "A" side AND gate 51, and the external trigger period signal TRIG-STOPB is added to the "B" side AND gates 51, 52. It is noted that, although a coincidence output SA2 (point "w" in FIG. 17) is also produced at the end of the sixth cycle t6 where trigger G2 arrives, this is also eliminated by the "A2" side AND gate 52, and does not influence the output.

(ii) 4A side eleventh cycle t II to 4A side twelfth cycle t12

If SET-A2 ((7) in FIG. 17) arrives again (point "f3" in FIG. 17), RS-FF 8 is set. The Q output ((17) in FIG. 17) of RS-FF 8 is added to the 4A side delay line oscillator 41 through OR gate 9 to cause the oscillator 41 to oscillate, and is added to the counter 47 to clear it, causing the counting of the number of cycles of oscillation to commence, while Q output is inputted into AND gate 52.

As the count value of the counter 47 becomes coincident with the output value (½ value of length of one cycle T) of the above-mentioned operation circuit 49 (point "g3" in FIG. 17), and a coincidence output SA2 is generated again from the coincidence output 50.

The Q output ((I 7) in FIG. 17) of RS-FF 8 falls at the point of time when this coincidence output SA2 is generated and becomes an input of AND gate 52 in a form of pulse P10. Therefore, a coincidence output SA2 (AND-A2; (20) in FIG. 17) is outputted from AND gate 52 which uses this pulse P10, coincidence output SA2 and external trigger period signal TRIG-STOPA as three inputs which become a clock input of D-FF 54 through OR gate 53.

Since the D-FF 54 is preset by SET-A2 every time, if a short pulse AND-A2 ((20) in FIG. 17) corresponding to the above-mentioned coincidence output SA2 is added to D-FF 54 as a clock input, the Q output of D-FF 54 is reversed at that time and appears in the output terminal OUT as pulse P10'.

In summary, the output pulse P9' of the above-mentioned output pulses P9', P10' is a signal which is rises in synchronization with the last SET-B2 (point "d2" in FIG. 17) in the tenth cycle t10 and falls by a coincidence output SB2 (point "e3" in FIG. 17) after the external trigger signal EXT-TRIG (trigger G3) arrives.

The fall position is coincident with the position of the duty 50% signal in a case where it is assumed that the input clock signal EXT-CK rises at the same time as the external trigger signal EXT-TRIG arrives.

Furthermore, the above-mentioned output pulse P10' is a digital clock signal which rises in synchronization with the external trigger signal EXT-TRIG and has the same cycle T as that of the external input clock, that is, the input clock signal EXT-CK. As a result, the pulse P10 is such a signal which is the input clock signal EXT-CK completely synchronized with the external trigger signal EXT-TRIG. Furthermore, the wave form thereof is of duty 50%.

(iii) 3A side twelfth cycle t12 to 3A side thirteenth cycle t13

With respect to the above-mentioned 4A side operation, the same operation is performed at the 3A side (the first duty determination circuit 3A side of the "A" system) with two cycles delayed. That is, measurement of one cycle is carried out by oscillation, counting, calculation and coincidence operation, and, when SET-A1 ((6) in FIG. 17) is generated at the twelfth cycle t12, RS-FF 6 is set (point "k3" in FIG. 17).

The Q output ((10) in FIG. 17) of RS-FF 6 is added to the 3A side delay line oscillator 41 through OR gate 7 to cause the oscillator to oscillate, and is added to the clear terminal CL of the 3A side counter 47 to cause the counting to be commenced, while the Q output is inputted into AND gate 51.

At the moment (point "q3" in FIG. 17) when the count value of the counter 47 is progressively increased and becomes coincident with the value (½ value of length of one cycle T) outputted by the above-mentioned operation circuit 49, a coincidence output SA1 is generated from the coincidence circuit 50.

This coincidence output SA1 is inputted into the reset input terminal R of RS-FF 6 and causes the flip flop to be reset. Therefore, at the point of time when this coincidence output SA1 is generated, the Q output ((10) in FIG. 17) of RS-FF 6 falls and becomes an input of AND gate 51 in a form of pulse P11.

Therefore, a coincidence output SA1 is generated as output AND-A1 ((14) in FIG. 17) from AND gate 51 which uses this pulse P11, coincidence output SA1 and TRIG-STOPA as three inputs which become a clock input of D-FF 54 through OR gate 53. However, accurately, the output AND-A1 is a short pulse generated at the front edge of the coincidence output SA1.

Since the D-FF 54 is preset by SET-A1 every time, if a short pulse AND-A1 ((14) in FIG. 17) corresponding to the above-mentioned coincidence output SA1 is added to D-FF 54 as a clock input, the Q output of D-PP 54 falls at that time and appears in the output terminal OUT as pulse P11'.

It is noted that coincidence pulses SA1 and SA2 (u1, u2 in FIG. 17) generated in the ninth cycle t9, eleventh cycle t11, etc. are generated while the Q output of RS-FF 6, 8 are low. Therefore, no output appears in AND gates 51, 52 and then the D-FF 54 is not changed over. Accordingly, the influences of coincidence pulses u1, u2 generated while the A1 side or A2 side is in the measurement period are eliminated by AND gate 51, 52, and the influences do not appear in the output OUT side.

(iv) 3A side thirteenth cycle t13 to 3A side fourteenth cycle t14

Continuously, since SET-A1 ((6) in FIG. 17) arrives again in the thirteenth cycle t13 (point "3" in FIG. 17), RS-FF 6 is set. And when the count value of the counter 47 becomes coincident with the output value (½ value of length of one cycle) of the operation circuit 49 (point "s3" in FIG. 17), a coincidence output SA1 is generated again from the coincidence circuit 50.

Therefore, Digital clock signals P9, P10', P11', P12', . . . which are synchronous with the external trigger signal EXT-TRIG and have the same cycle T as that of the external input clock, that is, the input clock signal EXT-CK can be obtained. Furthermore, the wave forms thereof are modified so as to be shaped to duty 50%.

The effects of this synchronization and duty modification can be obtained in a case where the duty of the input clock CK fluctuates in the vicinity of 50% or more. Therefore, this circuit is remarkably effective as an external synchronizing circuit accompanying a shaping of digital wave forms, and it is possible to extend the operational area of semiconductor active elements to a remarkably high frequency.

In the example shown in FIG. 17, since the fourth external trigger G4 is inputted the moment the coincidence output SA1 is generated, P12' will be of a length continued to the last pulse.

As in the above description, with respect to the fourteenth cycle t14 and subsequent cycles, an output pulse rises from the position in synchronization with every input of the external trigger signal EXT-TRIG whenever the signal is inputted, and falls at the point of time when just the half position of one cycle of the input clock signal EXT-CK comes. As a result, the input clock signal EXT-CK is synchronized with the external trigger signal EXT-TRIG.

(9) Other preferred embodiments

Figure 20:
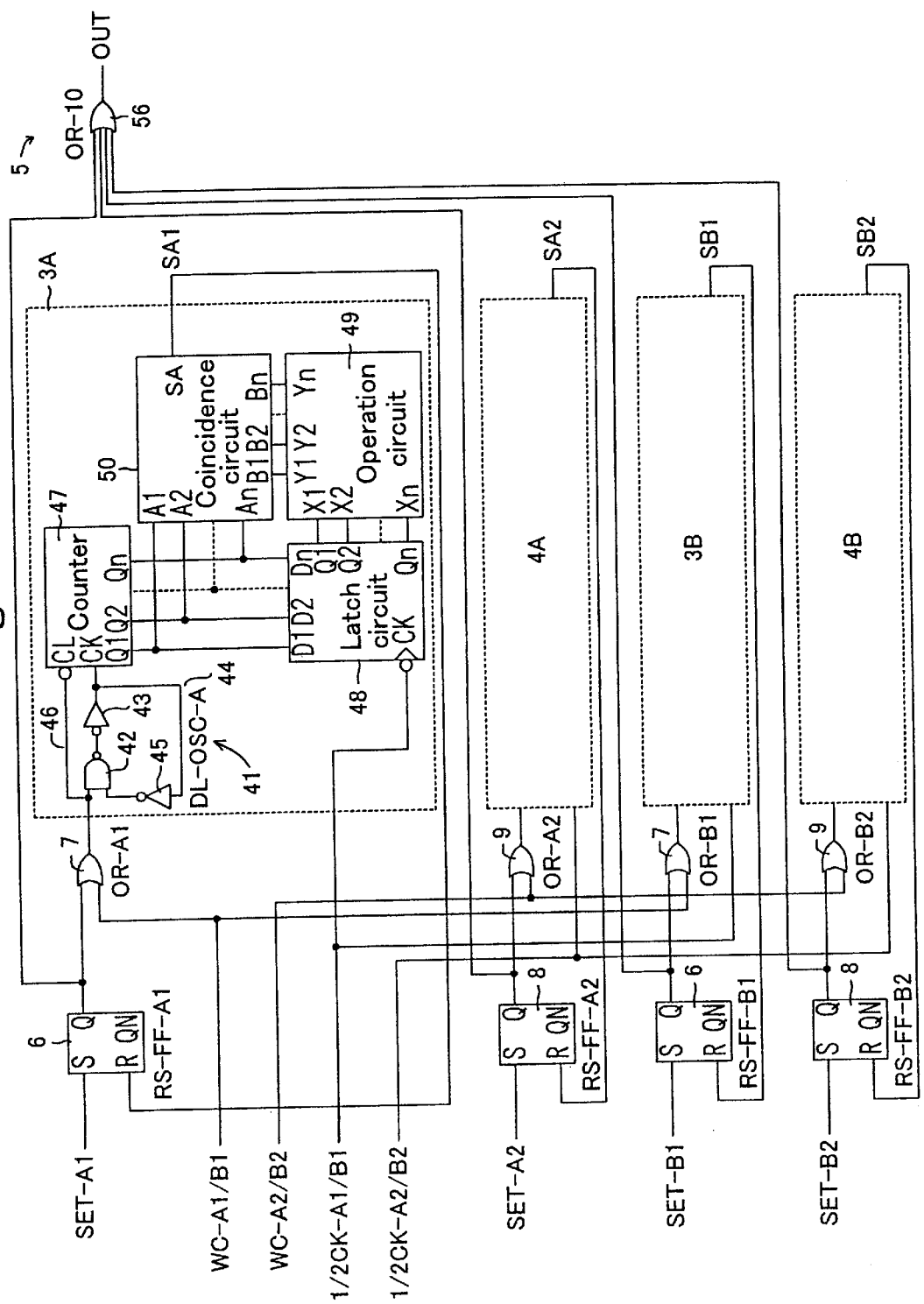
FIG. 20 is a view showing another preferred embodiment of the external synchronizing circuit of the invention.
Figure 21:
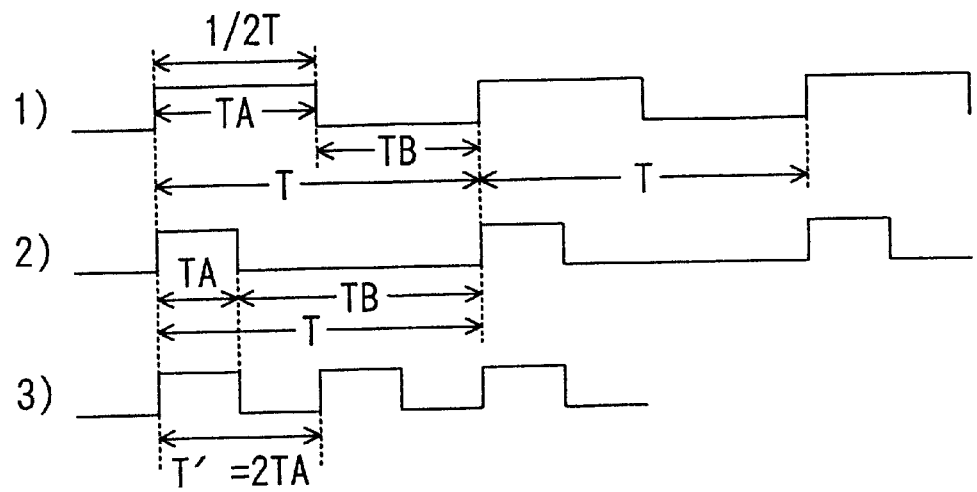
FIG. 21 is a view prepared for description of fluctuations of the frequency handled by semiconductor active elements.
Figure 22:
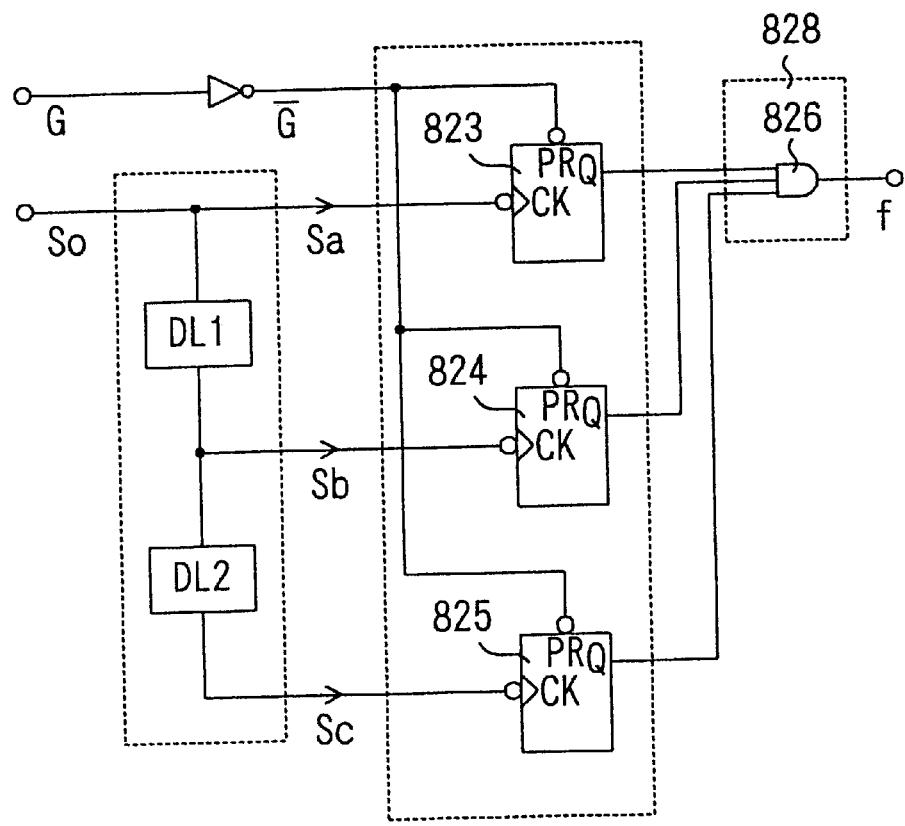
FIG. 22 is a view showing the configuration of a phase-divided part used for a conventional synchronizing signal selection circuit.

Although a presettable D-FF 54 is used for a width forming circuit 5 in the above-mentioned preferred embodiments, as shown in FIG. 20, it is possible to secure a required output ((33) IN FIG. 18) by taking out an Q output of RS-FF 6, 8 positioned before each of the above-mentioned duty determination circuits 3A, 4A, 3B, 4B by the OR gate 56 with the output OR gate 56 employed instead of D-FF 54.

Although a description of the operations of this preferred embodiment is omitted, the embodiment is such that the outputs Q of the prepositioned flip flops 6, 8, that is, RS-FF-A1-Q (P3, P4, P11, P12), RS-FF-A2-Q (P1, P2, P9, P10), RS-FF-B1-Q (P7, P8), RS-FF-B2-Q (P5, P6) in FIG. 17 and FIG. 18 are merely synthesized and is characterized in that the Q output of these prepositioned flip flops 6,8 are taken out as outputs. An advantage of such a construction is in that the circuit configuration is further simplified than that shown in FIG. 10.

Furthermore, although in the above preferred embodiments wave forms CKFA, CKFB is used in wave forms of which one cycle of an input clock signal EXT-CK shown in FIG. 19(a) is made one unit, CKFA, CKFB may be used in wave forms which two cycles shown in FIG. 19(b) are made one unit.

The summary of the above-mentioned contents of this invention are as follows:

(A) In order to achieve an objective of providing a wave form shaping circuit by which wave forms are shaped to those of duty 50% regardless of whether or not the input signal is of duty 50%, the wave form shaping circuit comprises of a duty determination circuit for determining and indicating the timing position of duty 50% of a clock signal to be outputted, upon receiving a timing signal formed by a timing generation circuit 2, wherein the duty determination circuit is composed of a cycle measurement circuit 10 for measuring the length of one cycle in the first cycle which comes with every interval of integral number times of one cycle T of input clock signal EXT-CK, a operation circuit 19 for calculating the length of one half of one cycle based on the value thereof, an actual measurement circuit 20 for executing measurement of the length in each of the second cycles in the above-mentioned interval, and a coincidence circuit 28 for outputting a coincidence output, as a timing position of the above-mentioned duty 50%, when the corresponding measured value becomes coincident with the above-mentioned calculated value, wherein clock signals having a pulse width corresponding to the above-mentioned duty 50% are produced and outputted on the basis of a signal synchronized with the front edge of input clock signal EXT-CK and the timing position determined and indicated in the above-mentioned duty determination circuit 3 (See FIG. 1).

(B) In order to achieve another objective of providing an actual external synchronizing method, using a simple construction, by which an input clock signal is synchronized with an external trigger signal and input digital signals can be shaped to a wave form of duty 50%, a number of internal trigger signals INT-TRIG which are synchronized with the external trigger signals EXT-TRIG are produced at a cycle T of input clock signals until the next external trigger signal EXT-TRIG comes, these internal trigger signals are shared to the first duty determination circuit 3 and the second duty determination circuit 4 with the timing thereof shifted (SET-A1, SET-A2), the timing positions corresponding to duty 50% of cycles of the input clock signals are alternately measured from the position of the internal trigger signals, output pulses rise at the positions of the internal trigger signals SET-A1, SET-A2 and output pulses fall at the timing positions SA1, SA2 corresponding to the above-mentioned measured duty 50% (See FIG. 7).

(c) In order to achieve an objective of providing an actual frequency multiplying circuit, having a simple construction, which is able to output signals after they are shaped to duty 50%, a duty determination circuit for determining and instructing the timing position of duty 50% of clock signals to be outputted, upon receiving a timing signals formed by a timing generation circuit, 302, is provided, wherein the length of one cycle is measured in the first cycle arriving at every interval of an integer number of cycles of an input clock signal EXT-CK, values corresponding to the positions of duty 25%, 50%, 75% are calculated on the basis thereof, measurement of the length is executed in each of the second cycles in the above-mentioned intervals, coincidence outputs SA1, SA2, SA3, or SB1, SB2, SB3 are outputted whenever the corresponding measured value becomes coincident with the above-mentioned calculated values, and a clock signal, the frequency of which is two times larger than the input clock signals and the duty of which is 50%, is generated and outputted on the basis of signals SET-AB synchronized with the coincidence output and the front edge of the input clock signal EXT-CK (See FIG. 9).

What is claimed is:

1. A digital wave shaping circuit for providing an output clock signal comprising:

a timing generation circuit for generating a timing signal from an input clock signal;

a duty determination circuit for determining a timing position for a state transition of the output clock signal corresponding to a duty cycle of 50%, and outputting a coincidence output indicating the timing position, upon receiving the timing signal from the timing generation circuit;

said duty determination circuit including a cycle measurement circuit for measuring a length of one cycle of the input clock signal at predetermined intervals of an integer number of input clock cycles, an operation circuit for calculating a length of one half of one cycle based on the length of one cycle from the cycle measurement circuit, an actual measurement circuit for executing a measurement of the input clock signal at the rising edge of each input clock cycle, and a coincidence circuit for outputting the coincidence output indicating the timing position for the duty cycle of 50% when the measurement from the actual measurement circuit becomes coincident with the length of one half of one cycle from the operation circuit; and a width forming circuit for generating and outputting the output clock signal having a pulse width corresponding to the duty cycle of 50% on the basis of a signal synchronized with the front edge of the input clock signal and the coincidence output outputted by said duty determination circuit.

2. A digital wave shaping circuit for providing an output clock signal comprising:

a timing generation circuit for generating, from an input clock signal, timing signals including a signal for defining target measurement periods wherein each target period is to be measured as a length of one cycle of the input clock signal and is within an interval of an integer number of input clock cycles, a signal for defining actual measurement periods for sustaining measurement operations over the target periods, and a signal for defining oscillation reference periods wherein each reference period starts at the front edge of one of the input clock cycles and ends before the front edge of the next one of the input clock cycles;

a cycle measurement circuit including a delay line oscillator for oscillating only during one of the actual measurement periods upon receiving the actual measurement signal from the timing generation circuit, a counter for counting a number of oscillation cycles of the delay line oscillator, and a latch circuit for latching a count value of the counter when one of the target periods ends;

an operation circuit for calculating a half value of the count value latched in the latch circuit of the cycle measurement circuit;

an actual measurement circuit including a delay line oscillator for oscillating only during one of the oscillation reference periods upon receiving the oscillation reference signal, and a counter for counting a number of oscillation cycles of the corresponding delay line oscillator;

a coincidence circuit for comparing a count value of the counter of said actual measurement circuit with the calculated half value of the operation circuit and for generating a coincidence output when the two values become coincident; and a width forming circuit for forming and outputting the output clock signal having a pulse width corresponding to said duty cycle of 50% on the basis of the coincidence output of said coincidence circuit.

3. The delay line oscillator in claim 2 further comprising an NAND gate, one input terminal of which is used as the input terminal of the oscillator, a first odd tier inverter connected to the output terminal of the NAND gate as a delay element, and a second inverter inserted into a feedback loop from the output of the first inverter to another input terminal of said NAND gate.

4. A digital wave shaping circuit for providing an output clock signal comprising:

a timing generation circuit for generating timing signals from an input clock signal of a fixed cycle;

a first and second duty determination circuit for determining a timing position for a state transition of the output clock signal corresponding to a duty cycle of 50%, and each outputting a coincidence signal indicating the timing position, upon receiving said timing signals from the timing generation circuit;

wherein said first and second duty determination circuit operate in operation cycles C1 and C2, respectively;

wherein said operation cycles C1 and C2 overlap at at least one input clock cycle and are shifted two input clock cycles from each other;

said first and second duty determination circuit each including a delay line oscillator, a counter for counting a number of oscillation cycles of the delay line oscillator, an operation circuit for calculating a half value of a count value of the counter, and a coincidence circuit which uses the output of the corresponding operation circuit as one input and uses the output of said counter as the other input;

wherein said first determination circuit measures a length of one input clock cycle by causing the delay line to oscillate and counting the number of oscillation cycles with the counter in a first input clock cycle in the operation cycle C1, and calculating a half value of a count value of the counter with the operation circuit, executes a measurement of the input clock signal at a rising edge of a second input clock cycle in the operation cycle C1 by causing the delay line oscillator to oscillate and counting the number of oscillation cycles with the counter, and outputs a coincidence output from the coincidence circuit indicating the timing position for a duty cycle of 50% when a count value in the second input clock cycle becomes coincident with the calculated half value of the count value from the operation circuit;

wherein said second duty determination circuit operates in the operation cycle C2 which overlaps the operation cycle C1 of the first duty determination circuit at at least one input clock cycle and which are shifted two input clock cycles from each other, and outputs another coincidence output indicating the timing position for the duty cycle of 50%;

width forming circuit for generating and outputting the output clock signal having a pulse width corresponding to the duty cycle of 50% on the basis of the coincidence output from said first and second duty determination circuit wherein the output clock signal is synchronized with the front edge of the input clock signal.

5. The digital wave shaping circuit according to claim 4, wherein said width forming circuit includes a flip flop positioned before each of said first and second duty determination circuit, sets one of the flip flops in synchronization with the front edge of the input clock signal at each input clock cycle, resets the flip flops with the coincidence output of the corresponding duty determination circuit and inputs the output of said flips flop to an OR gate.

6. The delay line oscillator in claim 5 further comprising an NAND gate, one input terminal of which is used as the input terminal of the oscillator, a first odd tier inverter connected to the output terminal of the NAND gate as a delay element, and a second inverter inserted into a feedback loop from the output of the first inverter to another input terminal of said NAND gate.

7. The delay line oscillator in claim 4 further comprising an NAND gate, one input terminal of which is used as the input terminal of the oscillator, a first odd tier inverter connected to the output terminal of the NAND gate as a delay element, and a second inverter inserted into a feedback loop from the output of the first inverter to another input terminal of said NAND gate.

8. A digital wave shaping circuit for providing an output clock signal comprising:

a timing generation circuit for generating, from an input clock signal, timing signals including a signal for defining target measurement periods wherein each target period is to be measured as a length of one cycle of the input clock signal and is within an interval of an integer number of input clock cycles, and a signal for defining actual measurement periods to sustain measurement operations slightly longer than the target measurement periods;

a first and second duty determination circuit for determining a timing position for a state transition of the output clock signal corresponding to a duty cycle of 50%, and each outputting a coincidence output indicating the timing position, upon receiving said timing signals;

each one of said duty determination circuits including a delay line oscillator, a counter for counting a number of oscillation cycles of the delay line oscillator, a latch for latching a court value of the counter at the end of one of said target measurement periods, an operation circuit for calculating a half value of said count value, and a coincidence circuit which uses the output of the corresponding operation circuit as one input and uses the output of said counter as the other input;

wherein said first and second duty determination circuit operate in operation cycles C1 and C2, respectively;

wherein said operation cycles C1 and C2 overlap at at least one input clock cycle and are shifted two input clock cycles from each other;

a first flip flop positioned before said first duty determination circuit, which is set in synchronization with a front edge of the input clock signal and is reset by the coincidence output of said first duty determination circuit;

a second flip flop positioned before said second duty determination circuit, which is set in synchronization with another front edge of the input clock signal and is reset by the coincidence output of said second duty determination circuit;

a first OR gate for inputting the output of said first flip flop and inputting said signal for defining said actual measurement periods wherein the output of the first OR gate is inputted into the first duty determination circuit;

a second OR gate for inputting the output of said second flip flop and inputting said signal for defining said actual measurement periods wherein the output of the second OR gate is inputted into said second duty determination circuit;

a third OR gate for inputting the output of each one of said flip flops.

9. The delay line oscillator in claim 8 further comprising an NAND gate, one input terminal of which is used as the input terminal of the oscillator, a first odd tier inverter connected to the output terminal of the NAND gate as a delay element, and a second inverter inserted into a feedback loop from the output of the first inverter to another input terminal of said NAND gate.

10. A digital wave shaping circuit for providing an output clock signal comprising:

a timing generation circuit for generating, from an input clock signal, timing signals including a signal for defining target measurement periods wherein each target period is to be measured as a length of one cycle of the input clock signal and is within an interval of an integer number of input clock cycles, and a signal for defining actual measurement periods to sustain measurement operations slightly longer than the target measurement periods;

a first and second duty determination circuit for determining a timing position for a state transition of the output clock signal corresponding to a duty cycle of 50%, and each outputting a coincidence signal indicating the timing position, upon receiving said timing signals;

each one of said duty determination circuits including a delay line oscillator, a counter for counting a number of oscillation cycles of the delay line oscillator, a latch for latching a court value of the counter at the end of one of said target measurement periods, an operation circuit for calculating a half value of said count value, and a coincidence circuit which uses the output of the corresponding operation circuit as one input and uses the output of said counter as the other input;

wherein said first and second duty determination circuit operate in operation cycles C1 and C2, respectively;

wherein said operation cycles C1 and C2 overlap at at least one input clock cycle and are shifted two input clock cycles from each other;

a first flip flop positioned before said first duty determination circuit, which is set in synchronization with a front edge of the input clock signal and is reset by the coincidence output of said first duty determination circuit;

a second flip flop positioned before said second duty determination circuit, which is set in synchronization with another front edge of a cycle of the input clock signal and is reset by the coincidence output of said second duty determination circuit;

a first OR gate for inputting the output of said first flip flop and inputting said signal for defining said actual measurement periods wherein the output of the first OR gate is inputted into said first duty determination circuit;

a second OR gate for inputting the output of said second flip flop and inputting said signal for defining said actual measurement period wherein the output of the second OR gate is inputted into said second duty determination circuit;

a third flip flop which is reset every time in synchronization with the front edge of said input clock signal and the output state of which is changed by the coincidence outputs of said first and second duty determination circuit.

11. The digital wave shaping circuit according to claim 10, wherein an AND gate which prohibits coincidence outputs generated during the actual measurement periods is provided in each path between the coincidence output from each one of said duty determination circuits and the third flip flop.

12. The delay line oscillator in claim 11 further comprising an NAND gate, one input terminal of which is used as the input terminal of the oscillator, a first odd tier inverter connected to the output terminal of the NAND gate as a delay element, and a second inverter inserted into a feedback loop from the output of the first inverter to another input terminal of said NAND gate.

13. The delay line oscillator in claim 10 further comprising an NAND gate, one input terminal of which is used as the input terminal of the oscillator, a first odd tier inverter connected to the output terminal of the NAND gate as a delay element, and a second inverter inserted into a feedback loop from the output of the first inverter to another input terminal of said NAND gate.

* * * * *